| (12) | United States Patent | (10) Patent No.: | US 9,673,405 B2 |
|---|---|---|---|
| | Yasukawa et al. | (45) Date of Patent: | Jun. 6, 2017 |

(54) ORGANIC ELECTROLUMINESCENT DEVICE, DISPLAY APPARATUS, AND LIGHTING APPARATUS

(75) Inventors: Noriko Yasukawa, Hachioji (JP); Dai Ikemizu, Hachioji (JP); Tomohiro Oshiyama, Hachioji (JP); Masato Nishizeki, Hachioji (JP); Tatsuo Tanaka, Sagamihara (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 892 days.

(21) Appl. No.: 13/236,184

(22) Filed: Sep. 19, 2011

(65) Prior Publication Data

US 2012/0018714 A1  Jan. 26, 2012

(30) Foreign Application Priority Data

Mar. 1, 2011 (JP) .................................. 2011-043659
Aug. 23, 2011 (JP) .................................. 2011-181303

(51) Int. Cl.
| $H01L\ 51/54$ | (2006.01) |
| $C09K\ 11/06$ | (2006.01) |
| $H01L\ 51/00$ | (2006.01) |
| $H01L\ 51/50$ | (2006.01) |

(52) U.S. Cl.
CPC .......... *H01L 51/0085* (2013.01); *C09K 11/06* (2013.01); *H01L 51/0071* (2013.01); *C09K 2211/1007* (2013.01); *C09K 2211/1029* (2013.01); *C09K 2211/1044* (2013.01); *C09K 2211/1059* (2013.01); *C09K 2211/1092* (2013.01); *C09K 2211/185* (2013.01); *H01L 51/5016* (2013.01); *H01L 51/5036* (2013.01)

(58) Field of Classification Search
CPC ..... H01L 51/00; H01L 51/0085; H01L 51/50; H01L 51/5016; H01L 51/5036; C07F 15/0033; C09L 11/06; C09K 2211/1029; C09K 2211/1044; C09K 2211/1059; C09K 2211/1092; C09K 2211/185
See application file for complete search history.

(56) References Cited

U.S. PATENT DOCUMENTS

| 6,097,147 | A | 8/2000 | Baldo et al. | |
| 2005/0123792 | A1* | 6/2005 | Deaton et al. | ................ 428/690 |
| 2006/0073360 | A1* | 4/2006 | Ise et al. | ............. C07F 15/0033 |
| | | | | 428/690 |
| 2006/0220004 | A1* | 10/2006 | Stossel et al. | ................... 257/40 |
| 2006/0258043 | A1* | 11/2006 | Bold et al. | ........................ 438/99 |
| 2007/0088167 | A1* | 4/2007 | Lin et al. | ....................... 548/103 |
| 2008/0027220 | A1* | 1/2008 | Stossel et al. | ....... C07F 15/0033 |
| | | | | 544/225 |

FOREIGN PATENT DOCUMENTS

| JP | 2005-327526 | 11/2005 |
| WO | 2004/081017 | 9/2004 |
| WO | 2005/019373 | 3/2005 |
| WO | 2005/076380 | 8/2005 |
| WO | 2006/046980 | 5/2006 |

OTHER PUBLICATIONS

M.A. Baldo, et al., Nature, vol. 395, pp. 151-154 (1998).
M.A. Baldo, et al., Nature, vol. 403, No. 17, pp. 750-753 (2000).

* cited by examiner

*Primary Examiner* — Marie R. Yamnitzky
(74) *Attorney, Agent, or Firm* — Lucas & Mercanti, LLP

(57) ABSTRACT

An organic electroluminescent device containing:
a six-coordinate, ortho-metalated iridium complex represented by the formula (I):

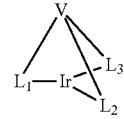

wherein V represents a trivalent linking group and is bound to $L_1$ to $L_3$ through covalent bonds;
each of $L_1$ to $L_3$ is represented by the formula (II)

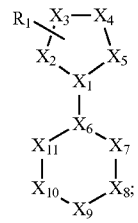

and
$R_1$ represents a substituted aryl group having seven or more carbon atoms.

6 Claims, 3 Drawing Sheets

LIGHT

LIGHT

ORGANIC ELECTROLUMINESCENT DEVICE, DISPLAY APPARATUS, AND LIGHTING APPARATUS

BACKGROUND OF THE INVENTION

Field of the Invention

The present invention relates to an organic electroluminescent device, a display apparatus, and a lighting apparatus.

Description of Related Art

An organic electroluminescent device (also referred to as an organic EL device, hereinafter) is a device having a luminescent layer which contains a light-emitting compound held between a cathode and an anode. The organic EL device emits light by injecting electrons and holes into the luminescent layer, allowing them to recombine therein so as to produce excitons which cause emission of light (fluorescence or phosphorescence) upon annihilation. The device attracts public attention to a flat display apparatus or a lighting apparatus of the next generation, by virtue of its capability of luminescence under applied voltage of only several volts to several tens of volts.

Since an organic EL device making use of phosphorescence from excited triplet state, where the upper limit of internal quantum efficiency reaches 100%, has been reported by a team of Princeton University (see M. A. Baldo et al., Nature, Vol. 395, p. 151-154 (1998), for example), materials emitting phosphorescence at room temperature has been more extensively studied (see M. A. Baldo et al., Nature, Vol. 403, No. 17, p. 750-753 (2000), and U.S. Pat. No. 6,097,147, for example.).

On the other hand, heavy metal complexes, such as iridium complexes or the like, have been investigated as materials emitting phosphorescence at room temperature.

For example, tris(2-phenylpyridine) iridium complex has been widely known (see M. A. Baldo et al., Nature, Vol. 403, No. 17, p. 750-753 (2000)). Moreover, an iridium complex having ligands composed of a tris(2-phenylpyridine) skeleton introduced with silyl groups, aimed at improving durability of dopant and luminescence efficiency, has been disclosed (see Japanese Laid-Open Patent Publication No. 2005-327526, for example).

However, the organic EL devices making use of dopants have been still unsuccessful to achieve satisfactory levels of performances, represented by limited luminescent lifetime.

Iridium complexes other than tris(2-phenylpyridine) iridium complex disclosed include those having phenylimidazole ligands and carbene ligands (International Patent Nos. WO2006/046980 and WO2005/019373, for example).

These materials have been suffering from problems in that they have shallower HOMO as compared with complexes of phenylpyridine ligands and larger barrier height against hole injection. Moreover, the molecules thereof would need larger reorientation energy if introduced with bulky substituents aimed at attaining luminescence at shorter wavelengths, the charge transfer performance would degrade, and the drive voltage would elevate as a consequence.

On the other hand, complexes having ligands of iridium complex linked thereto have been disclosed (see International Patent Nos. WO2005/76380 and WO2004/81017).

While these complexes are intrinsically improved in their thermal stability, and lifetime of the applied devices is consequently improved, the publications disclose nothing about improvement in the drive voltage particularly in an effort of obtaining luminescence at shorter wavelengths, using materials having shallower HOMO.

SUMMARY OF THE INVENTION

It is, therefore, a main object of the present invention to provide an organic electroluminescent device showing high luminescence efficiency, having long luminescent lifetime, and drivability at low voltage; a lighting apparatus and display apparatus having the device incorporated therein; and an organic electroluminescent material used for forming the device.

The object of the present invention is attained by the configurations described below.

A first aspect of the present invention is an organic electroluminescent device having at least one luminescent layer between an anode and a cathode, containing:

a six-coordinate, ortho-metalated iridium complex represented by the formula (I) below:

Formula (I)

wherein V represents a trivalent linking group, and is bound to $L_1$ to $L_3$ through covalent bonds;

Each of $L_1$ to $L_3$ is represented by the formula (II) below;

Formula (II)

$X_5$ and Ir form a coordinate bond, and $X_7$ and Ir form a covalent bond;

each of $X_1$ to $X_5$ represents a group of elements composing a nitrogen-containing heterocycle, selected from carbon atom or nitrogen atom;

at least one of $X_4$ and $X_5$ represents a nitrogen atom;

each of $X_6$ to $X_{11}$ represents a group of element composing an aromatic five-membered ring or aromatic six-membered ring, and is selected from carbon atom or nitrogen atom;

when $X_6$ to $X_{11}$ form an aromatic five-membered ring, $X_{11}$ merely represents a bond; and $R_1$ represents a substituted aryl group having seven or more carbon atoms.

Preferably, in the formula (II), the five-membered ring formed by $X_1$ to $X_5$ of at least one of $L_1$ to $L_3$ is an imidazole ring.

Preferably, in the formula (II), the aromatic five-membered ring formed by $X_1$ to $X_5$ of at least one of $L_1$ to $L_3$ is a pyrazole ring.

Preferably, in the formula (II), the aromatic five-membered ring formed by $X_1$ to $X_5$ of at least one of $L_1$ to $L_3$ is a triazole ring.

Preferably, the formula (II) is given by the formula (III) below:

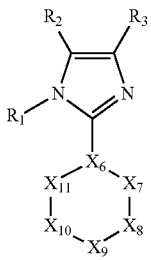

Formula (III)

wherein, in the formula (III), a group of elements represented by $R_1$ and $X_6$ to $X_{11}$ is the same as those represented by the formula (II); and each of $R_2$ and $R_3$ independently represents a hydrogen atom or substituent.

Preferably, the formula (II) is given by the formula (IV) below:

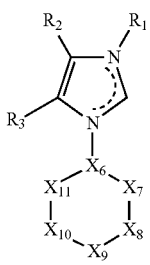

Formula (IV)

wherein, in the formula (IV), a group of elements represented by $R_1$ and $X_6$ to $X_{11}$ are same as those represented by the formula (II); and each of $R_2$ and $R_3$ independently represents a hydrogen atom or substituent.

Preferably, the formula (II) is given by the formula (V) below:

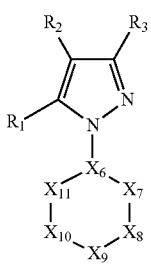

Formula (V)

wherein, in the formula (V), a group of elements represented by $R_1$ and $X_6$ to $X_{11}$ are same as those represented by the formula (I); and each of $R_2$ and $R_3$ represents a hydrogen atom or substituent.

Preferably, the formula (II) is given by the formula (VI) below:

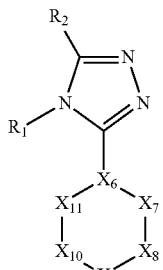

Formula (VI)

wherein, in the formula (VI), a group of elements represented by $R_1$ and $X_6$ to $X_{11}$ are same as those represented by the formula (II); and $R_2$ represents a hydrogen atom or substituent.

Preferably, the formula (II) is given by the formula (VII) below:

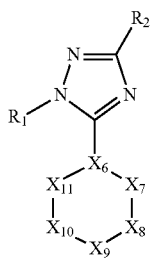

Formula (VII)

wherein, in the formula (VII), a group of elements represented by $R_1$ and $X_6$ to $X_{11}$ are same as those represented by the formula (II); and $R_2$ represents a hydrogen atom or substituent.

Preferably, in the formulae (III) to (VII), $X_6$ to $X_{11}$ form an aromatic six-membered ring.

Preferably, at least one of the luminescent layers contain the iridium complex.

Preferably, the organic electroluminescent device is configured to cause white luminescence.

Moreover, a second aspect of the present invention is a display apparatus having the organic electroluminescent device.

Moreover, a third aspect of the present invention is a lighting apparatus having the organic electroluminescent device.

BRIEF DESCRIPTION OF THE DRAWINGS

The above and other objects, advantages and features of the present invention are more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Figure 1:
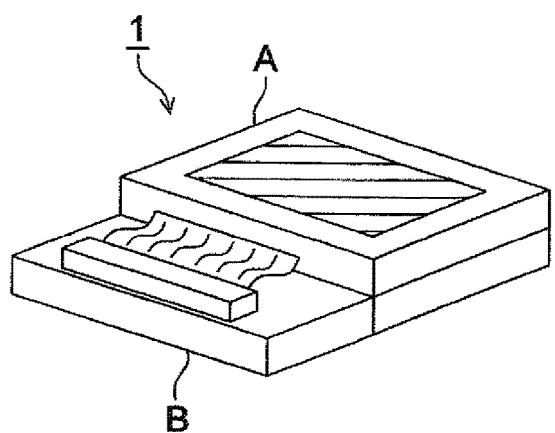
FIG. 1 is a schematic drawing illustrating an exemplary display apparatus using an organic EL device.

According to a first aspect of the present invention, there is provided an organic electroluminescent device showing high luminescence efficiency, having long half life, and drivable at low voltage.

In addition, according to second and third aspects of the present invention, there are provided a display apparatus and a lighting apparatus, respectively, provided with the organic electroluminescent device.

Details of the individual constituents of the organic electroluminescent device of the present invention are explained one-by-one below.

The ortho-metalated iridium complex having five-membered rings as the ligands has been attracting interest, since luminescence is obtainable at shorter wavelengths as compared with an ortho-metalated iridium complex having phenylpyridine or the like consisting of only six-membered rings. However, a device having a lifetime and luminance efficiency enough to satisfy practical requirements has not been obtained. The present inventors presumed that the ortho-metalated iridium complex having five-membered rings as the ligands would have shallower HOMO as compared with the ortho-metalated iridium complex having phenylpyridine or the like, and would only poorly be injected with holes and thereby needs higher drive voltage, and also that the conventionally known ortho-metalated iridium complex would readily aggregate in a constitutive layer of the organic EL device, and therefore would fail in achieving lifetime of device and luminance efficiency enough to satisfy practical requirements. The present inventors then extensively investigated into these problems.

The present inventors finally found out that the lifetime of device is improved, and the drive voltage is lowered, by using a compound represented by the formula (I) shown in the above, as the ortho-metalated iridium complex having five-membered rings as constituents of the ligands.

We presumed that, by introducing a substituent having seven or more carbon atoms into the five-membered ring composing the ligand, the lifetime of device is improved, because aggregation of the metal complexes in the constitutive layer of the organic EL device is suppressed, and thereby T-T annihilation, which could otherwise occur between excited triplet states of the metal complex, is successfully suppressed.

While it is anticipated that the introduction of these substituents might otherwise elevate the reorientation energy, we also found that the drive voltage of the device is lowered, and the luminance and lifetime are improved, by respectively binding the three ligands.

《Ortho-Metalated Iridium Complex》

The ortho-metalated iridium complex of the present invention is explained.

While the ortho-metalated iridium complex of the present invention is used for any constitutive layer(s) of the organic EL device of the present invention, it is preferable to use it in the luminescent layer of the device, and more specifically as a luminescent dopant (also simply referred to as a "dopant") in the luminescent layer, in view of fully obtaining the effects of the present invention [improvement in the luminescence efficiency of the device (more specifically, "external extraction quantum efficiency", or simply "efficiency"), increase in the half life, and decrease in the drive voltage].

The constitutive layers of the organic EL device of the present invention will be detailed later.

The ortho-metalated iridium complex of the present invention is specifically represented by the formula (I) below.

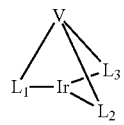

Formula (I)

In the formula (I), V represents a trivalent linking group, forming a polydentate ligand around Ir by covalently binding with each of $L_1$ to $L_3$, and preferably represents those having the structures below (where, * represents position of linkage with each of $L_1$ to $L_3$, and n represents 1 or 2.)

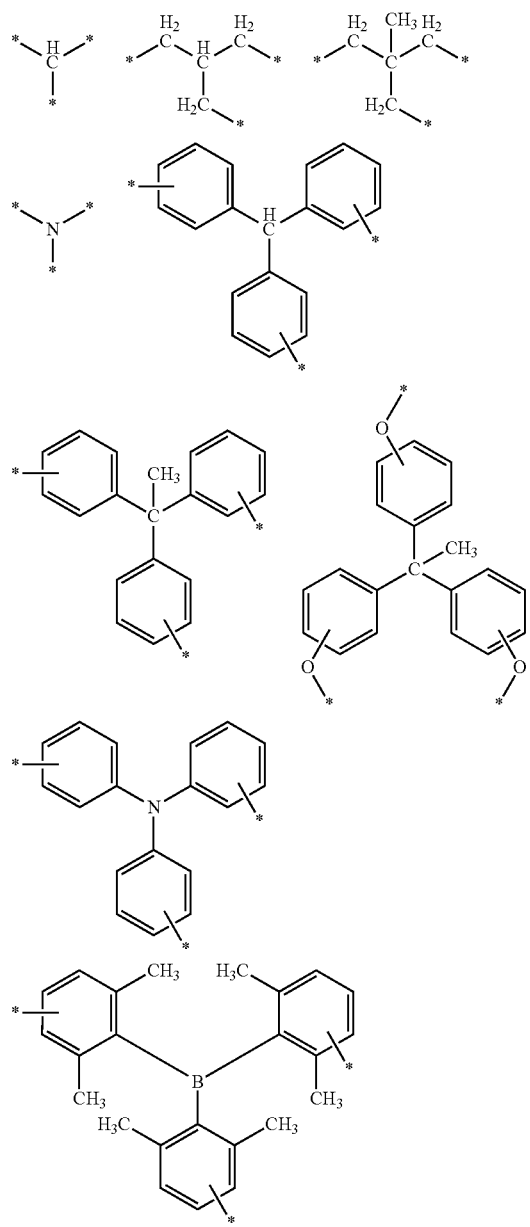

-continued

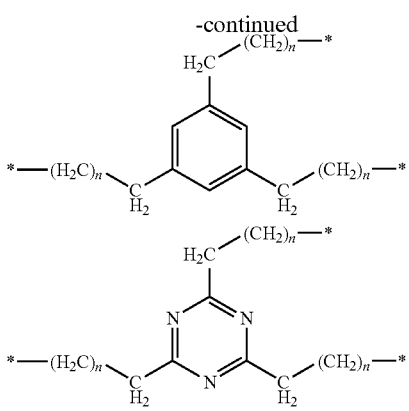

Each of $L_1$ to $L_3$ is represented by the formula (II) below, where $X_5$ and Ir form a coordinate bond, and $X_7$ and Ir form a covalent bond.

Formula (II)

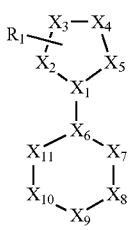

In the formula (II), each of $X_1$ to $X_5$ represents a group of elements forming a nitrogen-containing heterocycle, selected from carbon atom or nitrogen atom, at least either one of $X_4$ and $X_5$ represents a nitrogen atom. Preferably, $X_1$ to $X_5$ form a imidazole ring, pyrazole ring, or triazole ring, and more preferably form an imidazole ring. $X_6$ to $X_{11}$ are group of atoms forming an aromatic five-membered ring or an aromatic six-membered ring, and each of them is selected from carbon atom or nitrogen atom. The aromatic five-membered ring is preferably exemplified by thiophene ring, imidazole ring, pyrazole ring, and triazole ring; and the aromatic six-membered ring is exemplified by benzene ring, and pyridine ring, where benzene ring is preferable. The aromatic five-membered ring or the aromatic six-membered ring formed by $X_6$ to $X_{11}$ further has substituent(s), and the substituents bind to form a condensed ring. The substituent is exemplified by alkyl group (methyl group, ethyl group, trifluoromethyl group, isopropyl group, etc.), alkoxy group (methoxy group, ethoxy group, etc.), halogen atom (fluorine atom, etc.), cyano group, nitro group, dialkylamino group (dimethylamino group, etc.), trialkylsilyl group (trimethylsilyl, etc.), triarylsilyl group (triphenylsilyl group, etc.), triheteroarylsilyl group (tripyridylsilyl group, etc.), benzyl group, aryl group (phenyl group, etc.), and heteroaryl group (pyridyl group, carbazolyl group, etc.); and the condensed ring is exemplified by 9,9'-dimethylfluorene, carbazole, dibenzofuran, and so forth. $R_1$ represents a substituted or unsubstituted aryl group having seven or more carbon atoms, wherein the aryl group is exemplified by phenyl group, naphthyl group, biphenyl group, and terphenyl group, wherein phenyl group is preferable. Possible substituents on the phenyl group include alkyl group (methyl group, ethyl group, trifluoromethyl group, isopropyl group, etc.), alkoxy group (methoxy group, ethoxy group, etc.), halogen atom (fluorine atom, etc.), cyano group, nitro group, dialkylamino group (dimethylamino group, etc.), trialkylsilyl group (trimethylsilyl, etc.), triarylsilyl group (triphenylsilyl group, etc.), triheteroarylsilyl group (tripyridylsilyl group, etc.), benzyl group, aryl group (phenyl group, etc.), and heteroaryl group (pyridyl group, carbazolyl group, etc.), wherein alkyl group and aryl group are preferable.

The formula (II) preferably is given by the formulae (III) to (VII) below.

Formula (III)

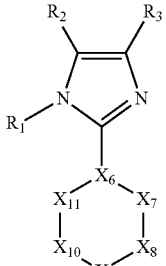

Formula (IV)

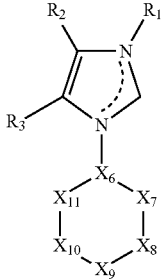

Formula (V)

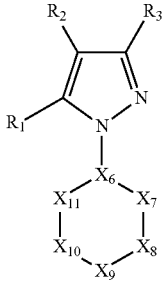

Formula (VI)

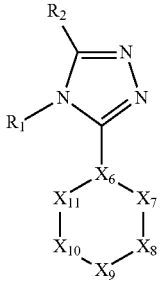

Formula (VII)

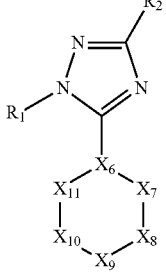

In the formula (III), a group of elements represented by $R_1$ and $X_6$ to $X_{11}$ are same as those represented by the formula (II) in the above. Each of $R_2$ and $R_3$ independently represents a hydrogen atom or substituent, where the substituent may be same as those possibly owned by the group of elements represented by $X_6$ to $X_{11}$ in the formula (II).

The formula (III) preferably is given by the formulae (VIII) below.

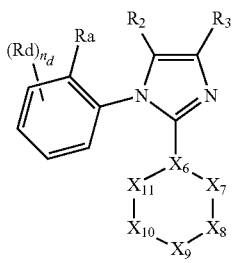

Formula (VIII)

In the formula (VIII), Ra and Rd independently represents a substituent, which are same as the substituent represented by $X_6$ to $X_{11}$ in the formula (II) in the above. Ra preferably represents alkyl group such as methyl group, ethyl group, or isopropyl group; cycloalkyl group such as cyclohexyl group; or aryl group such as phenyl group. $n_d$ represents an integer of 0 or 1 to 3. A group of elements represented by $X_6$ to $X_{11}$, $R_2$ and $R_3$ represents a hydrogen atom or substituent, where the substituent may be same as those possibly owned by the group of elements represented by $X_6$ to $X_{11}$ in the formula (II).

The formula (VIII) preferably is given by the formulae (IX) below.

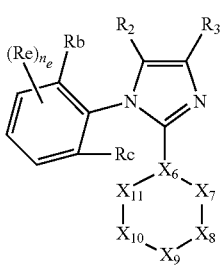

Formula (IX)

In the formula (IX), Rb, Rc and Rd independently represents a substituent, which are same as the substituent represented by $X_6$ to $X_{11}$ in the formula (II) in the above. Rd and Rc preferably represents alkyl group such as methyl group, ethyl group, or isopropyl group; cycloalkyl group such as cyclohexyl group; or aryl group such as phenyl group. $n_d$ represents an integer of 0 or 1 to 3. A group of elements represented by $X_6$ to $X_{11}$, $R_2$ and $R_3$ represents a hydrogen atom or substituent, where the substituent may be same as those possibly owned by the group of elements represented by $X_6$ to $X_{11}$ in the formula (II).

The formula (IX) preferably is given by the formulae (X) below.

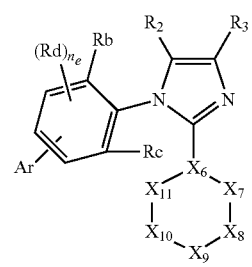

Formula (X)

In the formula (X), Rb and Rc are same as those represented by the formula (IX). Re represents a substituent, which are same as the substituent represented by $X_6$ to $X_{11}$ in the formula (II) in the above. $n_e$ represents an integer of 0 or 1 to 2. A group of elements represented by $X_6$ to $X_{11}$, $R_2$ and $R_3$ are same as those represented by the formula (IX). Ar represents aryl group such as phenyl group, naphthyl group, and terphenyl group; heteroaryl group such as pyridyl group, carbazolyl group; or preferably phenyl group.

The formula (X) preferably is given by the formulae (XI) below.

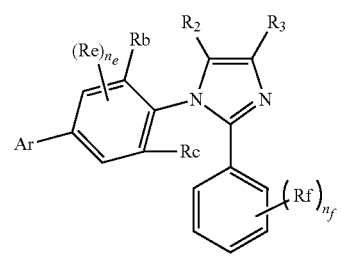

Formula (XI)

In the formula (XI), Rb, Rc and Rd are same as those represented by the formula (IX). $n_e$ represents an integer of 0 or 1 to 2. $R_2$ and $R_3$ are same as those represented by the formula (IX). Ar represents aryl group such as phenyl group, naphthyl group, and terphenyl group; heteroaryl group such as pyridyl group, carbazolyl group; or preferably phenyl group. Rf represents a substituent, which are same as the substituent represented by $X_6$ to $X_{11}$ in the formula (II) in the above. A group of elements represented by $X_6$ to $X_{11}$, $R_2$ and $R_3$ are same as those represented by the formula (IX). $n_f$ represents an integer of 0 or 1 to 3.

In the formula (IV), a group of elements represented by $R_1$ and $X_6$ to $X_{11}$ are same as those in the above-described formula (II). Each of $R_2$ and $R_3$ independently represents a hydrogen atom or substituent, where the substituent may be same as those possibly owned by the group of elements represented by $X_6$ to $X_{11}$ in the formula (II).

In the formula (V), a group of elements represented by $R_1$ and $X_6$ to $X_{11}$ are same as those in the above-described formula (II). Each of $R_2$ and $R_3$ independently represents a hydrogen atom or substituent, where the substituent may be same as those possibly owned by the group of elements represented by $X_6$ to $X_{11}$ in the formula (II).

In the formula (VI), a group of elements represented by $R_1$ and $X_6$ to $X_{11}$ are same as those in the above-described formula (II). $R_2$ represents a hydrogen atom or substituent, where the substituent may be same as those possibly owned by the group of elements represented by $X_6$ to $X_{11}$ in the formula (II).

In the formula (VII), a group of elements represented by R₁ and X₆ to X₁₁ are same as those in the above-described formula (II). R₂ represents a hydrogen atom or substituent, where the substituent may be same as those possibly owned by the group of elements represented by X₆ to X₁₁ in the formula (II).

Specific examples of the ortho-metalated iridium complexes represented by any of the formulae in the above are shown below, without restricting the present invention.

These metal complexes may be synthesized typically referring to US Patent Application Publication No. 2010/176390, and International Publication No. WO2007/97149, and further referring to the literatures cited in these patent documents.

Exemplary syntheses of the ortho-metalated iridium complexes represented by the formula (I) in the present invention are detailed later in Examples.

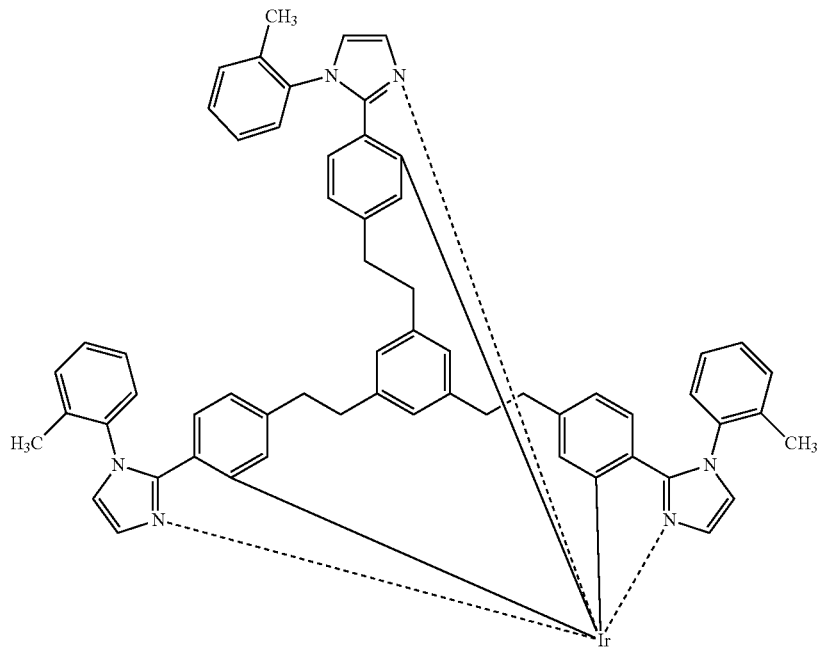

Exemplary Compound (III)-1

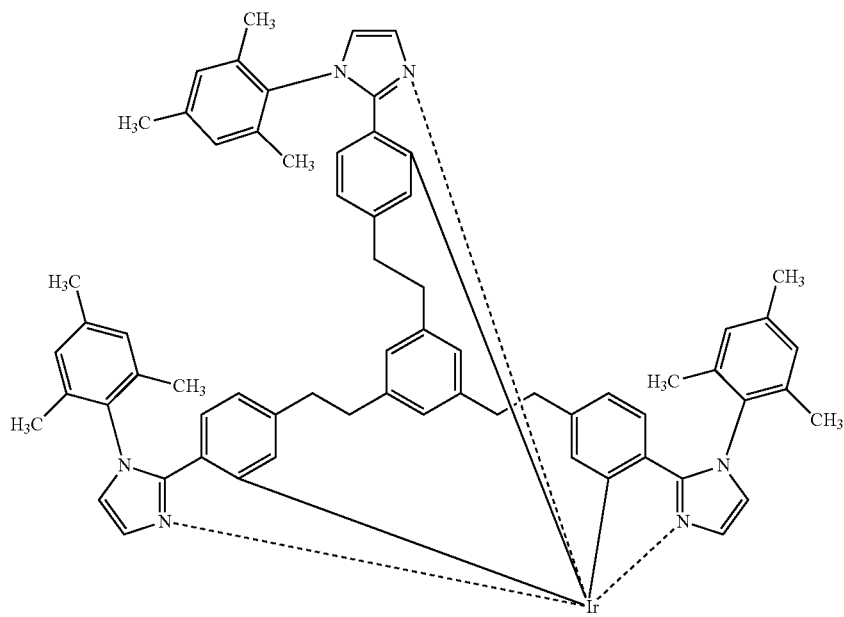

Exemplary Compound (III)-2

Exemplary Compound (III)-3
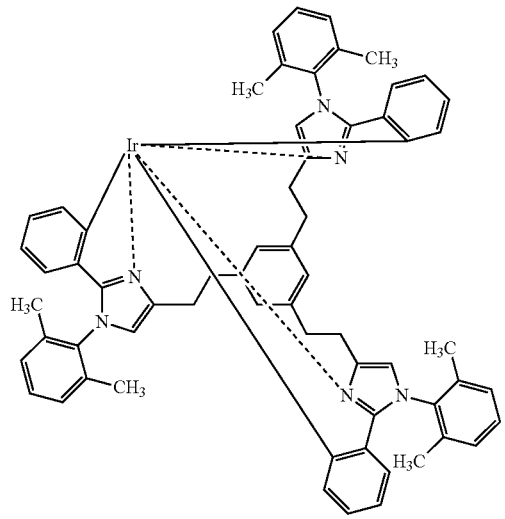
Exemplary Compound (III)-4
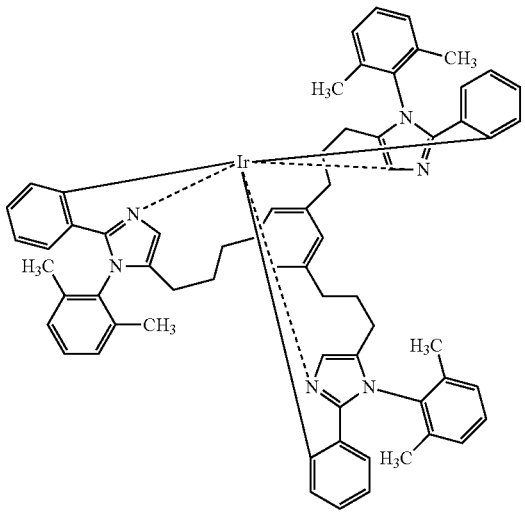
Exemplary Compound (III)-5
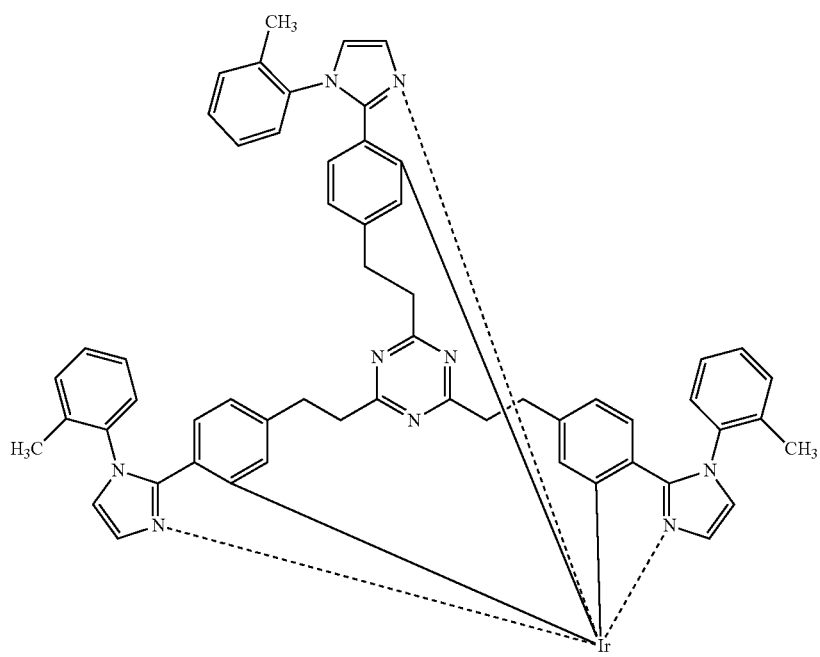

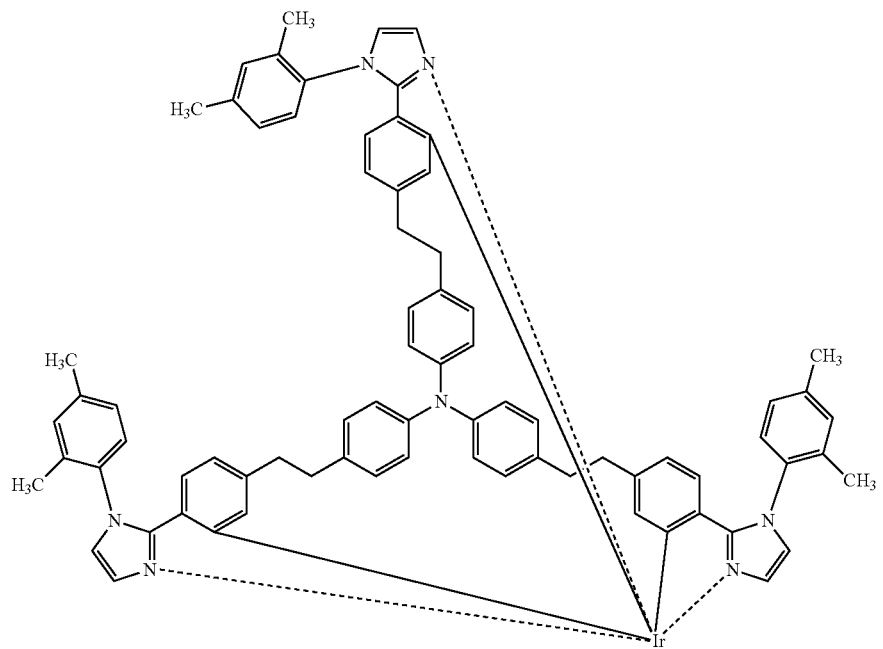
Exemplary Compound (III)-6
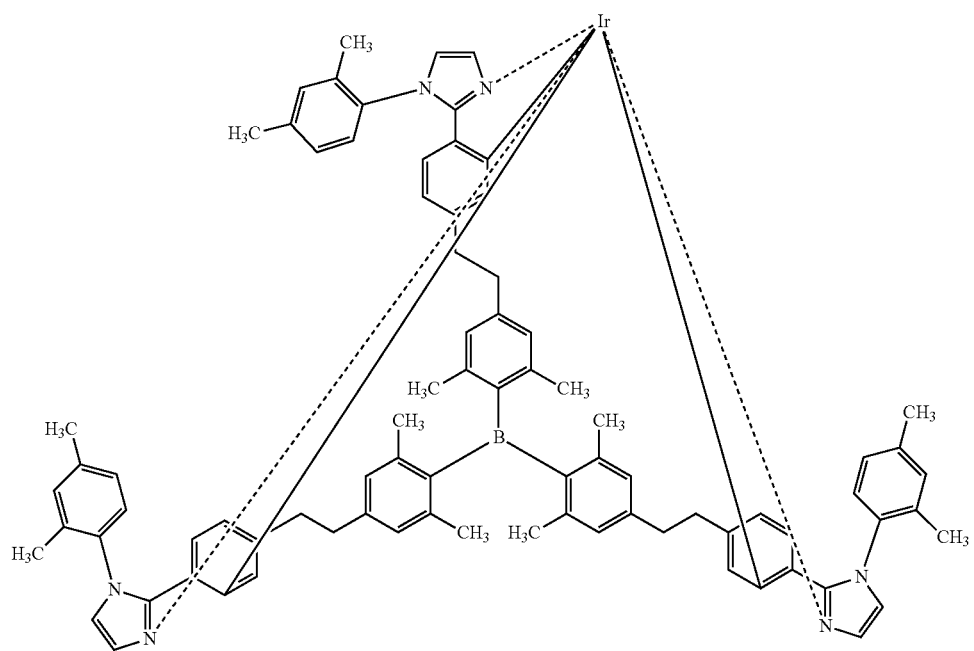
Exemplary Compound (III)-7

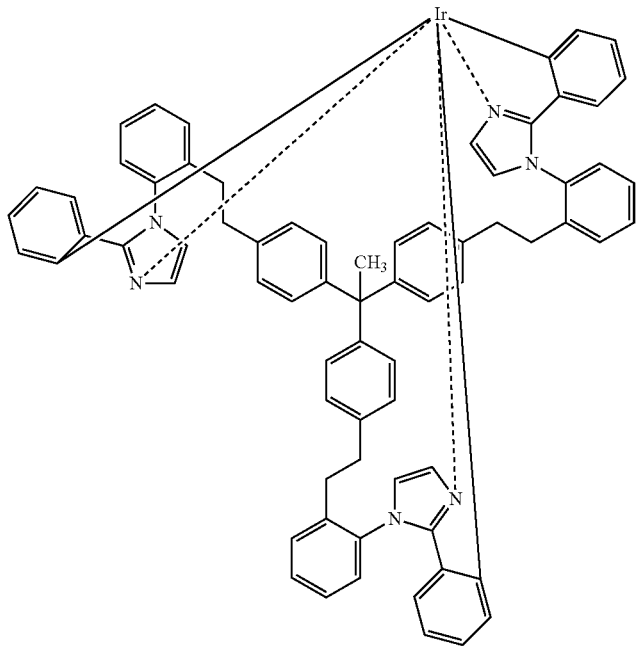
Exemplary Compound (III)-8
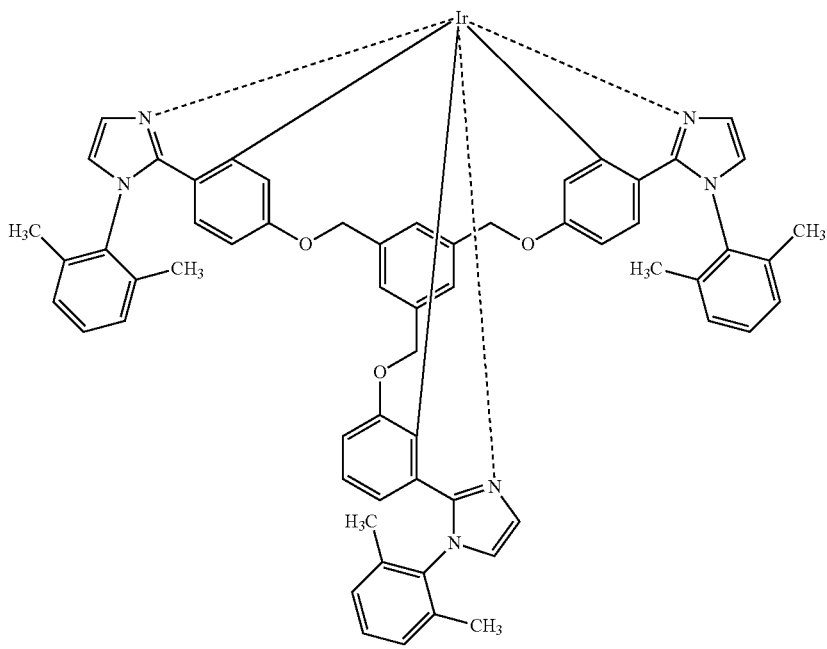
Exemplary Compound (III)-9

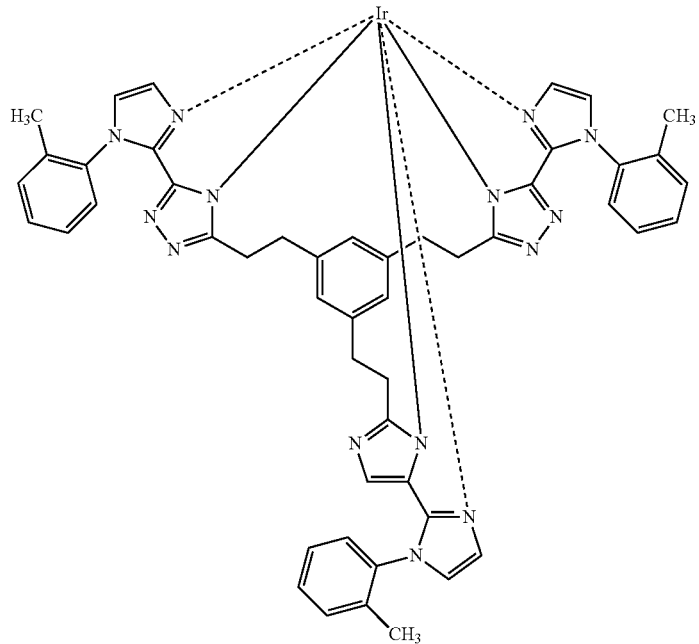
Exemplary Compound (III)-10
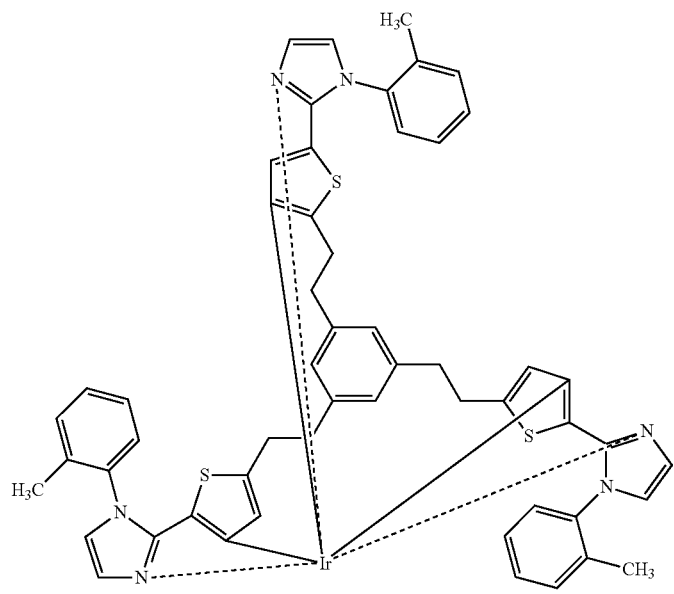
Exemplary Compound (III)-11

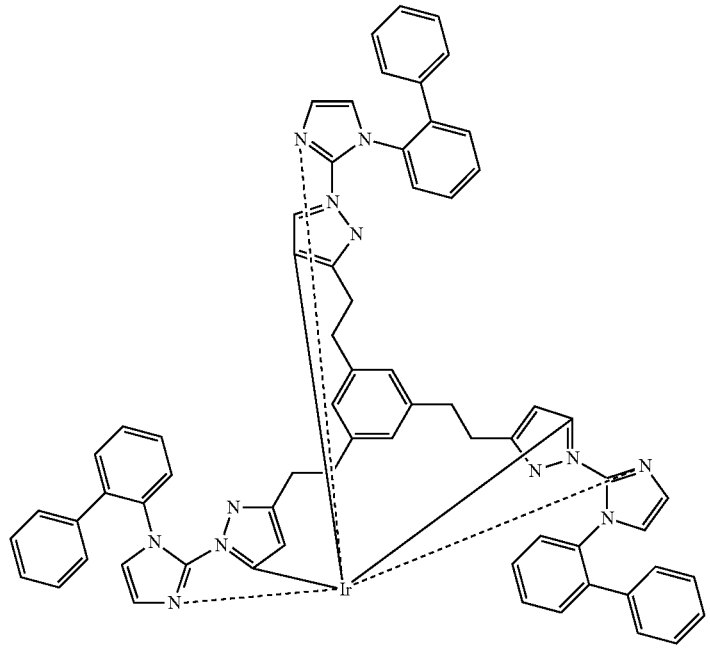
Exemplary Compound (III)-12
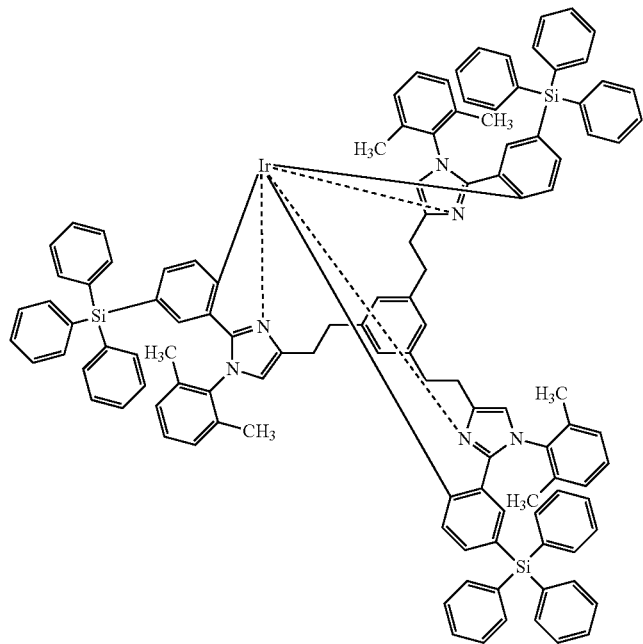
Exemplary Compound (III)-13

-continued
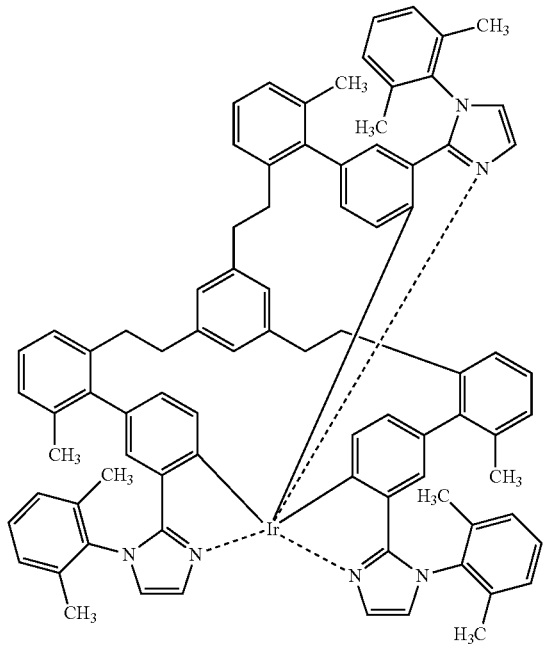
Exemplary Compound (III)-14
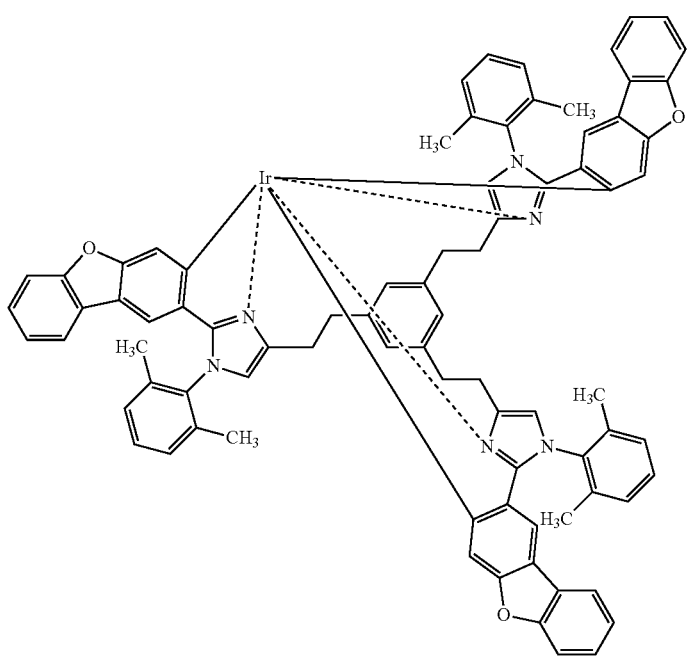
Exemplary Compound (III)-15

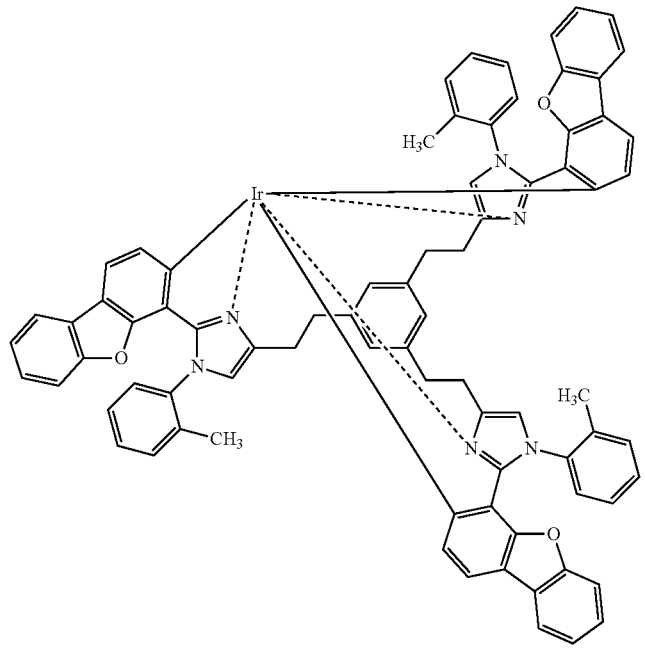
Exemplary Compound (III)-16
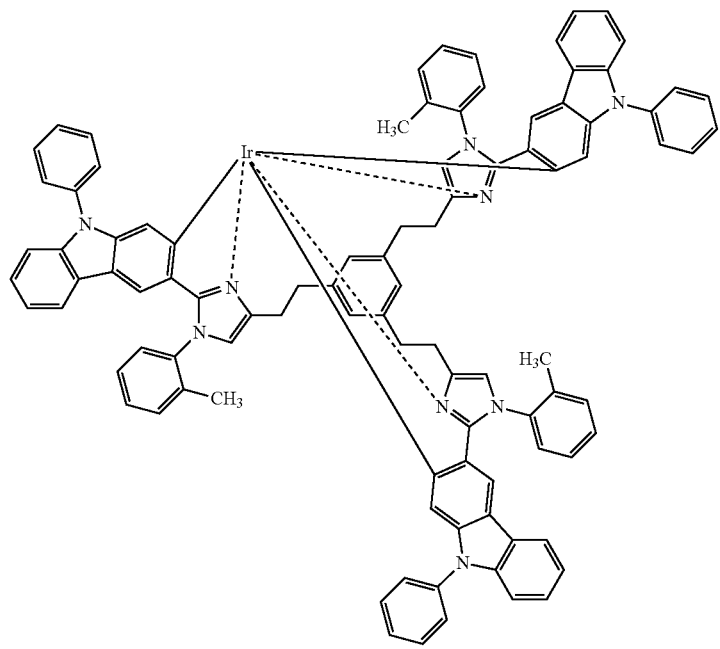
Exemplary Compound (III)-17

-continued
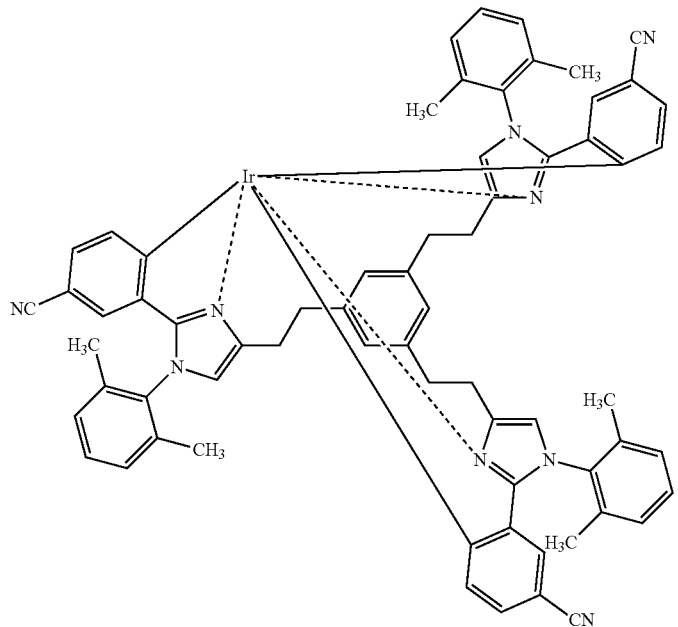
Exemplary Compound (III)-18
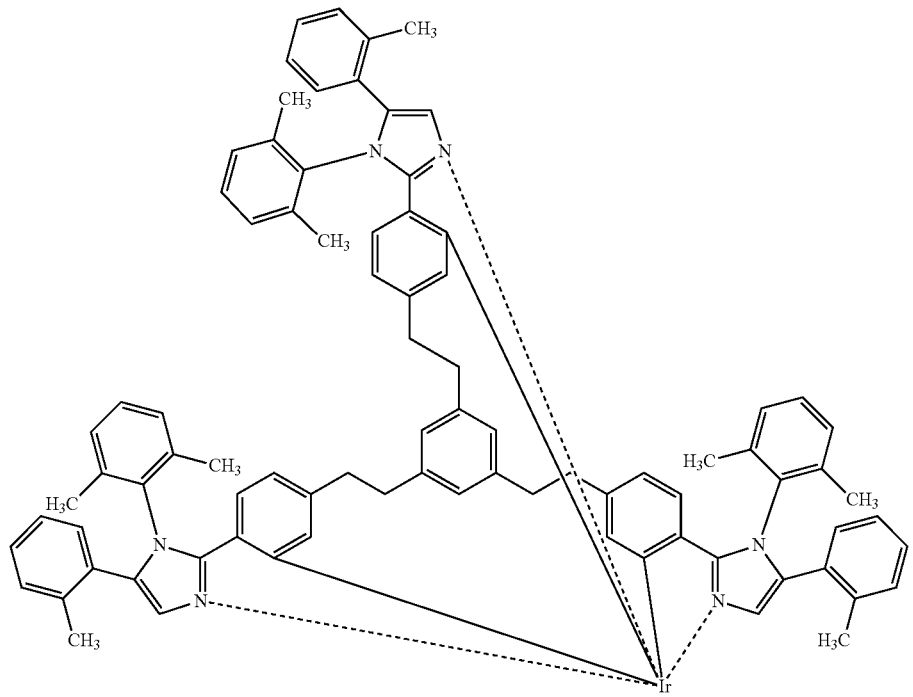
Exemplary Compound (III)-19

-continued
Exemplary Compound (III)-20
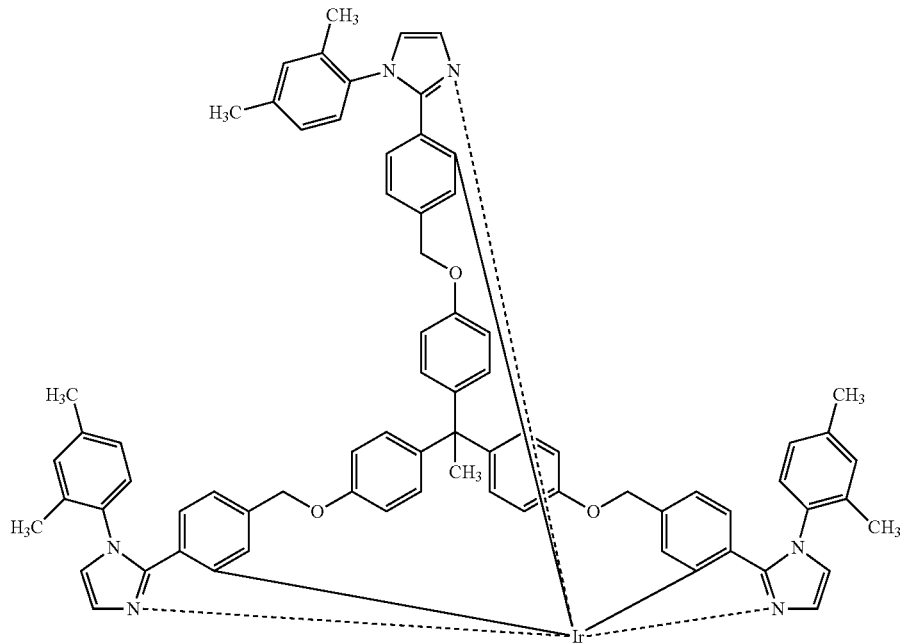
Exemplary Compound (III)-21
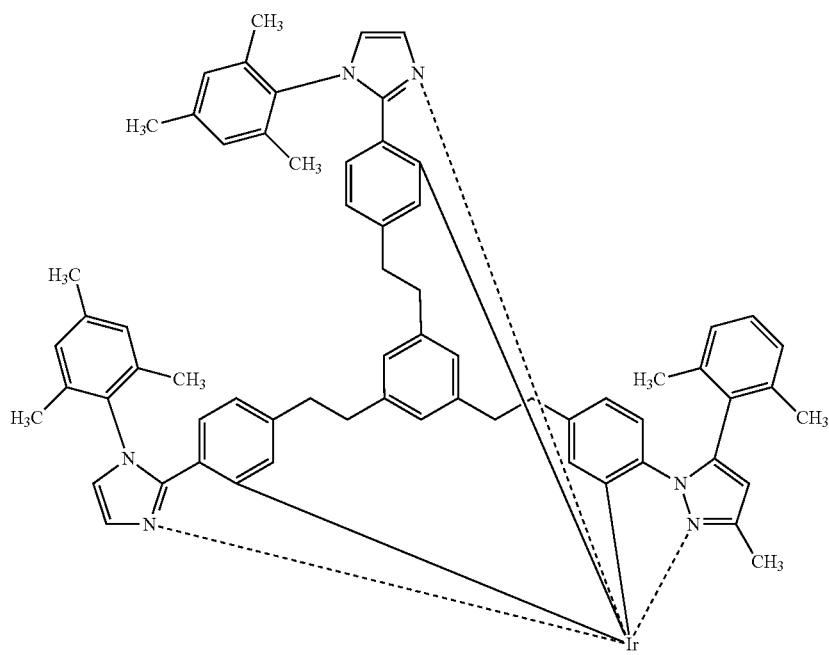

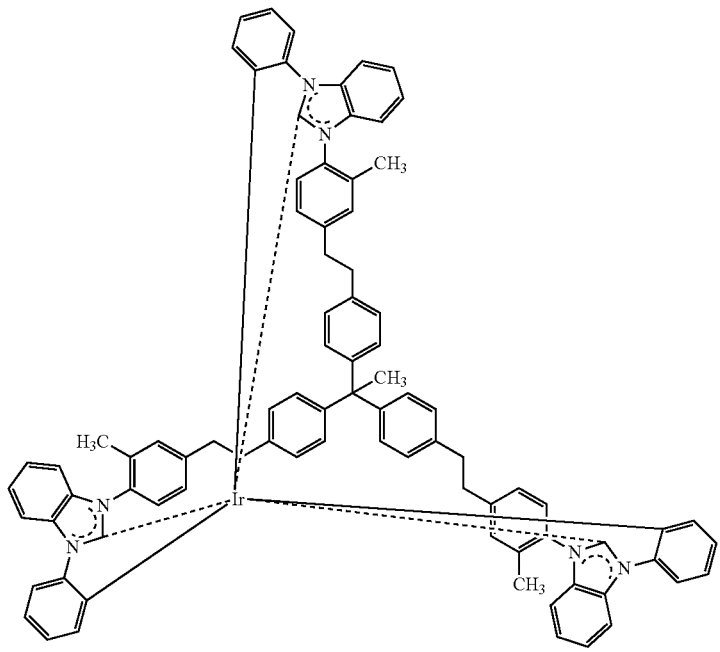
Exemplary Compound (IV)-1
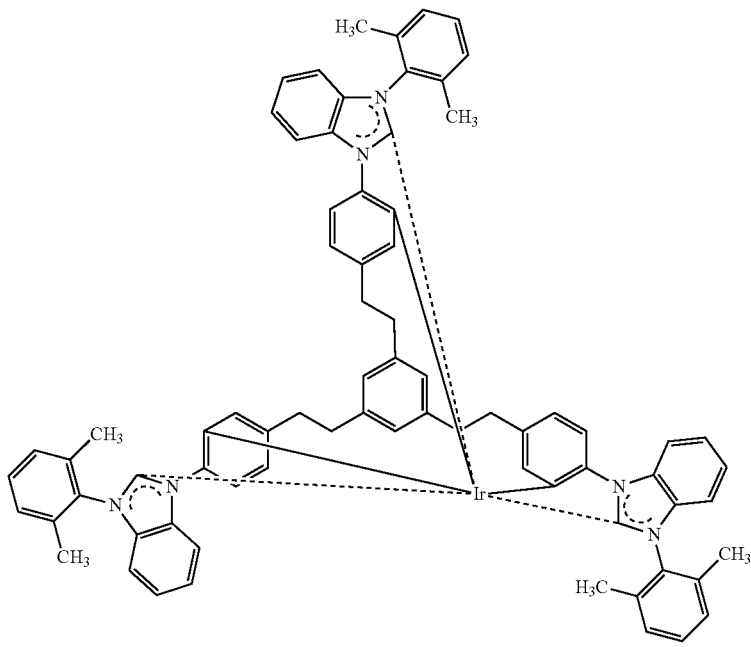
Exemplary Compound (IV)-2

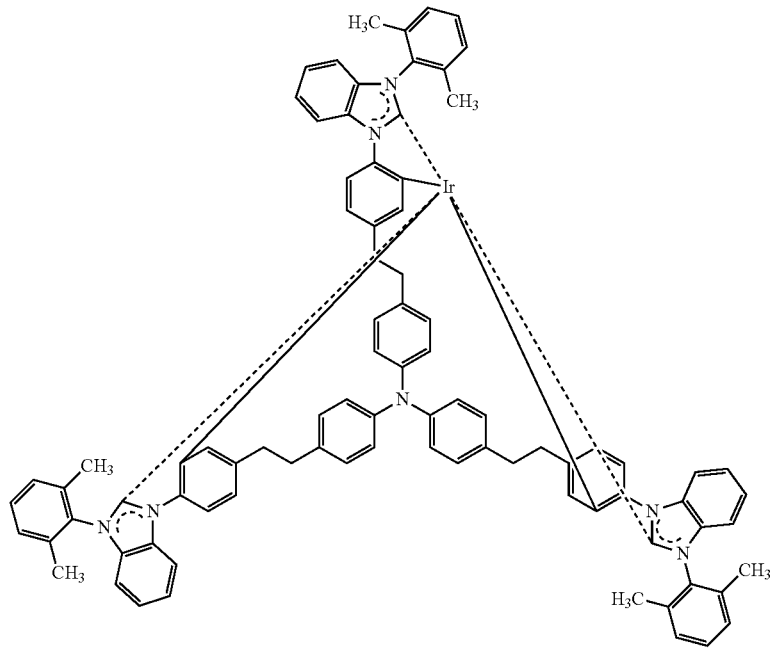
Exemplary Compound (IV)-3
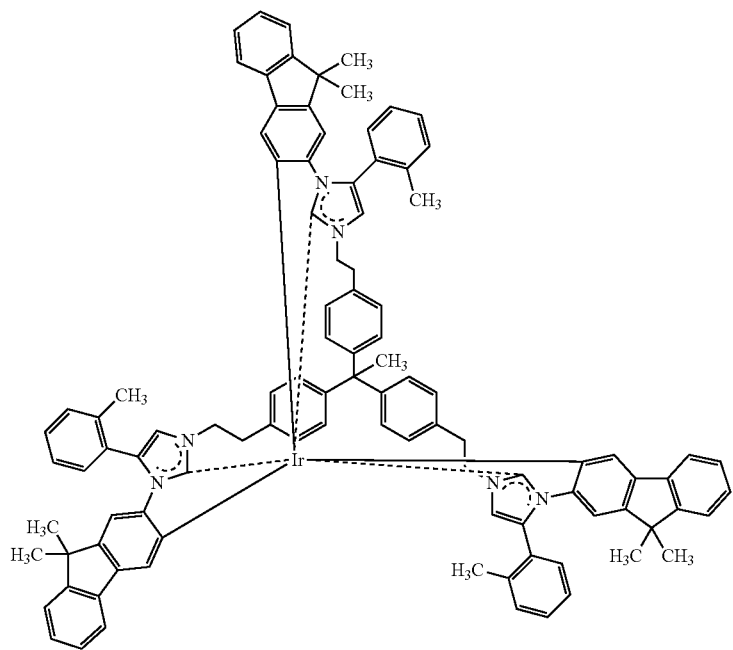
Exemplary Compound (IV)-4

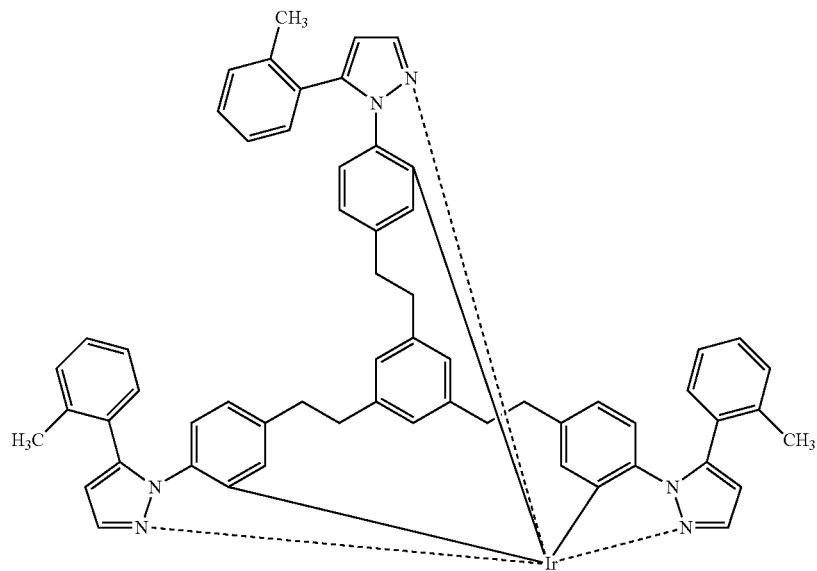
Exemplary Compound (V)-1
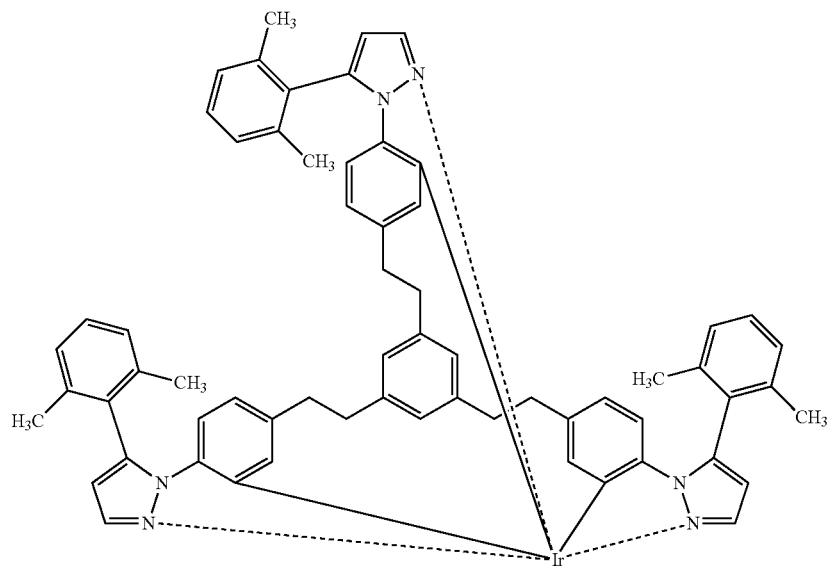
Exemplary Compound (V)-2

-continued
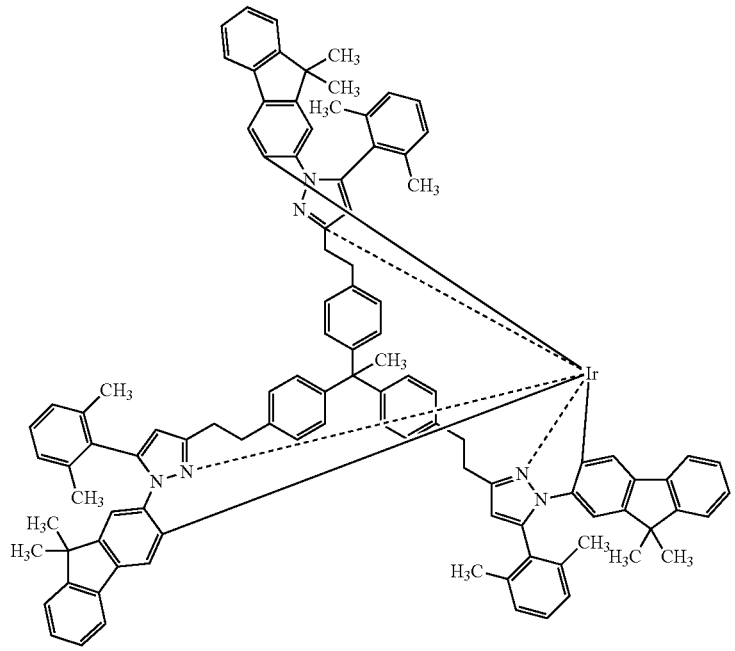
Exemplary Compound (V)-3
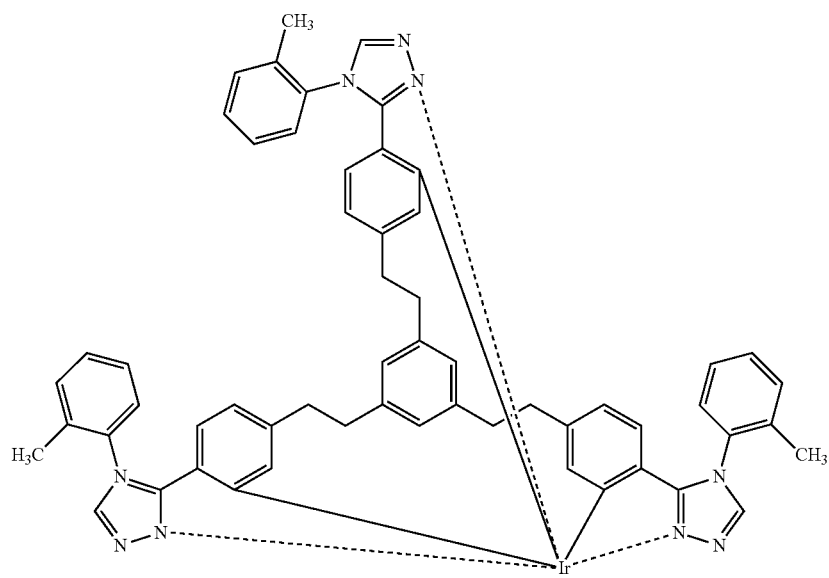
Exemplary Compound (VI)-1

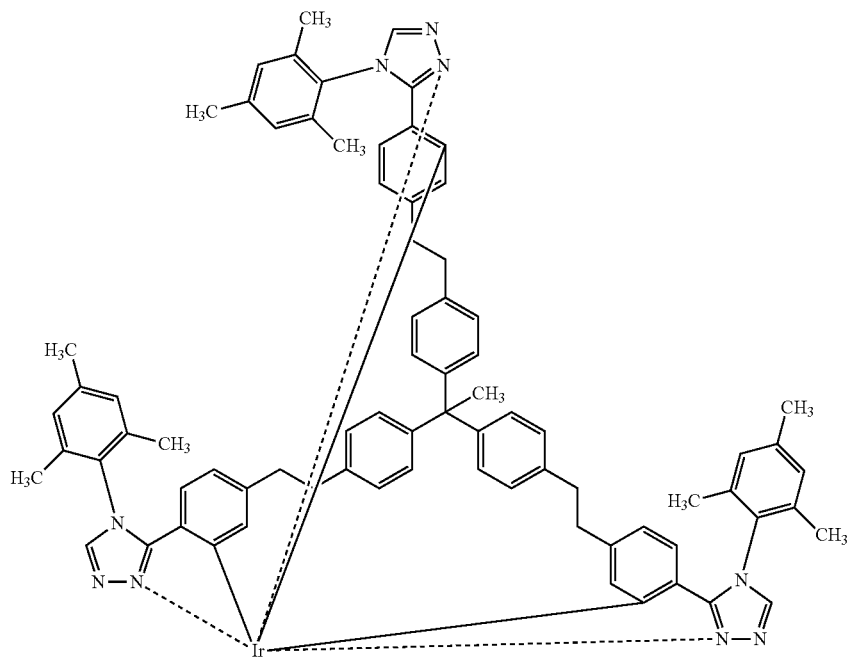
Exemplary Compound (VI)-2
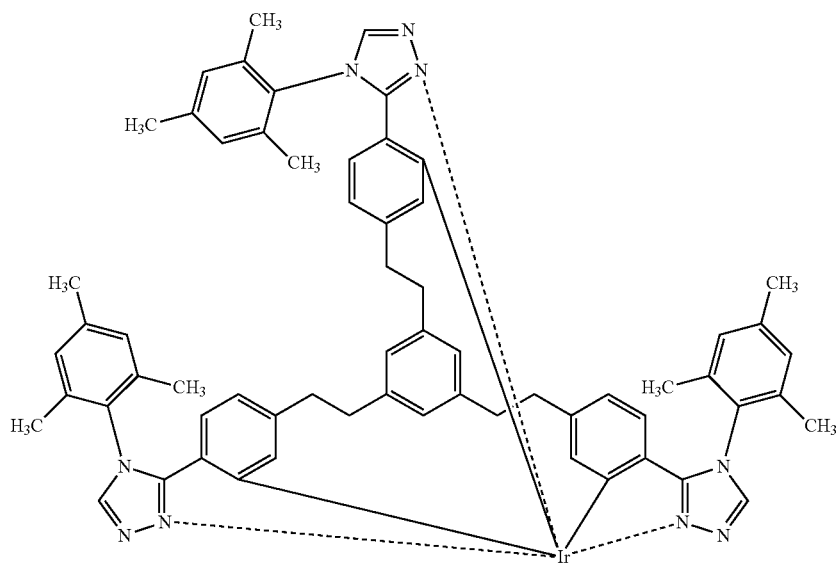
Exemplary Compound (VI)-3

-continued
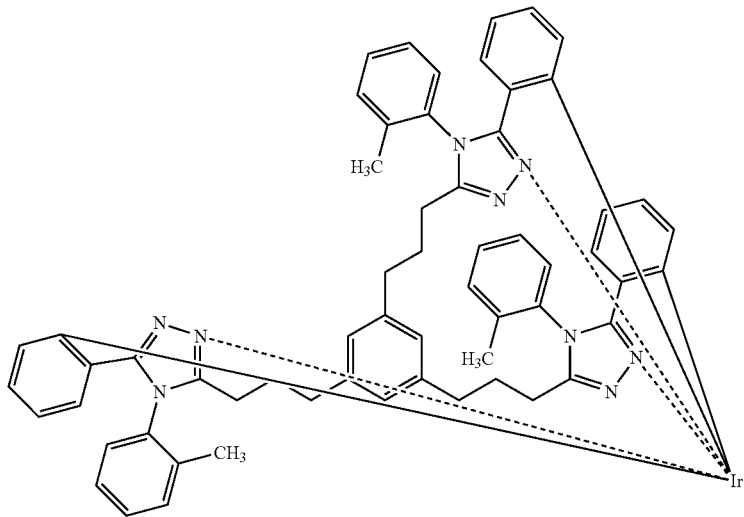
Exemplary Compound (VI)-4
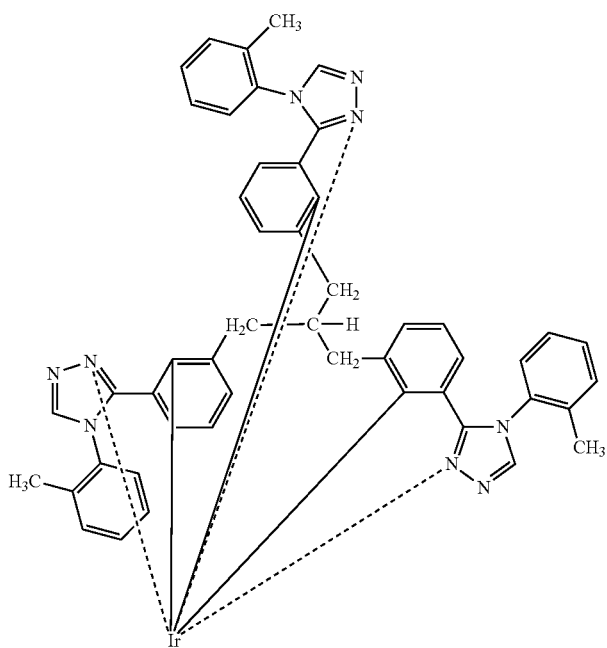
Exemplary Compound (VI)-5

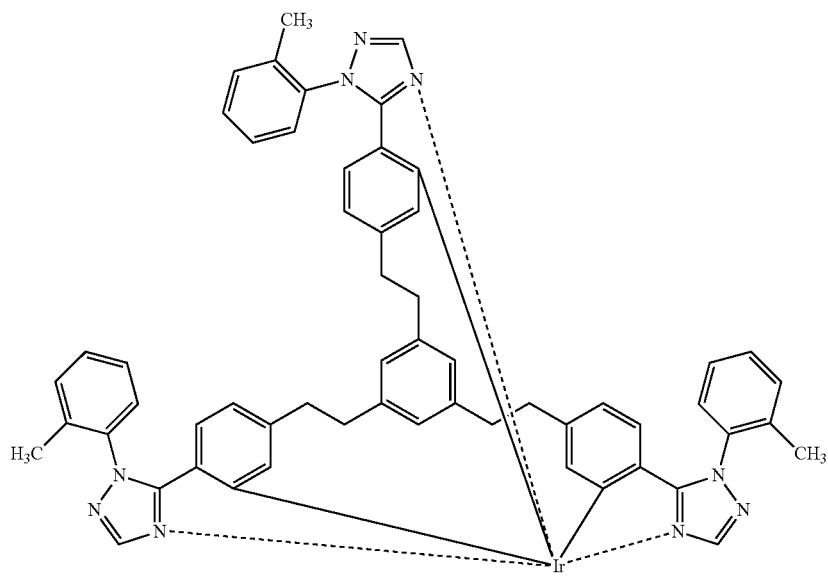
Exemplary Compound (VII)-1
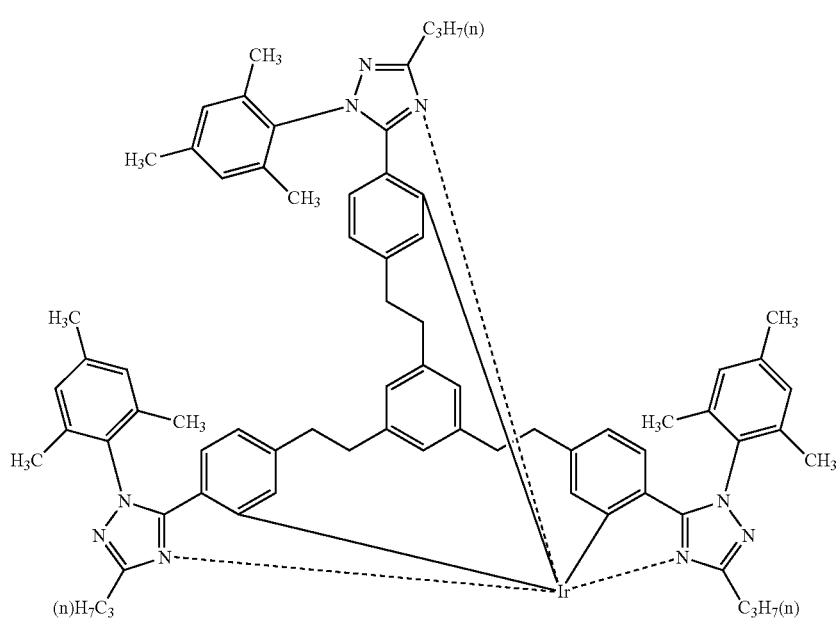
Exemplary Compound (VII)-2

-continued
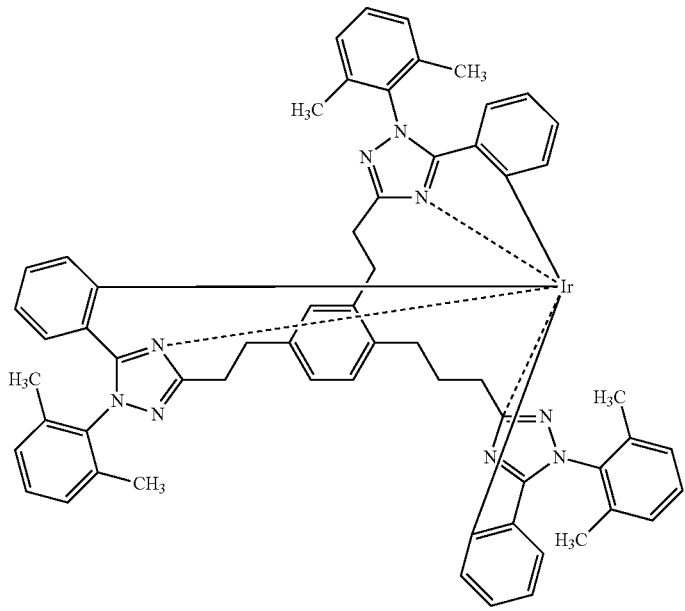
Exemplary Compound (VII)-3
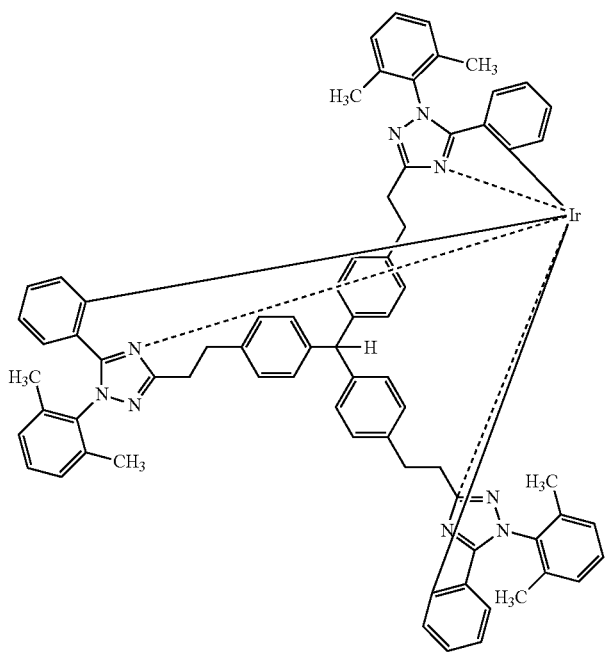
Exemplary Compound (VII)-4

(III)-22
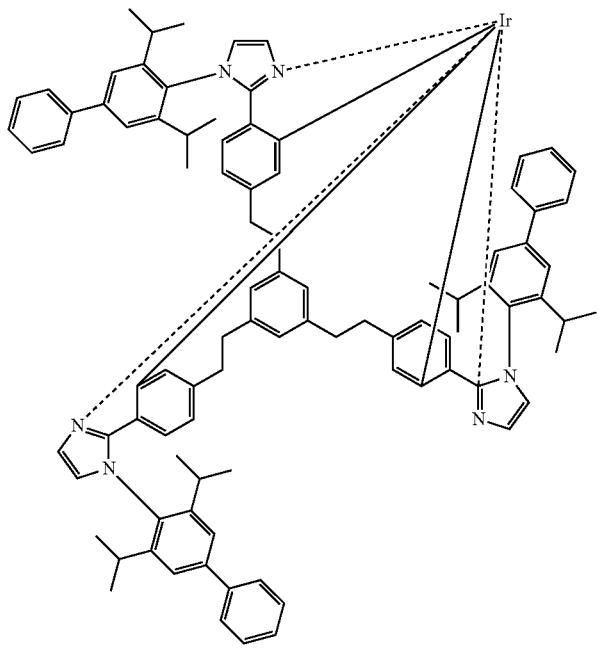
(III)-23
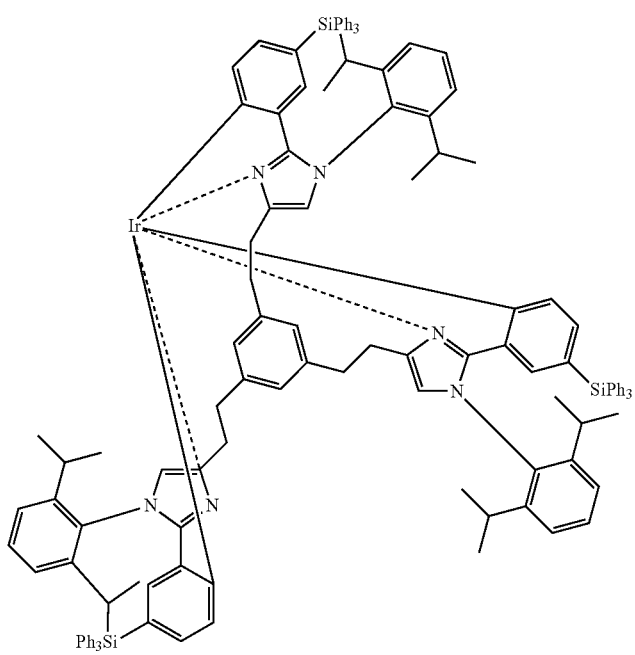

(III)-24
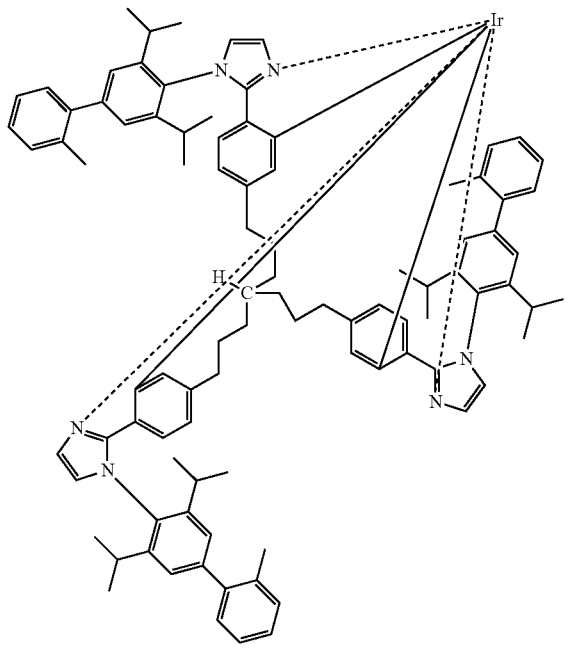
(III)-25
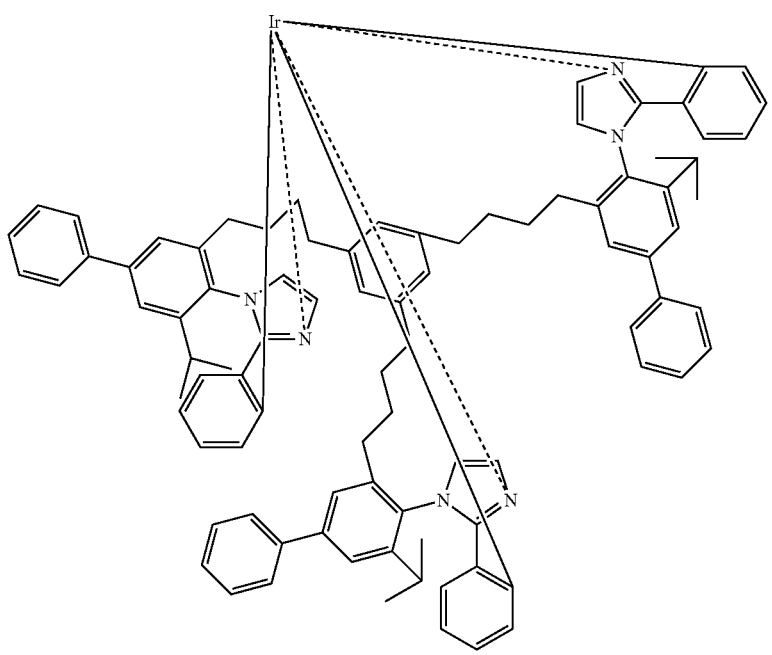

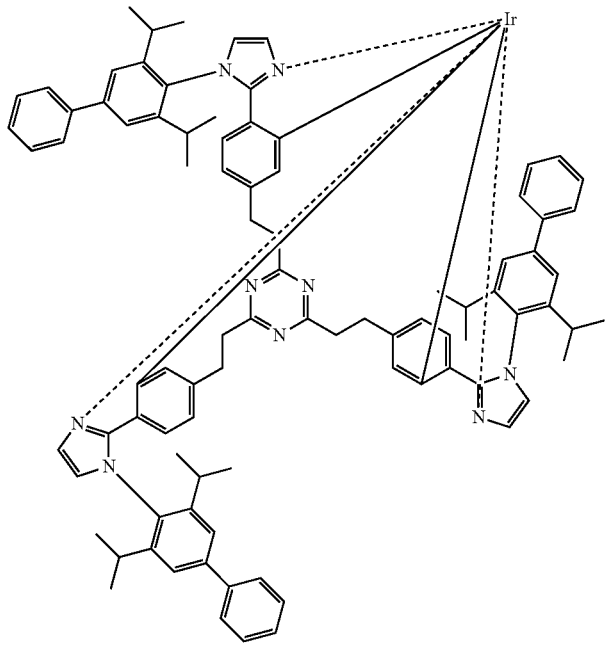
(III)-26
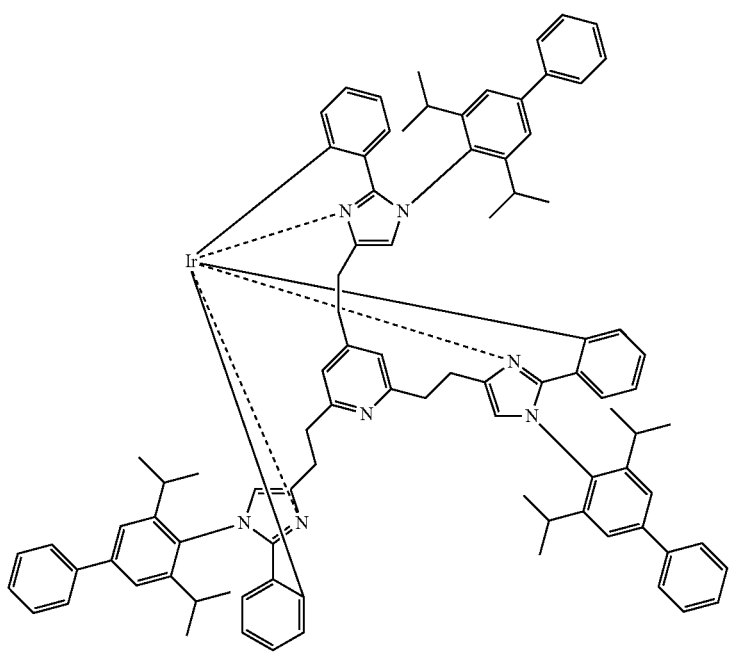
(III)-27

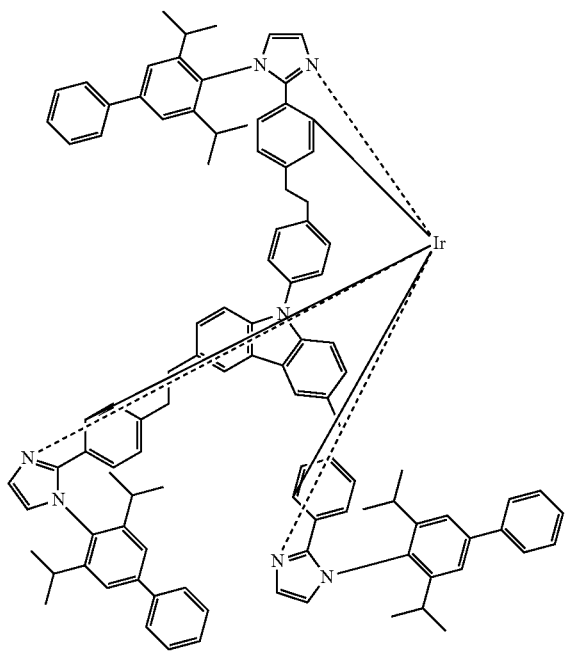
(III)-28
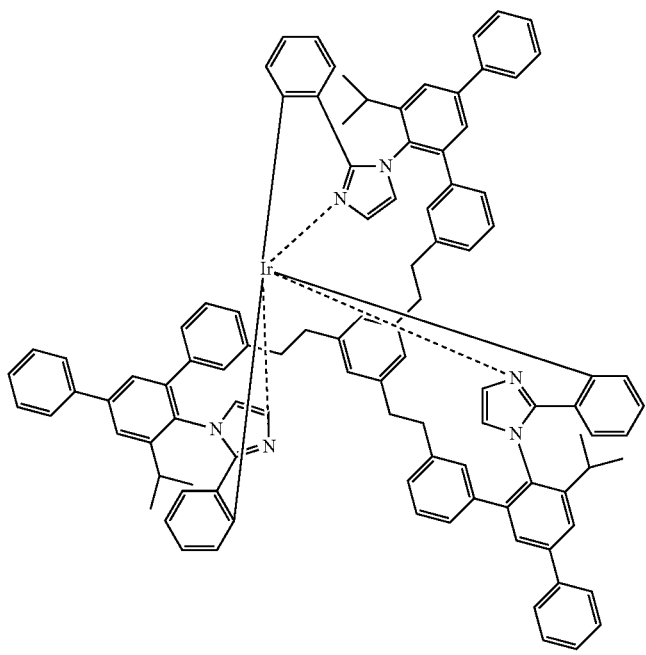
(III)-29

-continued
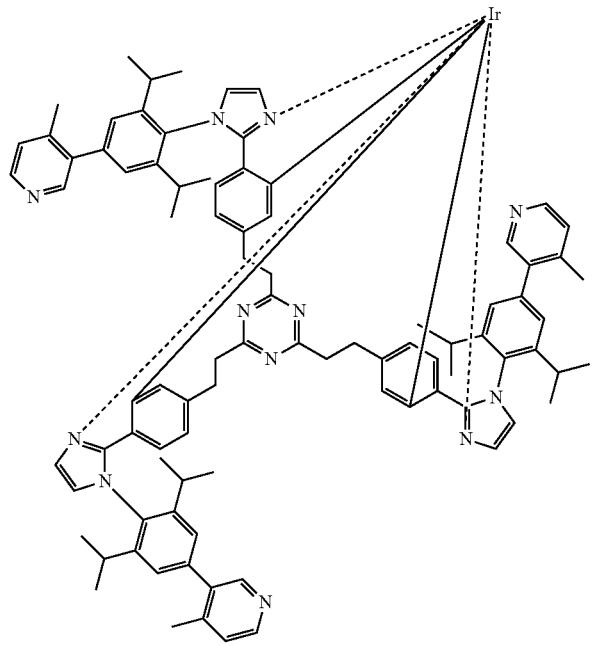
(III)-30
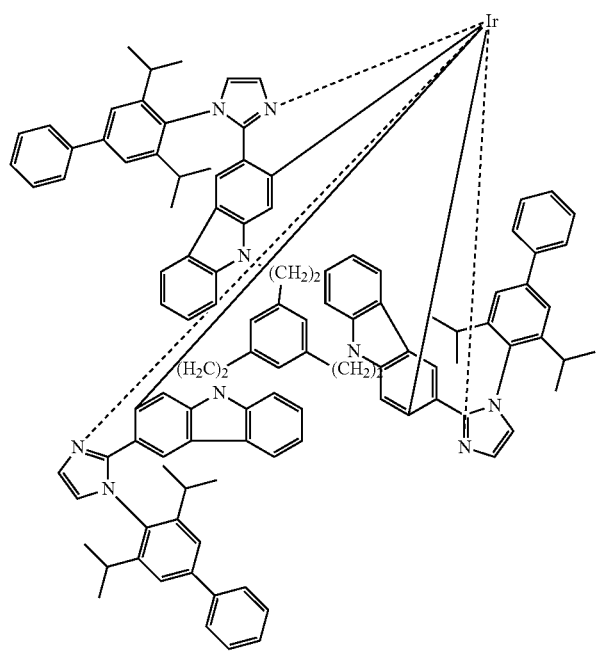
(III)-31

-continued
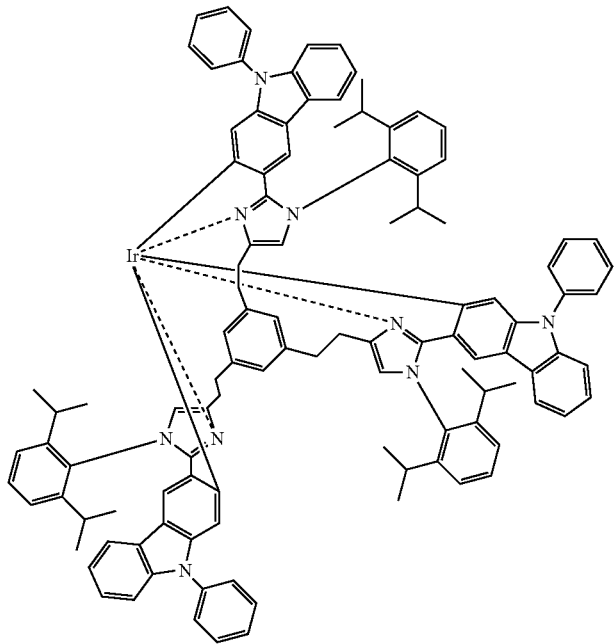
(III)-32
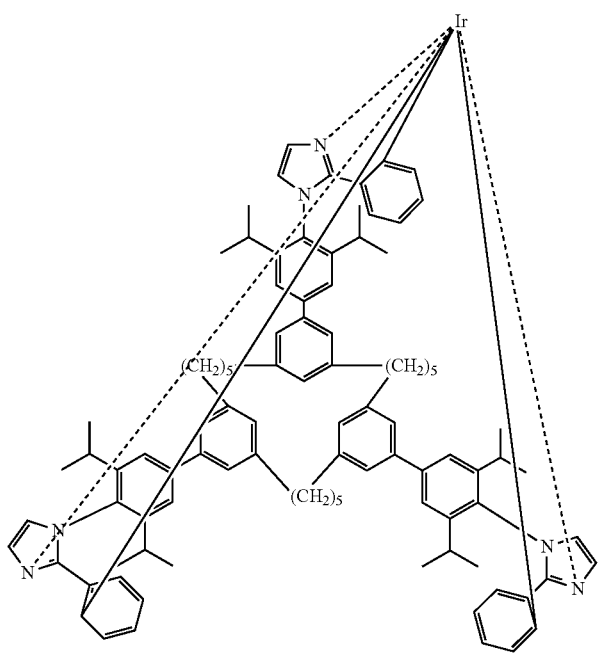
(III)-33

-continued (III)-34

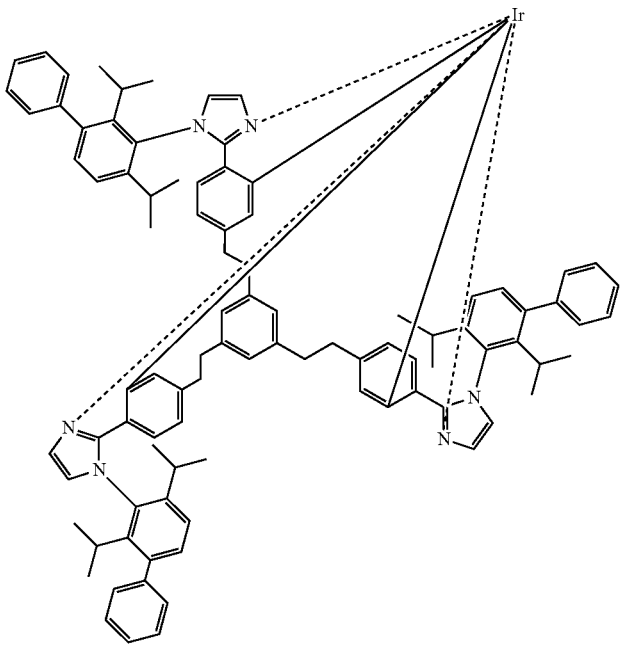

«Constitutive Layers of Organic EL Device»

The constitutive layers of the organic EL device of the present invention will be explained. While the paragraphs below specifically describe preferable examples of the layer configuration of the organic EL device of the present invention, the present invention is not restricted by the examples.

(i) anode/luminescent layer unit/electron transport layer/cathode (ii) anode/hole transport layer/luminescent layer unit/electron transport layer/cathode (iii) anode/hole transport layer/luminescent layer unit/hole blocking layer/electron transport layer/cathode (iv) anode/hole transport layer/luminescent layer unit/hole blocking layer/electron transport layer/cathode buffer layer/cathode (v) anode/anode buffer layer/hole transport layer/luminescent layer unit/hole blocking layer/electron transport layer/cathode buffer layer/cathode In addition, the luminescent layer unit may have a non-luminescent intermediate layer or layers inserted between luminescent layers of the luminescent layer unit. The luminescent layer unit may be a multi-photon unit having the intermediate layer(s) as a charge generating layer or layers. The luminescent layer unit preferably has the charge generation layer(s) including a conductive inorganic compound layer such as ITO (Indium Tin Oxide), IZO (Indium Zinc Oxide), $ZnO_2$, TiN, ZrN, HN, $TiO_x$, $VO_x$, CuI, InN, GaN, $CuAlO_2$, $GuGaO_2$, $SrCu_2O_2$, $LaB_6$, $RuO_2$; two layers such as $Au/Bi_2O_3$; multilayer such as $SnO_2/Ag/SnO_2$, ZnO/Ag/ZnO, $Bi_2O_3/Au/Bi_2O_3$, $TiO_2/TiN/TiO_2$, $TiO_2/ZrN/TiO_2$; fullerenes such as $C_{60}$; a conductive organic compound layer such as oligothiophene, metallic phthalocyanines, metal-free phthalocyanines, metal porphyrins, metal-free porphyrins; and the like. In the organic EL device of the present invention, the luminescent layers are preferably a white light emitting layer, and the lighting apparatus preferably uses such device.

The individual layers composing the organic EL device of the present invention will be explained.

«Luminescent Layer»

The luminescent layer used in the present invention is a layer in which electrons and holes, injected from the electrodes, the electron transport layer or the hole transport layer, recombine to cause luminescence. Site of causing luminescence is inside the luminescent layer, or at the interface between the luminescent layer and the adjacent layer.

While total thickness of the luminescent layer is not specifically limited, it is preferably adjusted to the range from 2 nm to 5 μm, more preferably 2 nm to 200 nm, and particularly preferably 5 nm to 100 nm from the viewpoint of ensuring uniformity of films, avoiding application of unnecessarily high voltage for emission, and improving stability of luminance color with respect to drive voltage.

The luminescent layer may be formed using luminescent dopant or host compound described later, typically by vacuum deposition method, wet process method such as spin coating, casting, die coating, blade coating, roll coating, ink jet process, printing, spray coating, curtain coating LB (Langmuir-Blodgett) process, and so forth.

The luminescent layer is preferably formed by the wet process, for the case where the compound of the present invention is used.

The luminescent layer of the organic EL device of the present invention preferably contains a luminescent dopant [phosphorescent dopant (also referred to as "phosphorescence dopant", or "phosphorescent dopant group"), fluorescent dopant, etc.] compound, and a luminescent host compound.

(1) Luminescent Dopant Compound

The luminescent dopant compound (also referred to as "luminescence dopant", or simply as "dopant") will be explained.

The luminescent dopant adoptable herein includes fluorescence dopant (also referred to as "fluorescent compound"), phosphorescence dopant (also referred to as "phosphor", "phosphorescent compound", and so forth).

(1.1) Phosphorescence Dopant (Also Referred to as "Phosphorescent Dopant")

The phosphorescence dopant according to the present invention will be explained.

The phosphorescence dopant compound according to the present invention is a compound from which luminescence ascribable to excited triplet state may be observed, and more specifically a compound from which phosphorescence may be observed at room temperature (25° C.). While the compound is defined to have a phosphorescence quantum yield of 0.01 or larger at 25° C., the phosphorescence quantum yield is preferably 0.1 or larger.

The phosphorescence quantum yield may be measured by the method described in "Jikkenn Kagaku Koza 7, Dai Yon Han, Bunko II (The Course of Experimental Chemistry 7, 4th Edition, Spectrometry II)", p. 398 (1992, published by Maruzen Co., Ltd.), in Japanese. While the phosphorescence quantum yield in solution may be measured using various solvents, the phosphorescence dopant according to the present invention may be good enough if the above described level (0.01 or larger) of phosphorescence quantum yield is achieved in an arbitrary solvent.

There are two known luminescence mechanism of phosphorescence dopant. One of which is energy transfer mechanism, according to which carriers transported on the host compound recombine thereon so as to excite the luminescent host compound, and the energy of excitation is then transferred to the phosphorescence dopant so as to obtain luminescence from the phosphorescence dopant. The other is carrier trap mechanism, according to which the phosphorescence dopant serves as a carrier trap, the carriers recombine thereon, and thereby luminescence may be obtained from the phosphorescence dopant compound. In both mechanisms, energy of excited state of the phosphorescence dopant is necessarily lower than energy of excited state of the host compound.

The organic EL device of the present invention includes at least one of the luminescent layers containing a phosphorescent organometallic complex (also referred to as "phosphorescent dopant", "phosphorescence dopant", etc.). As the phosphorescent organometallic complex, the luminescent layer preferably contains a material for composing the organic EL device of the present invention, which is a metal complex represented by any one of formula (I) to (IX).

The luminescent layer according to the present invention may additionally use the publicly-known compounds described in the patent publications enumerated below.

The patent publications include International Patent No. WO00/70655 pamphlet, Japanese Laid-Open Patent Publication Nos. 2002-280178, 2001-181616, 2002-280179, 2001-181617, 2002-280180, 2001-247859, 2002-299060, 2001-313178, 2002-302671, 2001-345183, 2002-324679, International Patent No. WO02/15645 pamphlet, Japanese Laid-Open Patent Publication Nos. 2002-332291, 2002-50484, 2002-332292, 2002-83684, Published Japanese Translation of PCT International Publication for Patent Application No. 2002-540572, Japanese Laid-Open Patent Publication Nos. 2002-117978, 2002-338588, 2002-170684, 2002-352960, International Patent No. WO01/93642 pamphlet, Japanese Laid-Open Patent Publication Nos. 2002-50483, 2002-100476, 2002-173674, 2002-359082, 2002-175884, 2002-363552, 2002-184582, 2003-7469, Published Japanese Translation of PCT International Publication for Patent Application No. 2002-525808, Japanese Laid-Open Patent Publication No. 2003-7471, Published Japanese Translation of PCT International Publication for Patent Application No. 2002-525833, Japanese Laid-Open Patent Publication Nos. 2003-31366, 2002-226495, 2002-234894, 2002-235076, 2002-241751, 2001-319779, 2001-319780, 2002-62824, 2002-100474, 2002-203679, 2002-343572, and 2002-203678.

(1.2) Fluorescence Dopant (Also Referred to as "Fluorescent Compound")

The fluorescence dopant adoptable herein includes compounds having high fluorescence quantum yield, represented by coumarin dyes, pyrane dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, rare earth-containing fluorescent complexes, and laser dyes.

A plurality of species of the luminescent dopants according to the present invention may be used in combination, wherein combination of phosphorescence dopant having different structures, or combination of phosphorescence dopant with fluorescence dopant are also adoptable.

Now, specific examples of publicly-known luminescent dopant, adoptable together with the metal complex represented by the above formula (A) according to the present invention are enumerated below, without restricting the present invention.

D-1

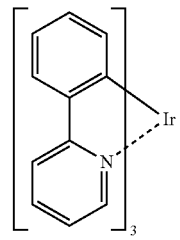

D-2

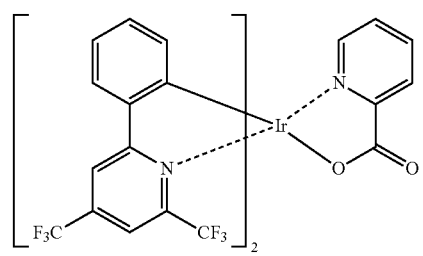

D-3

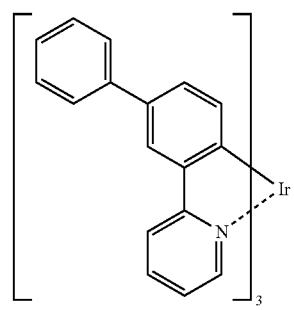

D-4 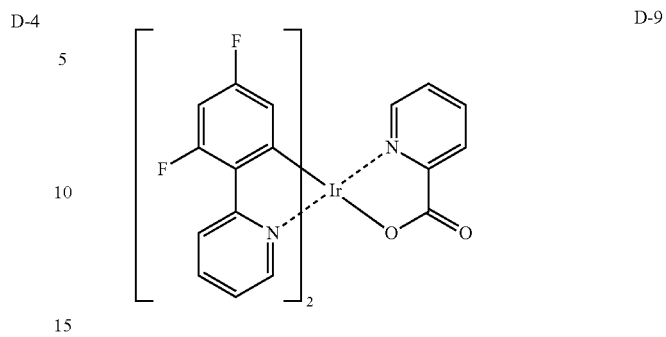
D-5 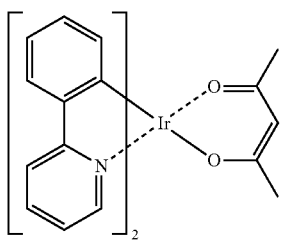
D-9 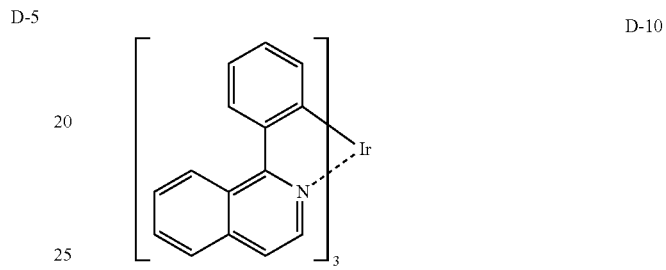
D-6 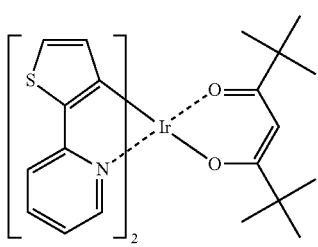
D-10 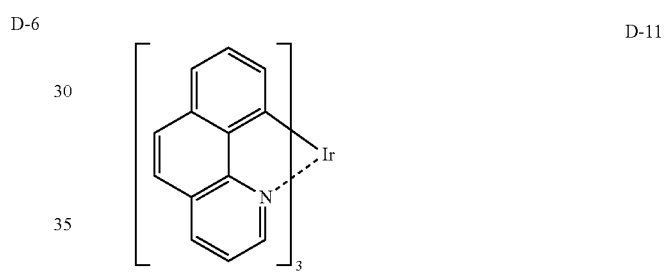
D-7 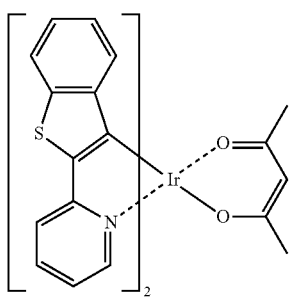
D-11 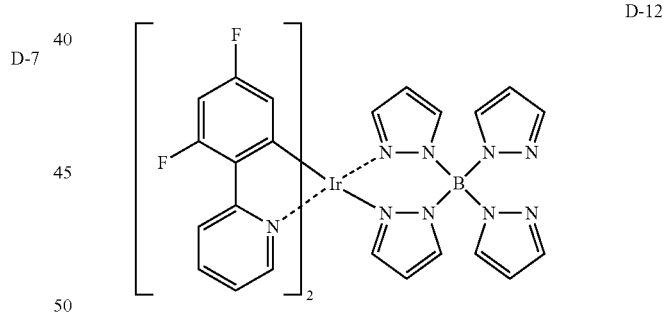
D-8 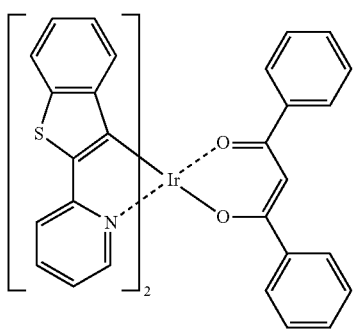
D-12 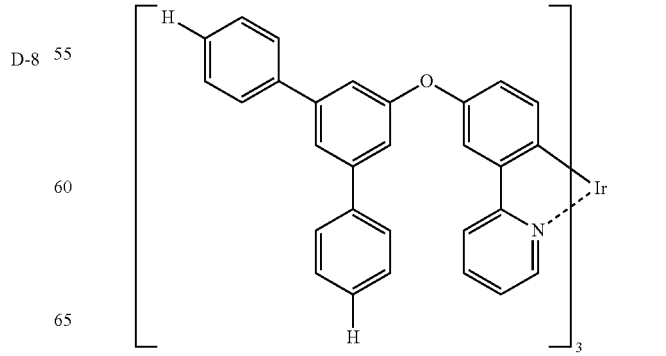
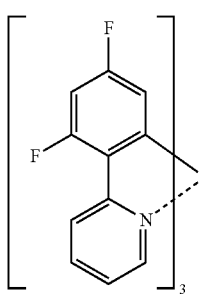
D-13

-continued
D-14
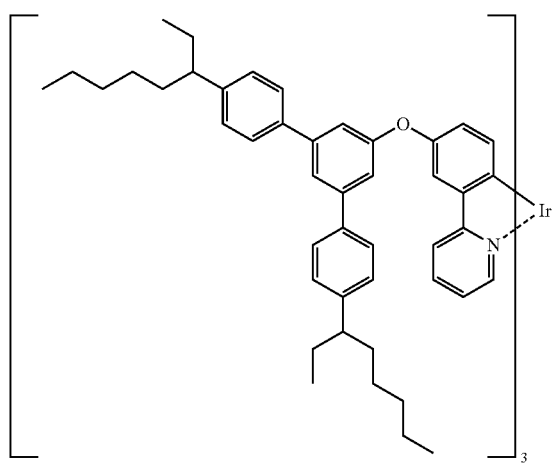
D-17
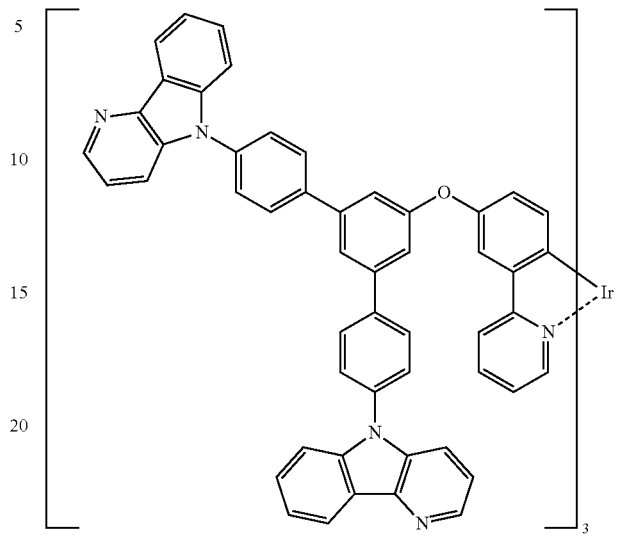
D-15
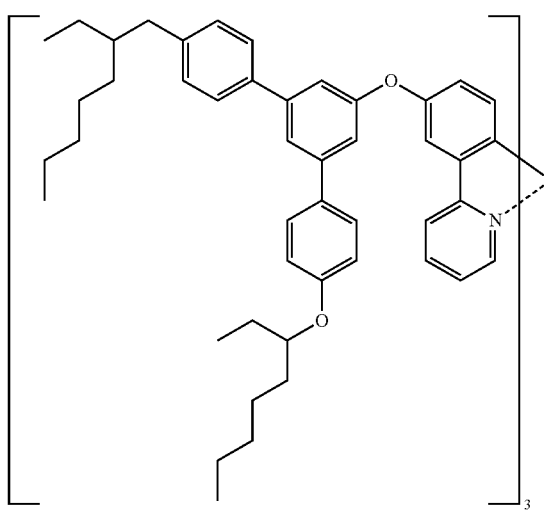
D-18
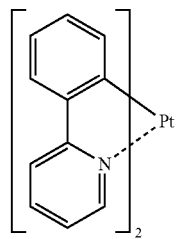
D-19
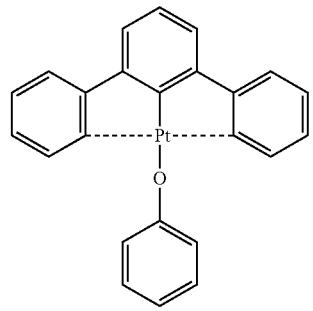
D-16
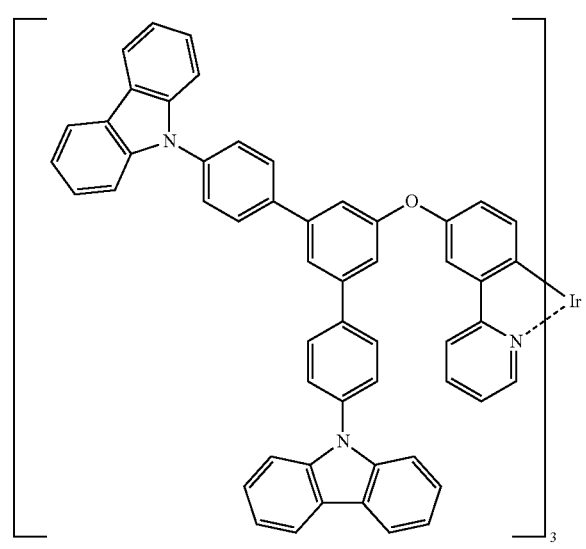
D-20
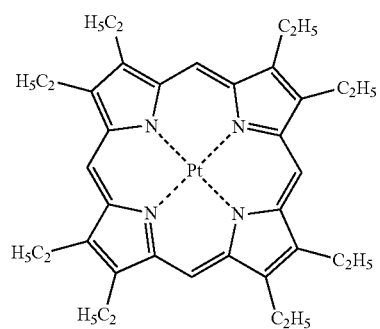

D-21 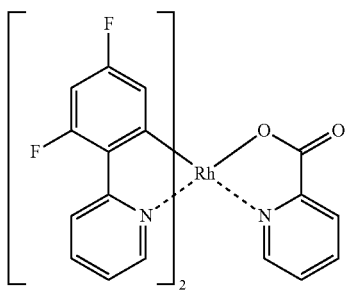
D-27 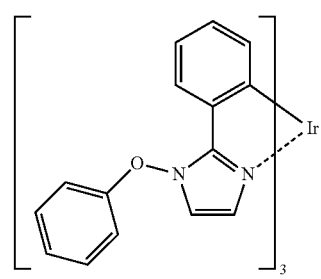
D-22 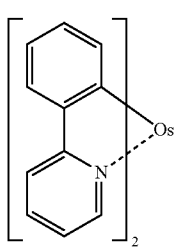
D-28 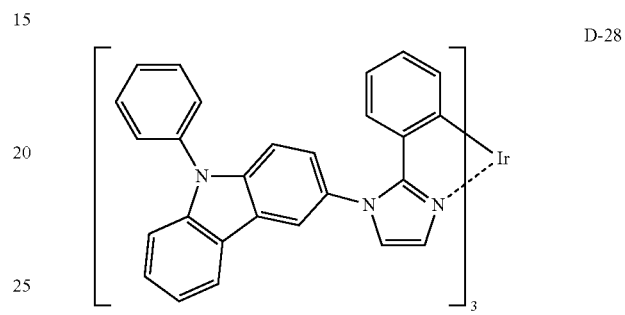
D-23 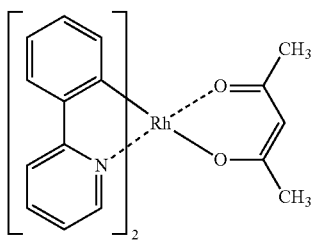
D-29 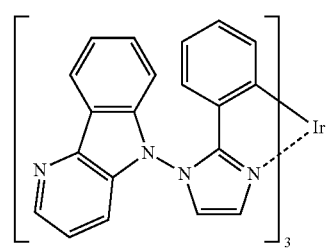
D-24 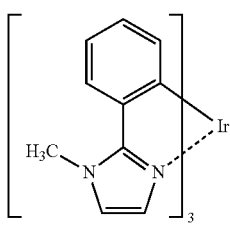
D-25 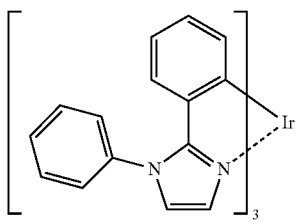
D-30
D-26 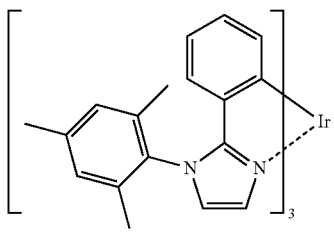
D-31

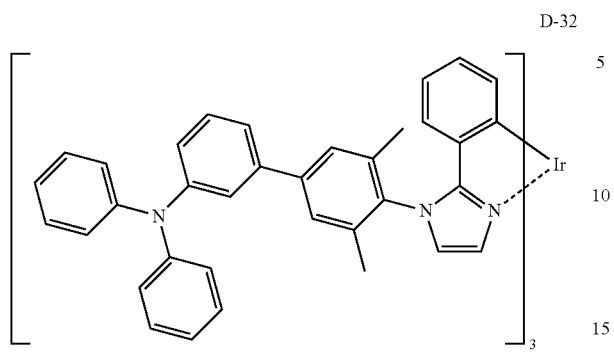
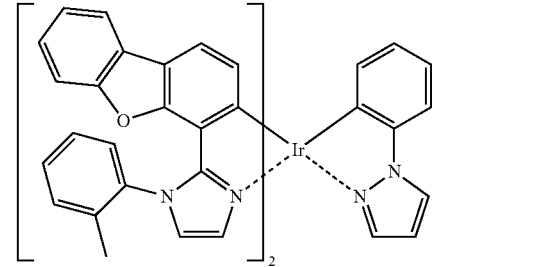
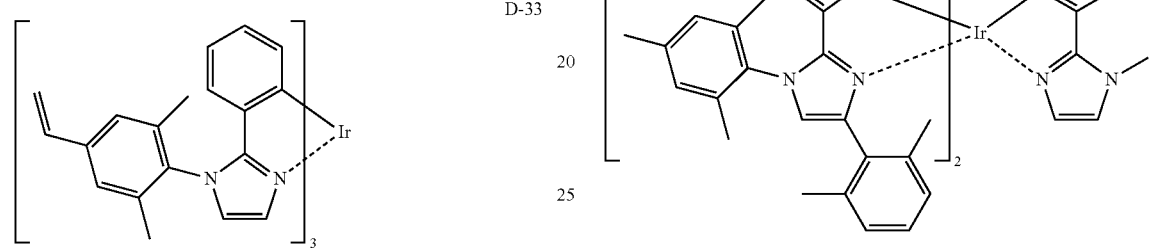
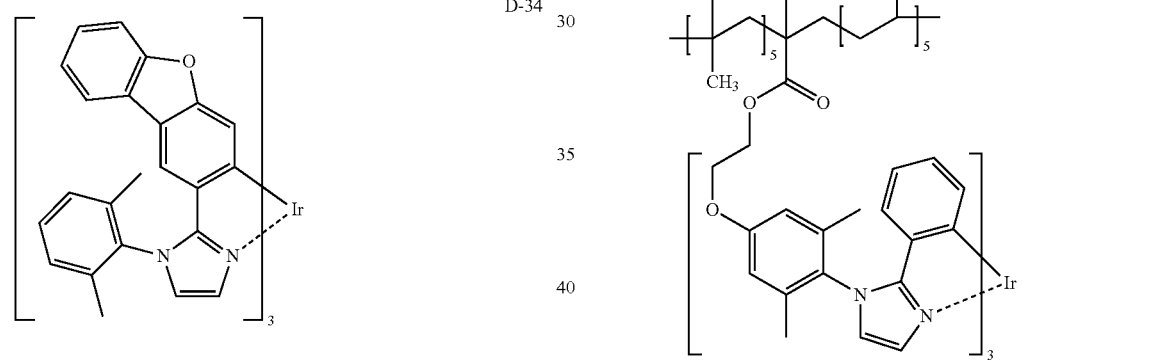

-continued

D-41
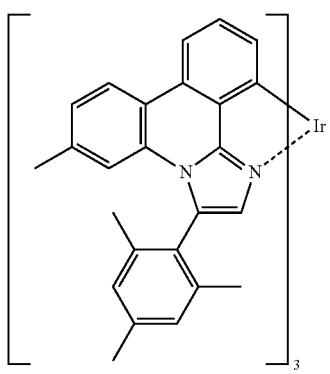

D-42
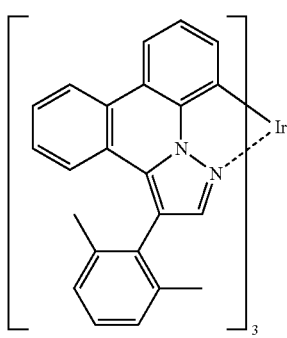

D-43
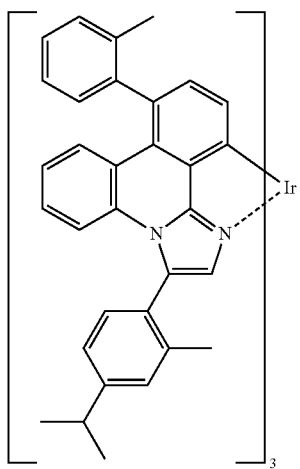

D-44
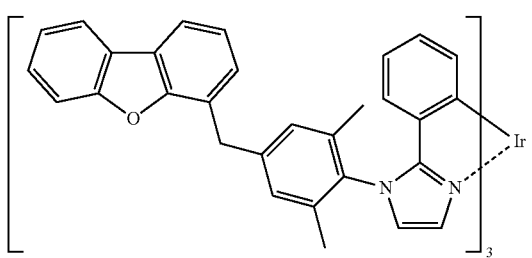

-continued

D-45
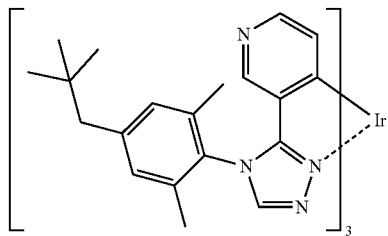

D-46
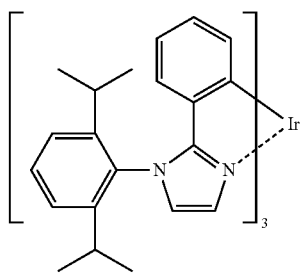

D-47
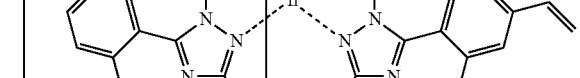

(2) Luminescent Host Compound (Also Referred to as "Luminescent Host")

In the present invention, the host compound is defined, as a compound which accounts for 20% by mass or more out of all compounds contained in the luminescent layer, and has a phosphorescence quantum yield at room temperature (25° C.) of less than 0.1, more preferably less than 0.01.

The luminescent host adoptable to the present invention is not specifically limited. Compounds having been used in the conventional organic EL device are adoptable to the luminescent host. Representative examples include those having basic skeletons of carbazole derivative, triarylamine derivative, aromatic derivative, nitrogen-containing heterocyclic compound, thiophene derivative, furan derivative, and oligoarylene compound; and carboline derivative and diazacarbazole derivative (where, the diazacarbazole derivative herein represents a group of compounds in which at least one carbon atom of the hydrocarbon ring composing the carboline ring of the carboline derivative is replaced by nitrogen atom(s)).

Publicly-known luminescent hosts adoptable to the present invention are preferably those having hole transporting property and electron transporting property, as well as preventing the luminescence from shifting towards longer wavelength region, and having high Tg (glass transition temperature).

In the present invention, a single species of the publicly-known luminescent hosts is used, or a plurality of species of which are used in a combined manner.

By using a plurality of species of the luminescent hosts in a combined manner, charge transfer can be adjusted, and thereby the organic EL device can be improved in the efficiency.

By using a plurality of species of the metal complex of the present invention used as the phosphorescence dopant and/or publicly-known compounds, different kinds of luminescence can be mixed, and thereby an arbitrary color of luminescence can be obtained.

The luminescent host used in the present invention is a low-molecular-weight compound, or a polymer compound having repeating units, or a low-molecular-weight compound having a polymerizable group such as vinyl group or epoxy group (polymerizable luminescent host). A single or more species of these compounds are used.

Specific examples of publicly-known luminescent host are exemplified by those described in the patent documents below.

Japanese Laid-Open Patent Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

Specific examples of the compounds adoptable to the luminescent host in the luminescent layer of the organic EL device of the present invention are enumerated, without restricting the present invention.

OC-1

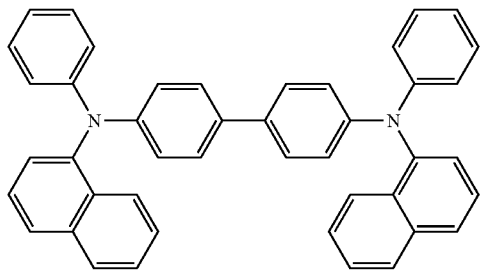

OC-2

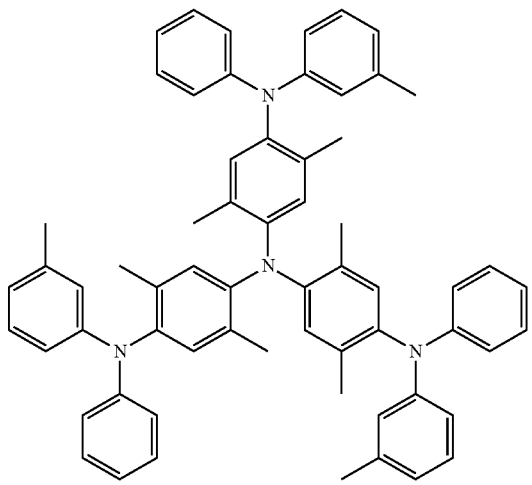

OC-3

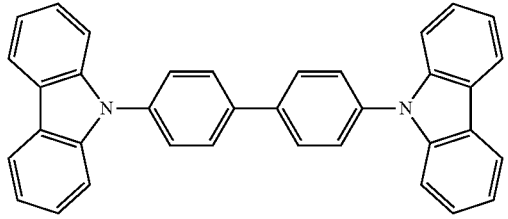

OC-4

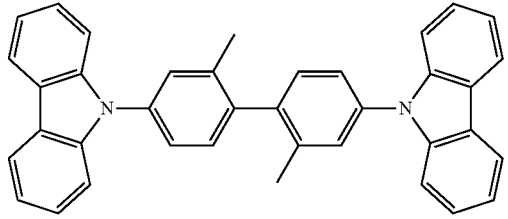

OC-5

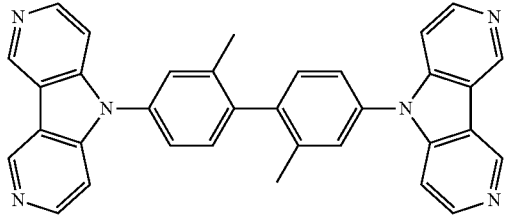

OC-6

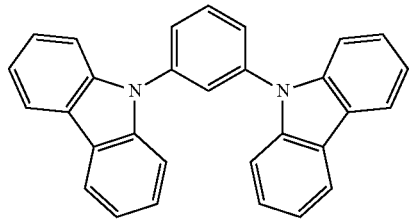

OC-7

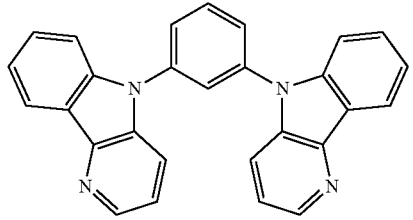

OC-8

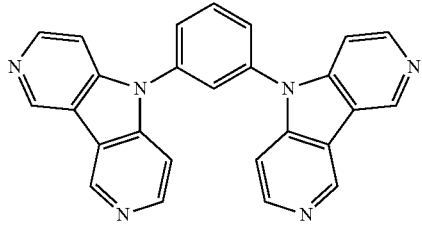

-continued
OC-9
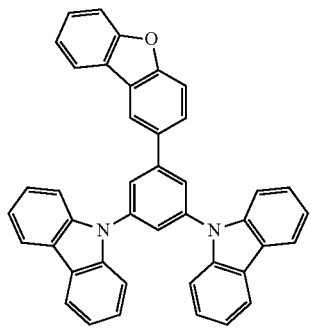
OC-10
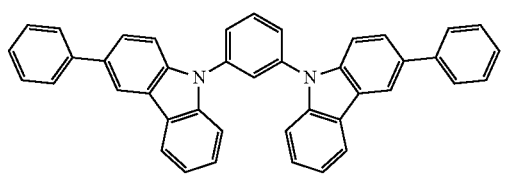
OC-11
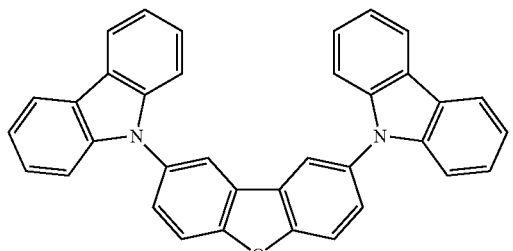
OC-12
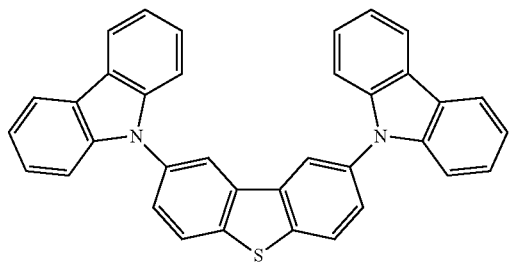
OC-13
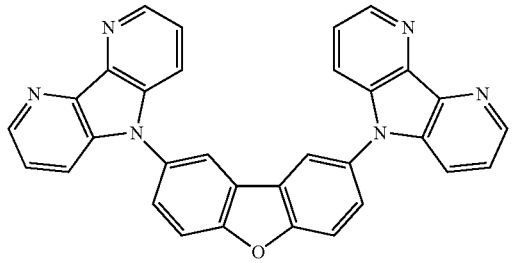
OC-14
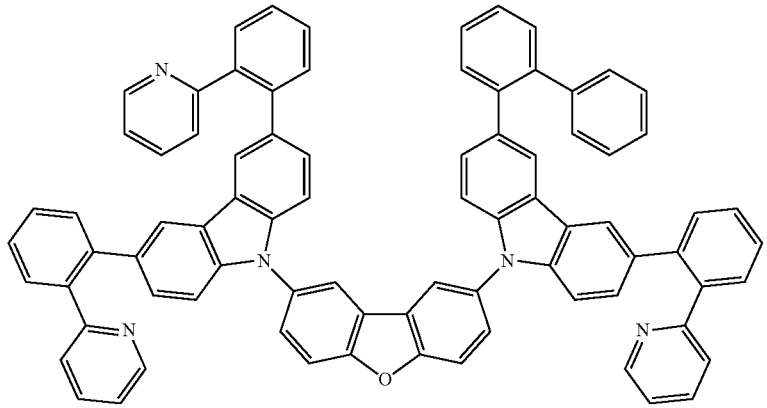
OC-15
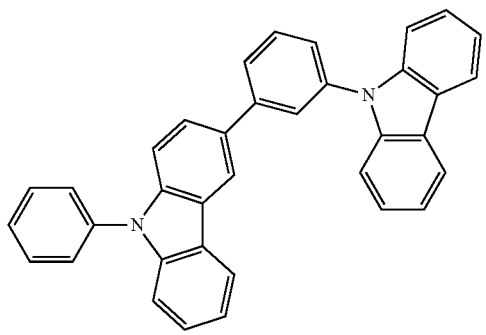
OC-16
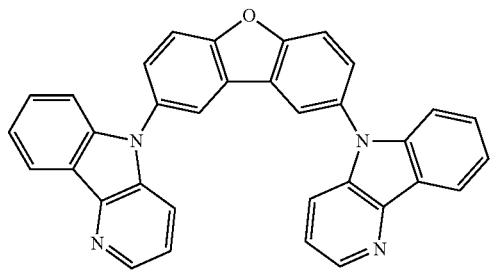

-continued
OC-17
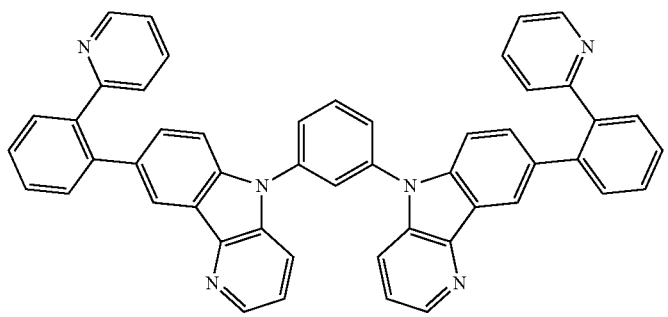
OC-18
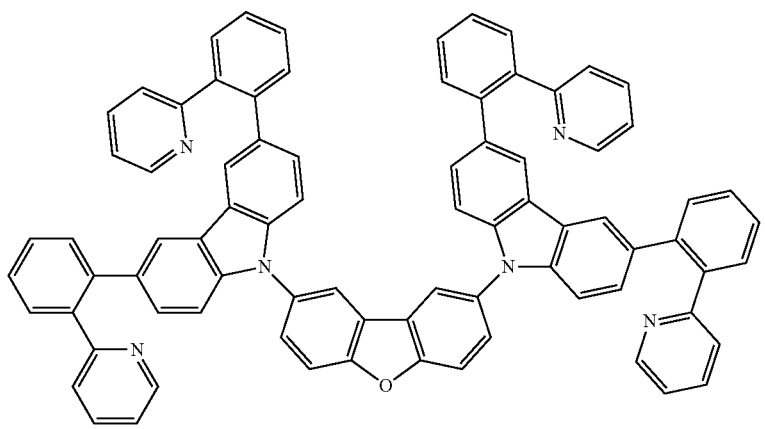
OC-19
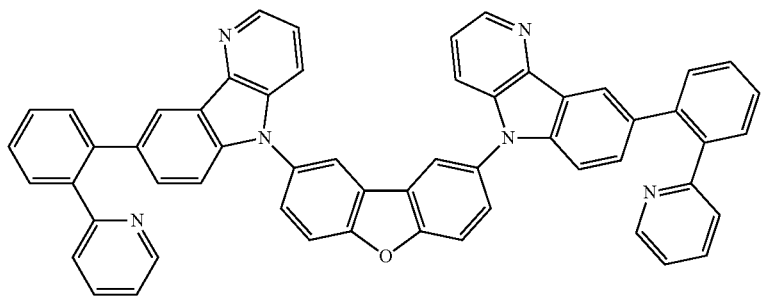
OC-20
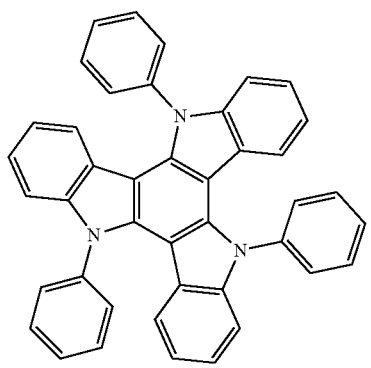
OC-21
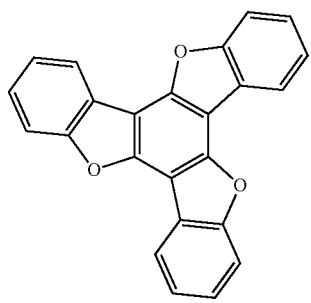

-continued
OC-22
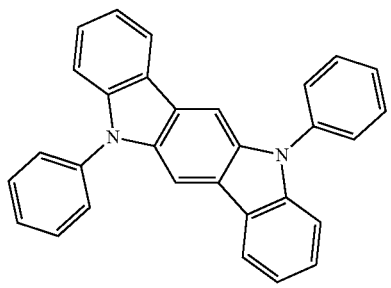
OC-23
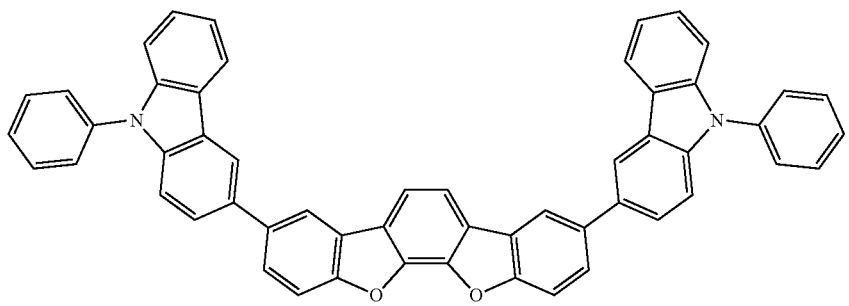
OC-24
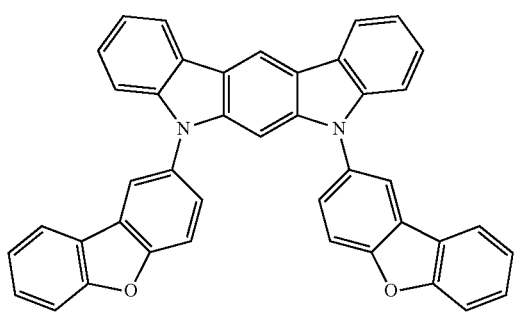
OC-25
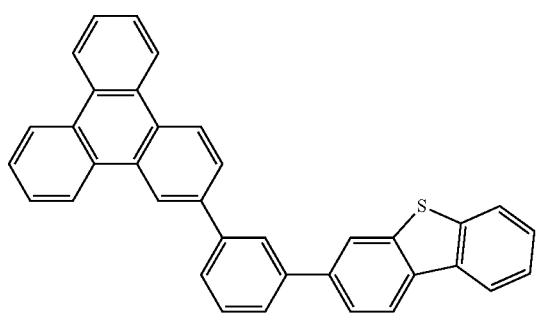
OC-26
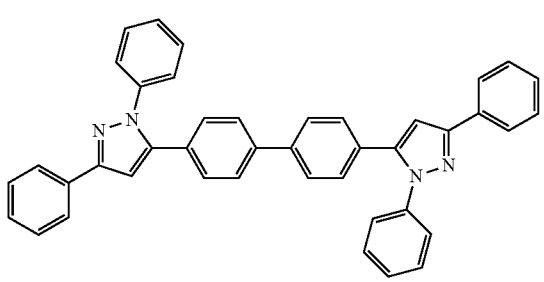
OC-27
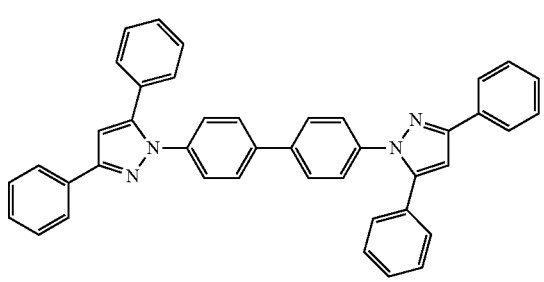
OC-28
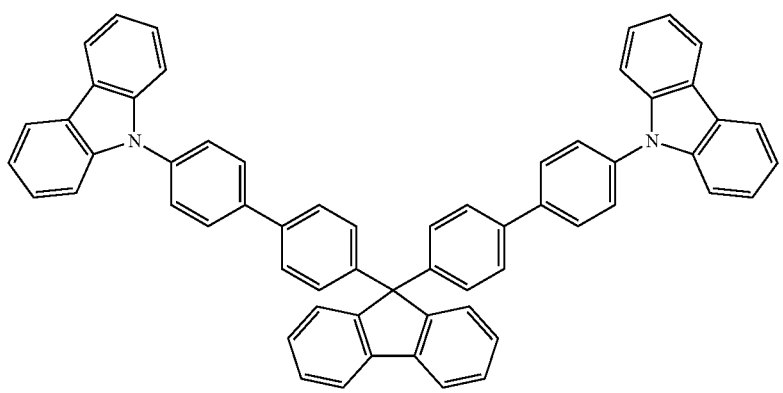

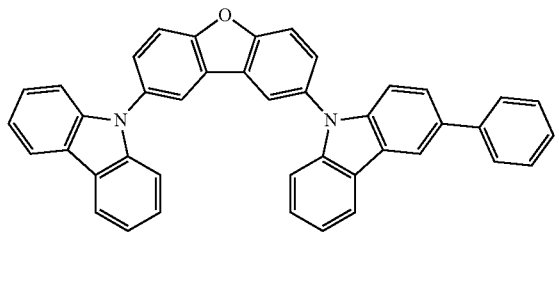

OC-29

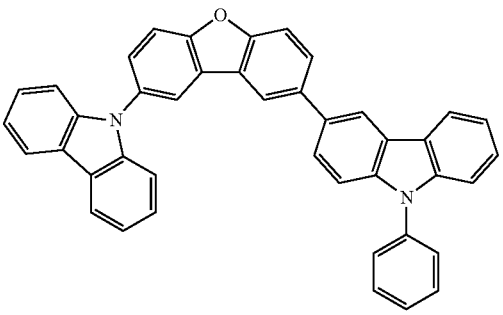

OC-30

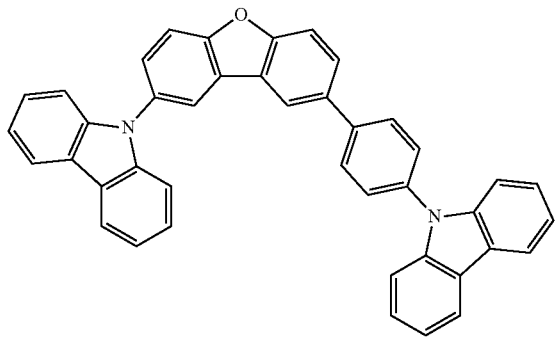

OC-31

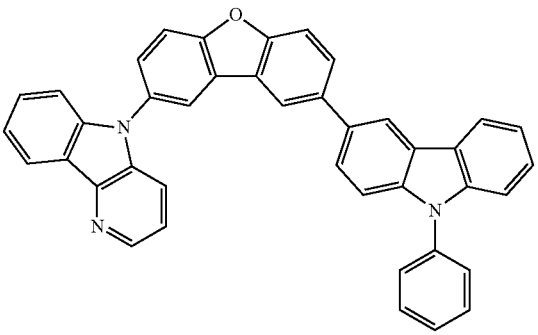

OC-32

In addition, compounds particularly preferable as the luminescent host in the luminescent layer of the organic EL device of the present invention are those represented by the formula (B) below.

Formula (B)

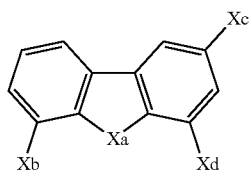

In the formula (B), Xa represents O or S, each of Xb, Xc and Xd independently represents a hydrogen atom, substituent or group represented by the formula (C) below, at least one of Xb, Xc and Xd is represented by the formula (C) below, and at least one of the groups represented by the formula (C) has a carbazolyl group for Ar.

Ar-(L₄)ₙ-*    Formula (C)

In the formula (C), L₄ represents a divalent linking group derived from an aromatic hydrocarbon ring or aromatic heterocycle. n represents an integer of 0 or 1 to 3, and if n is 2 or larger, a plurality of (L₄)s are the same or different. * represents a position of linkage with the structure represented by the formula (B). Ar represents a group represented by the formula (D) below.

Formula (D)

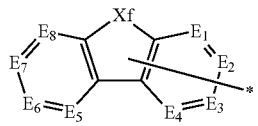

In the formula (D), Xf represents N(R″), O or S, each of E₁ to E₈ represents C(R″₁) or N. R″ and R″₁ represent a hydrogen atom, substituent or a position of linkage with L₄. * represents a position of linkage with L₄.]

In the compound represented by the formula (B), at least two of Xb, Xc and Xd are preferably represented by the formula (C). More preferably, Xb is represented by the formula (C), and Ar in the formula (C) represents a carbazolyl group which may have a substituent. Still more preferably, Xb is represented by the formula (C), and Ar in the formula (C) represents a carbazolyl group which may have a substituent, and is linked at the N position to L₄.

Xc is preferably represented by the formula (C), and furthermore Xd preferably represents a hydrogen atom.

Specific examples of the compound represented by the formula (B), preferably adoptable as the host compound (also referred to as "luminescent host") in the luminescent layer of the organic EL device of the present invention are shown below, without restricting the present invention.

83
1
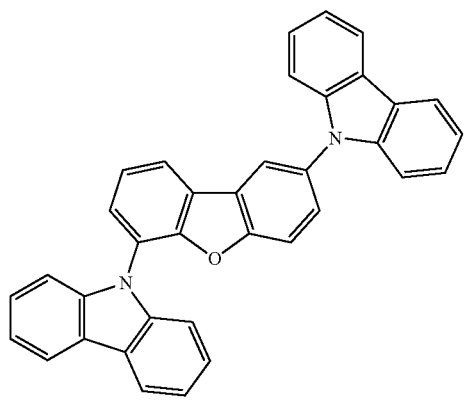
2
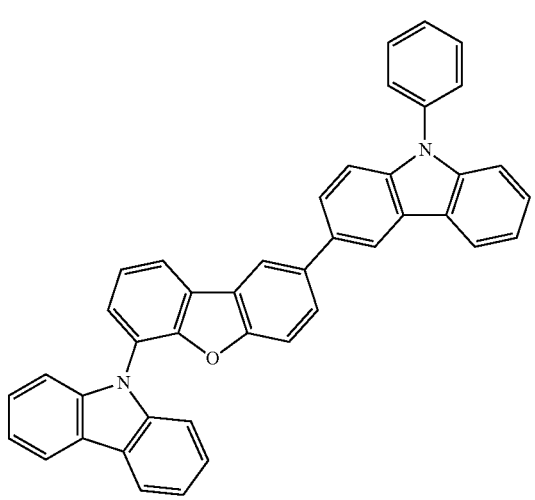
3
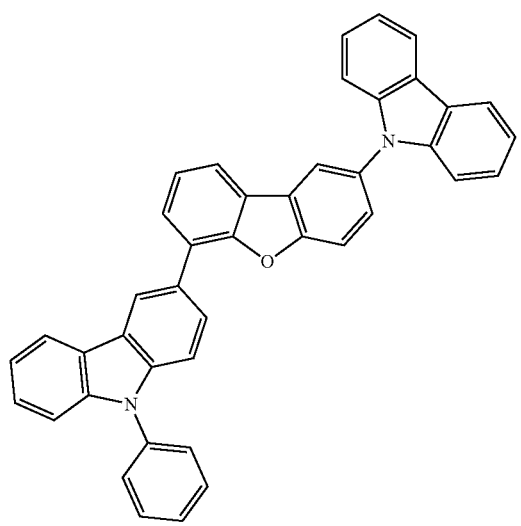
84
4
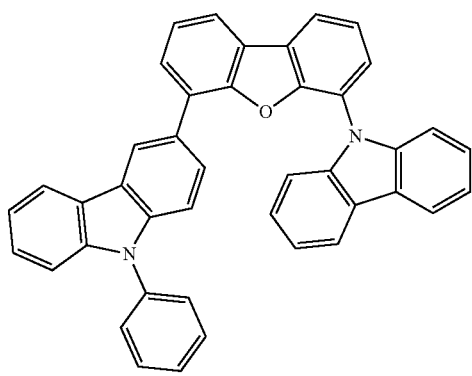
5
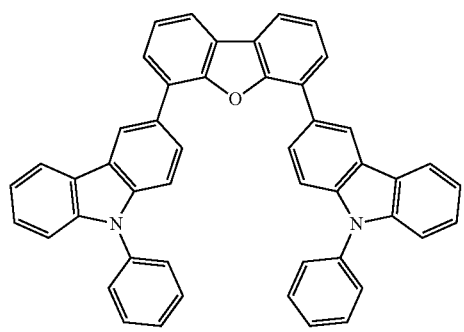
6
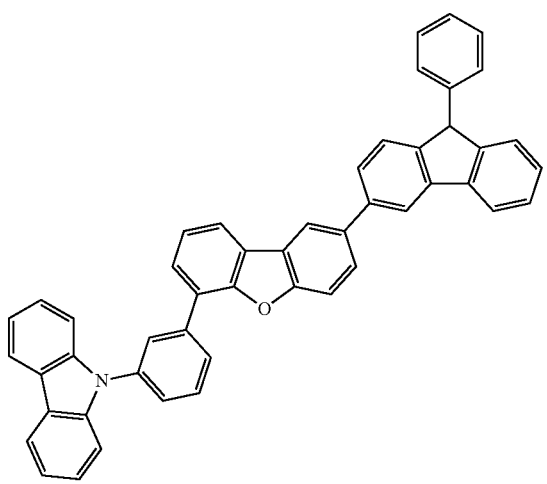

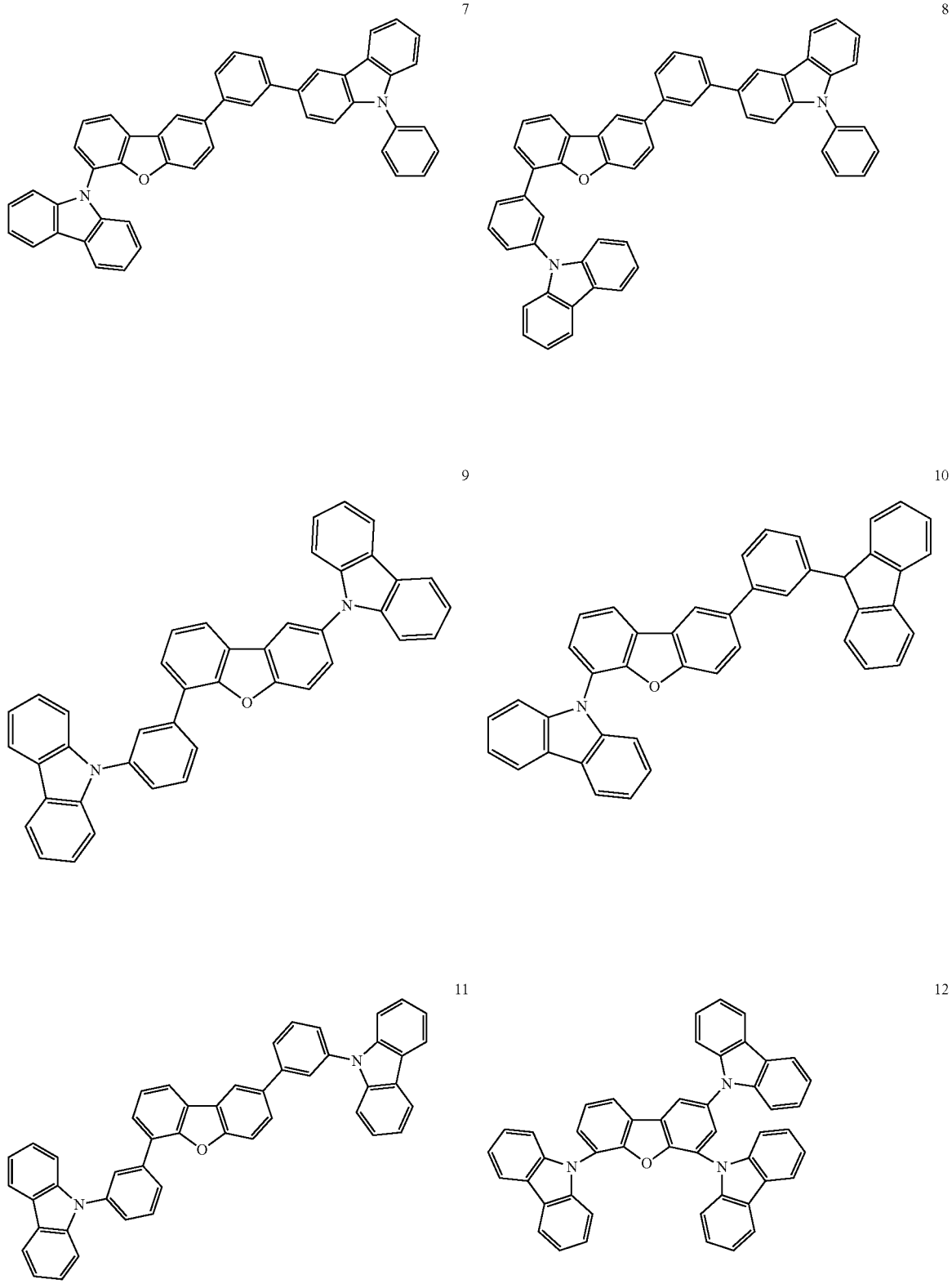

-continued
13
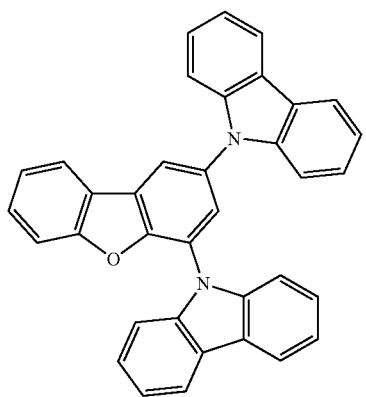
14
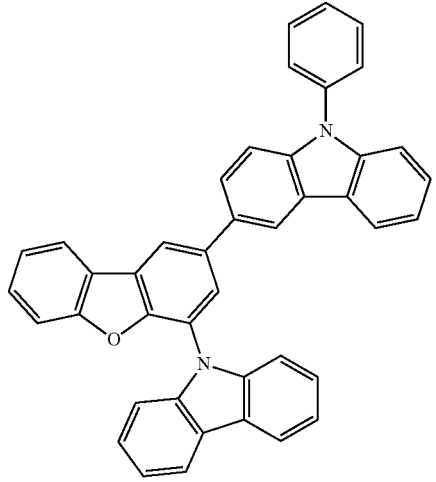
15
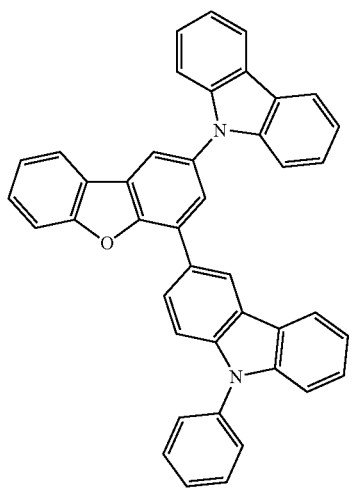
16
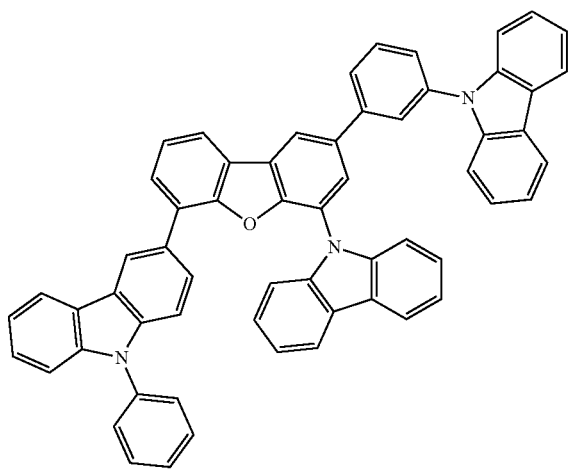
17
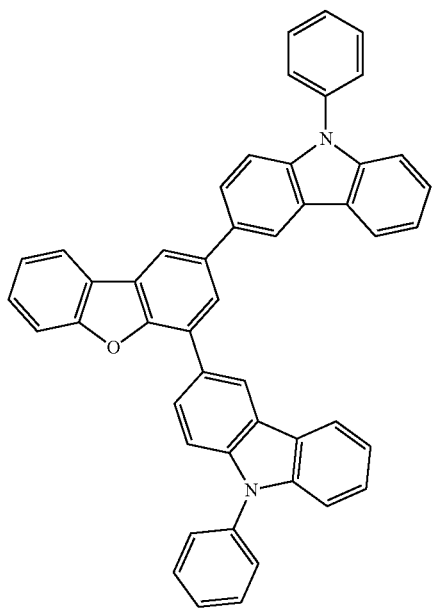
18
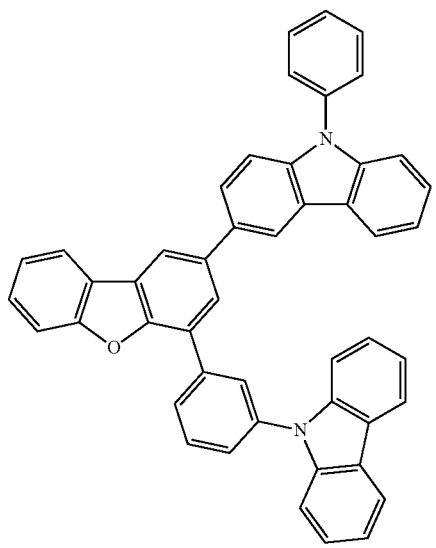

-continued
19
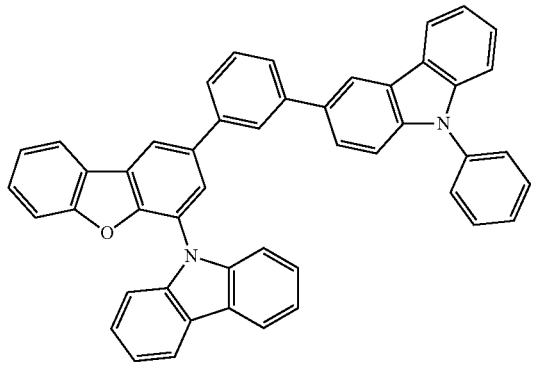
20
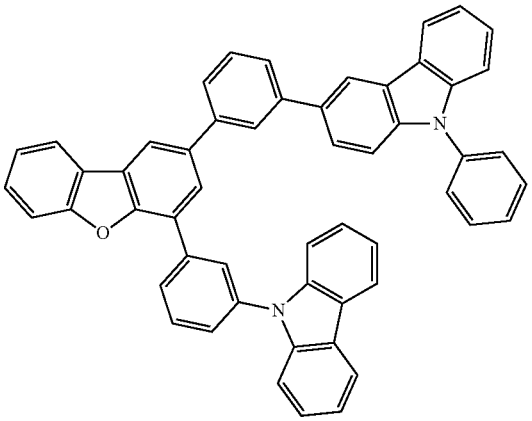
21
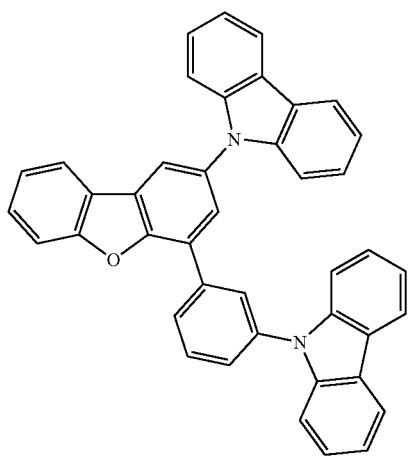
22
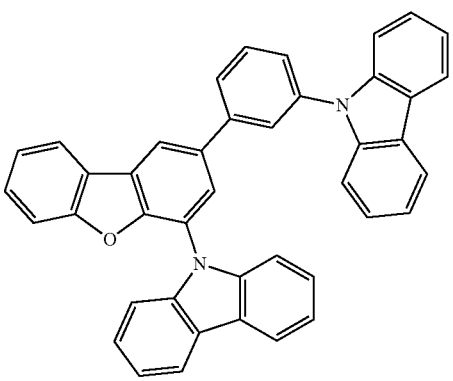
23
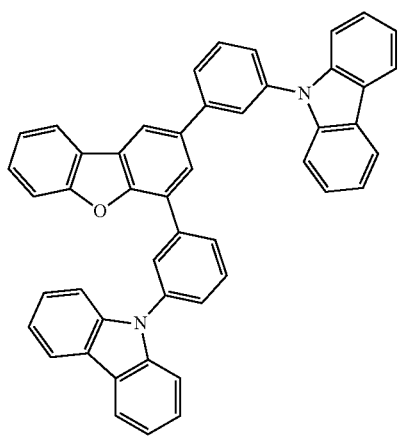
24
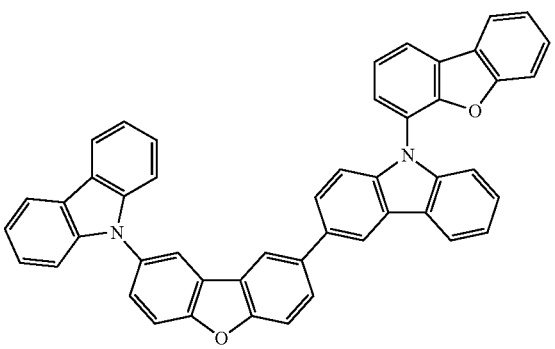

25
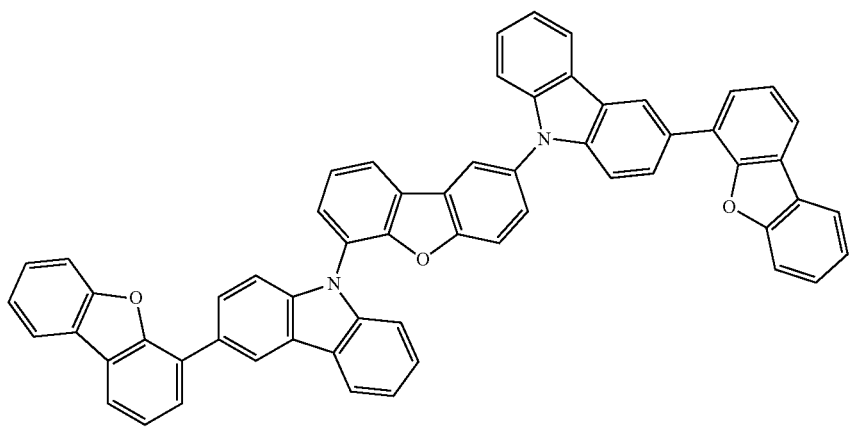
26
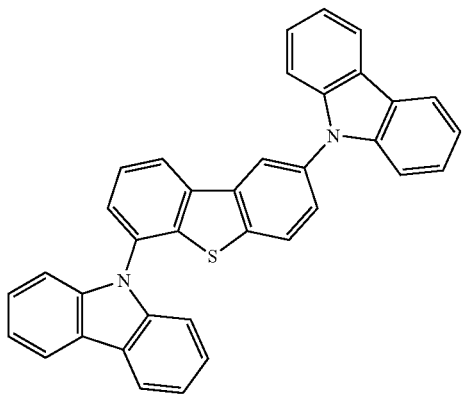
27
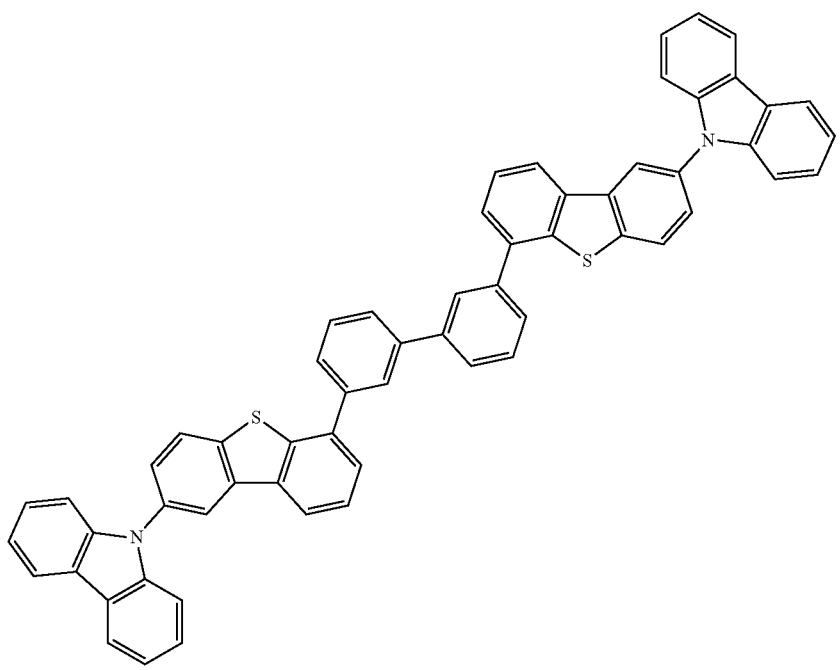

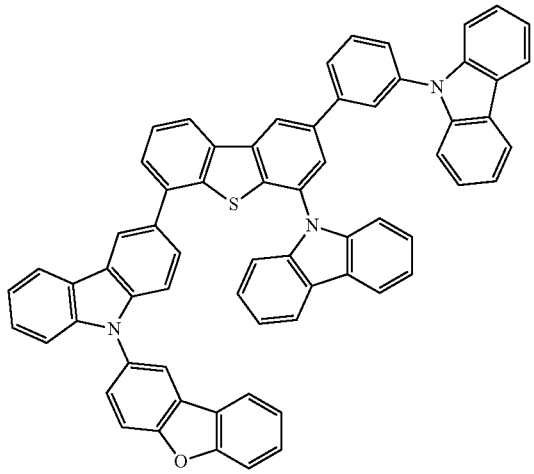
28
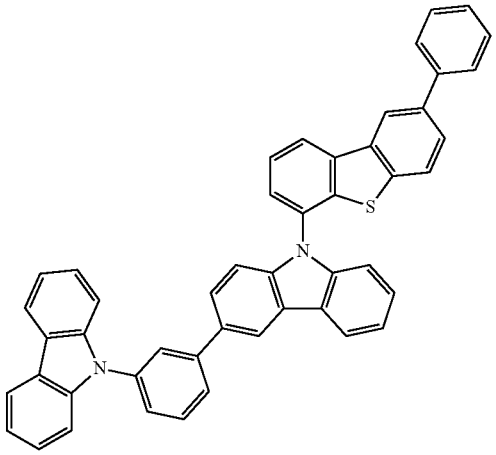
29
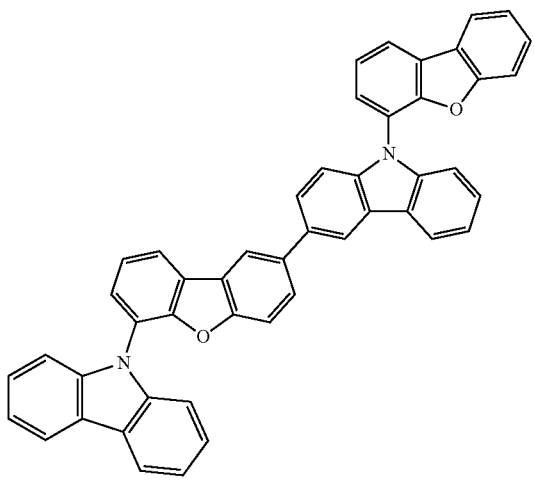
30
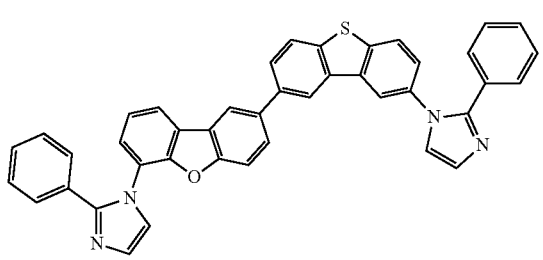
31
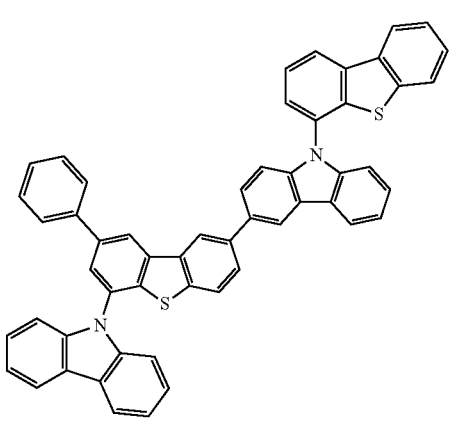
32

-continued
33
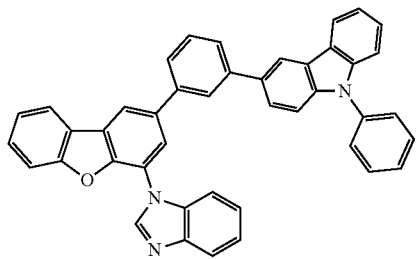
34
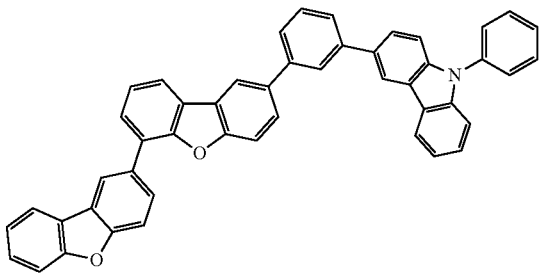
35
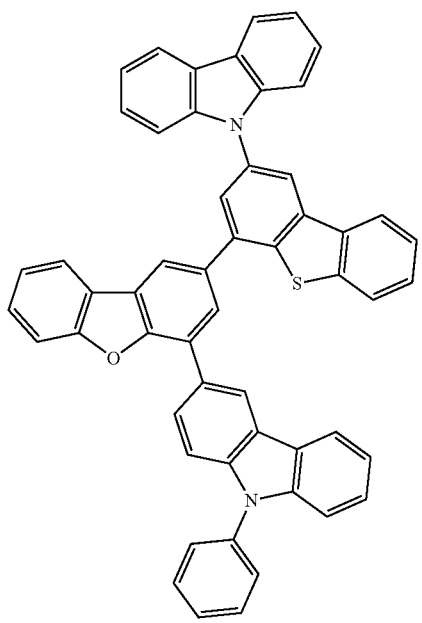
36
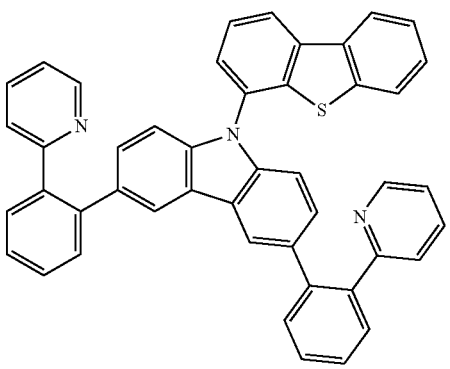
37
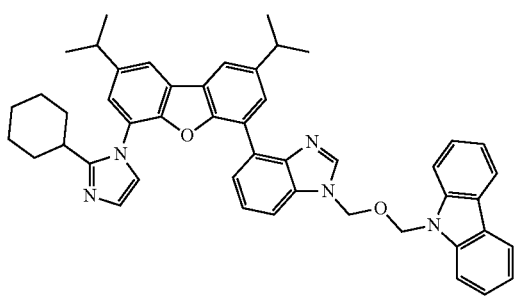
38
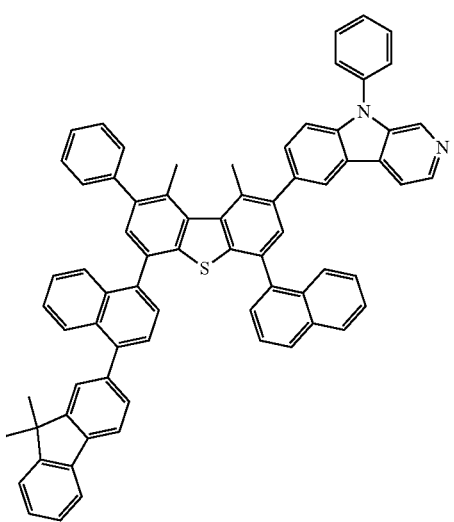

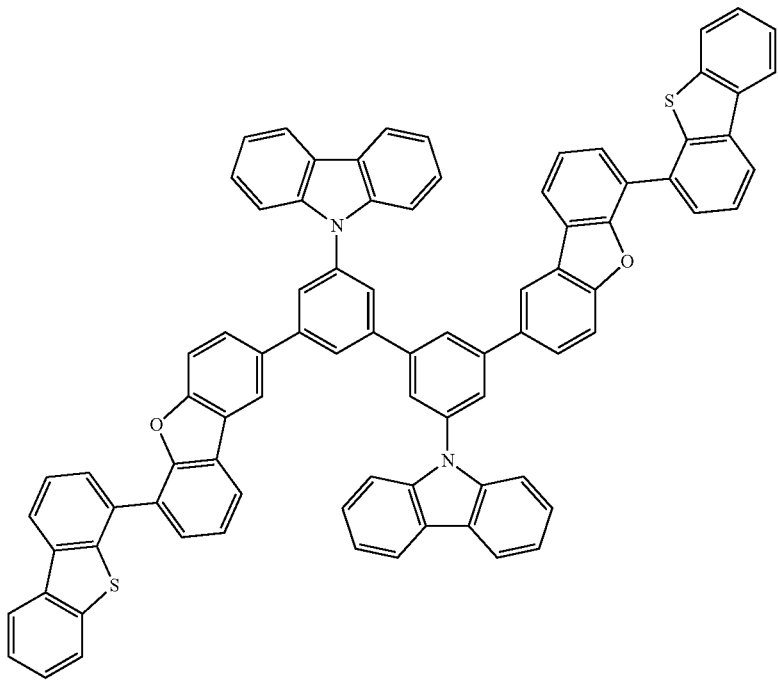
39
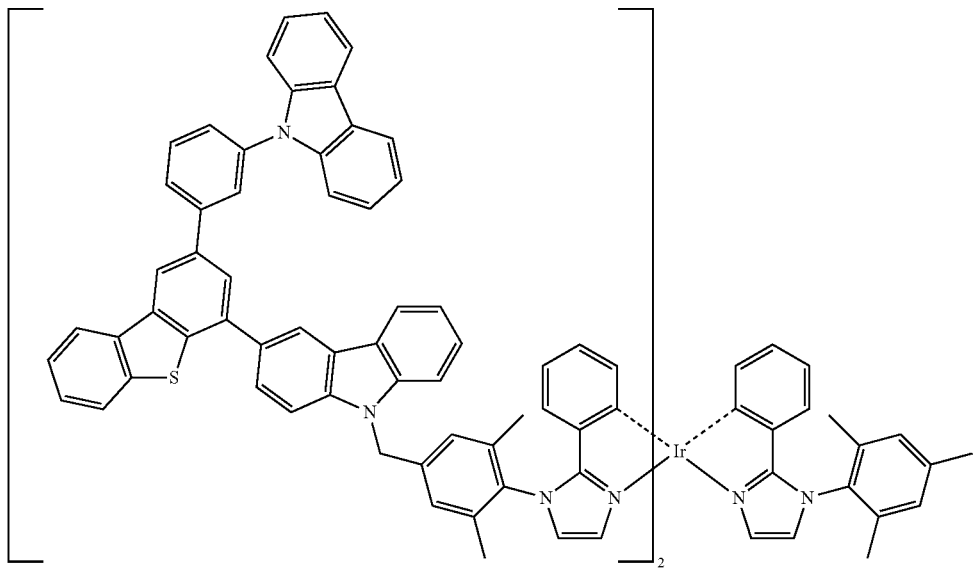
40

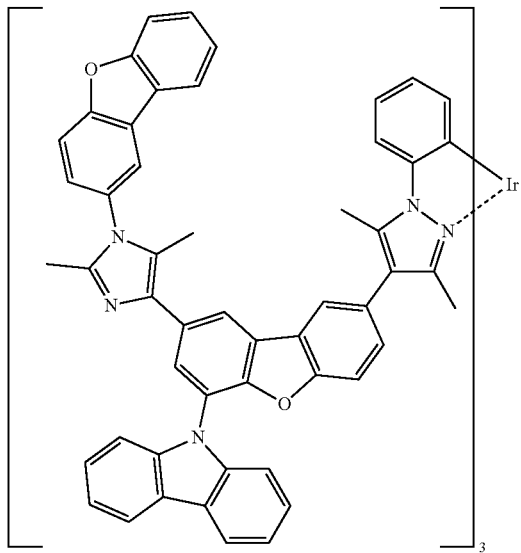
41
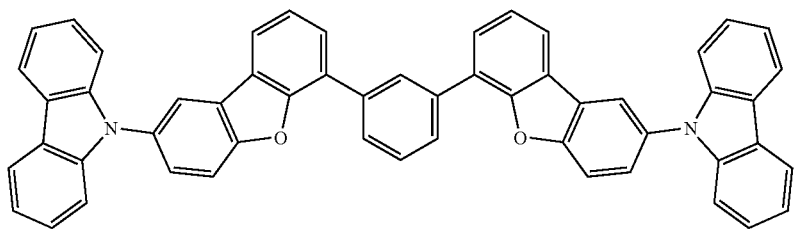
42
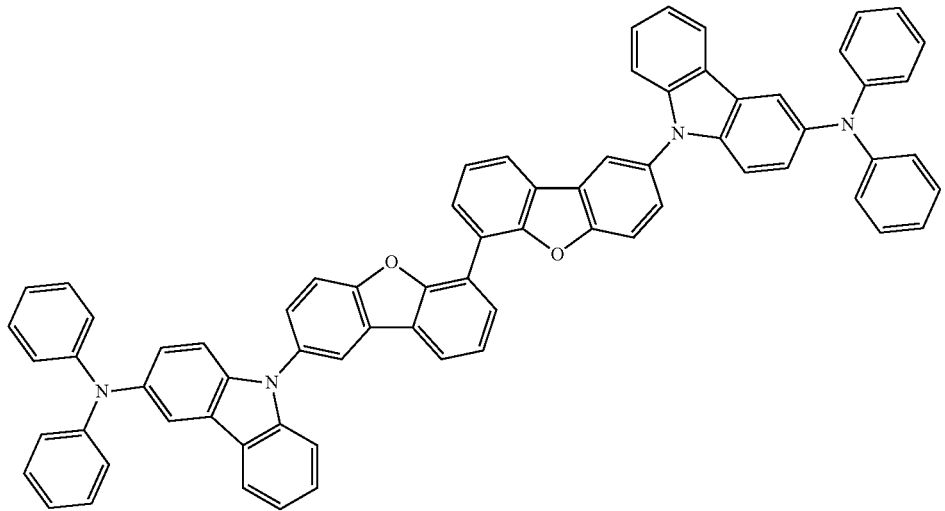
43

44
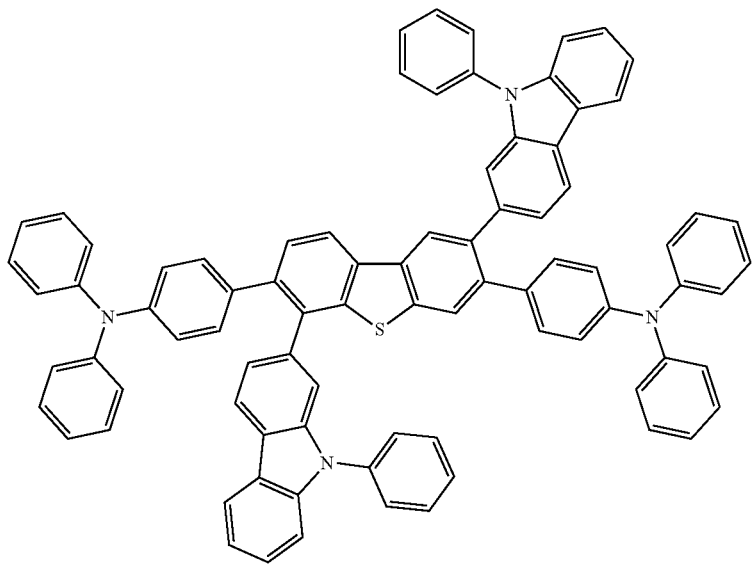
45
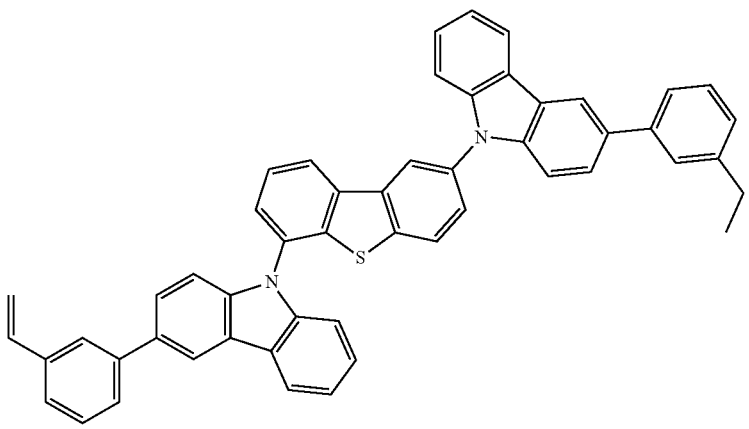
46
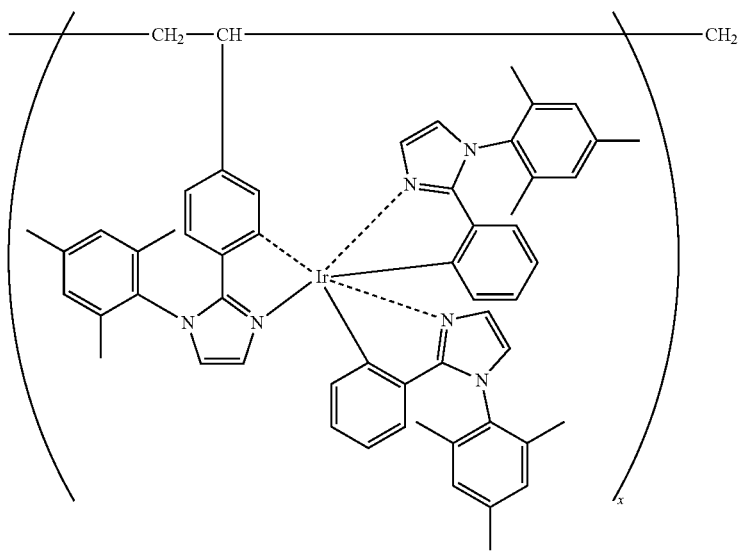

-continued
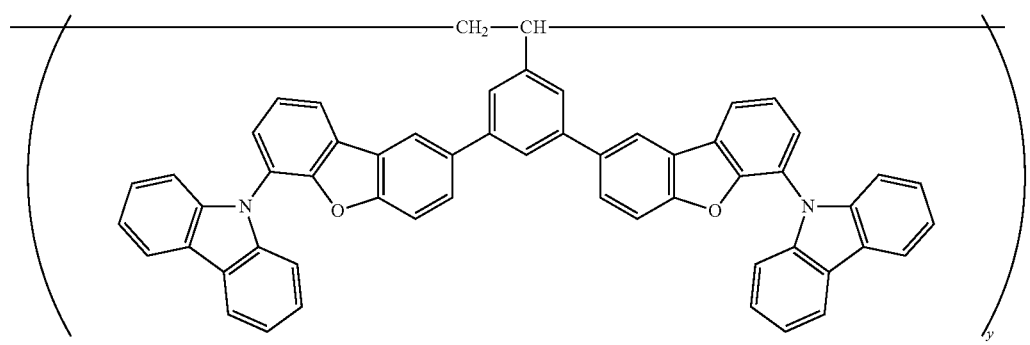
x:y = 1:10
random co-polymer
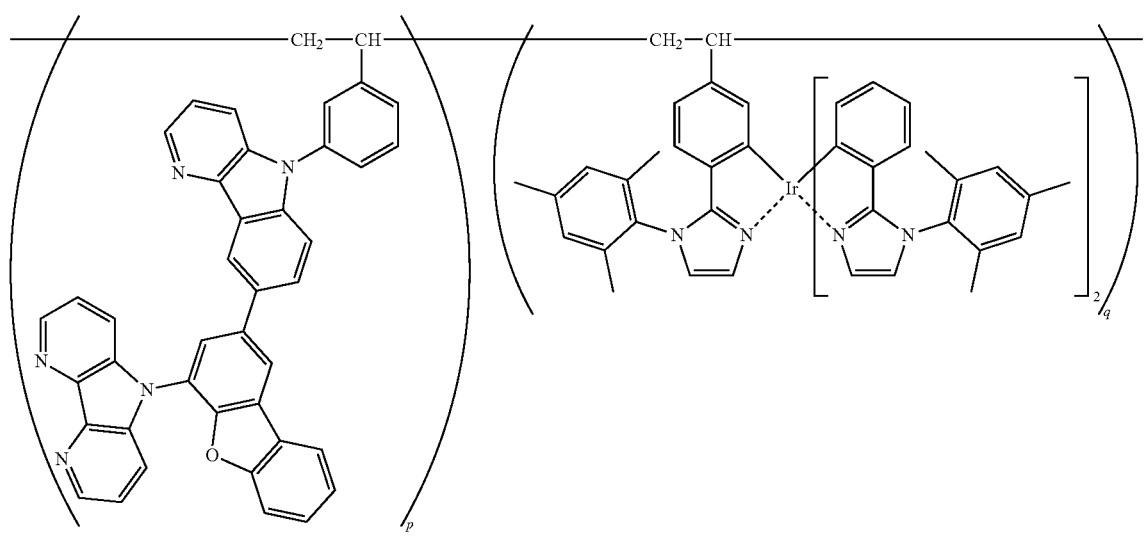
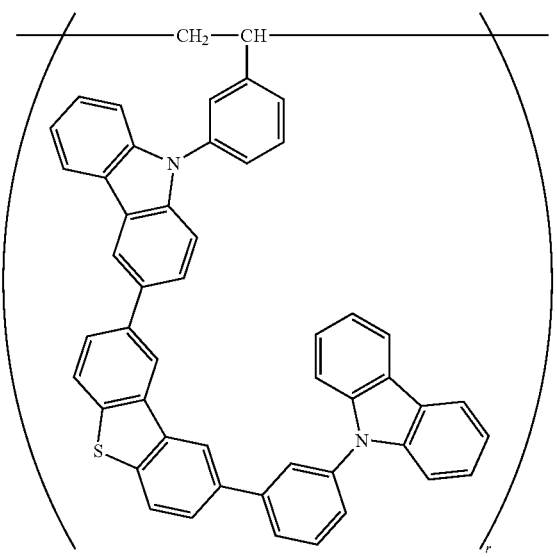

-continued
48
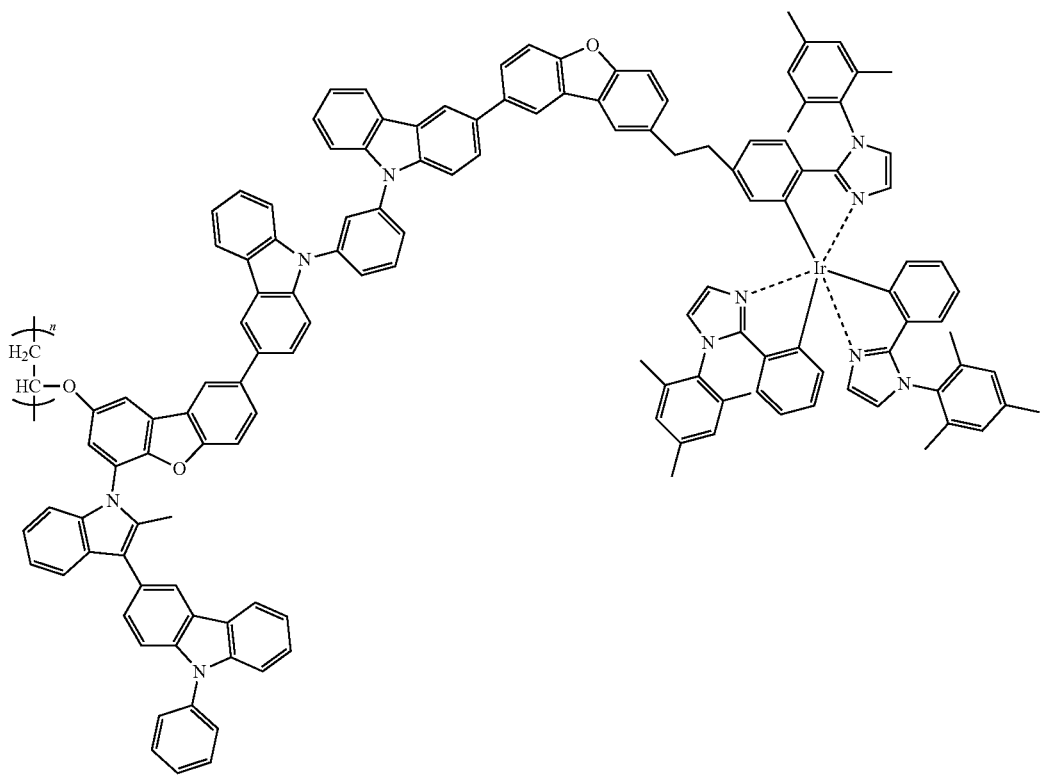
49
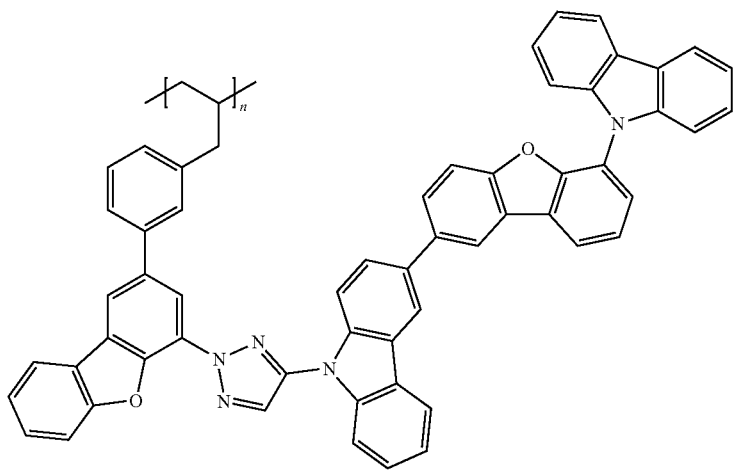
50
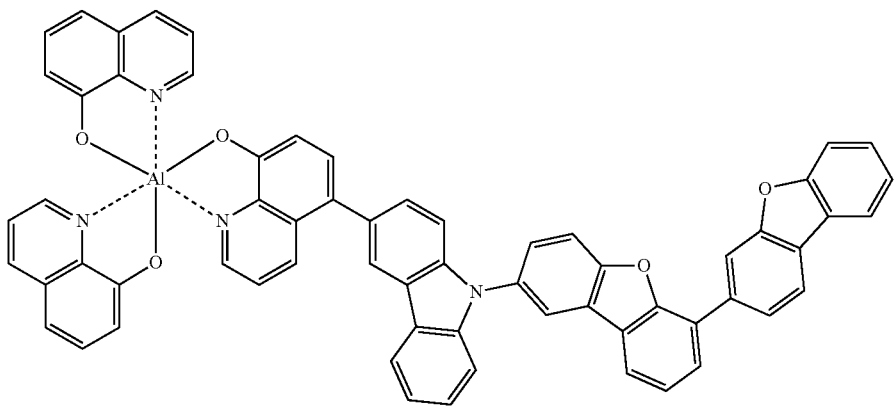

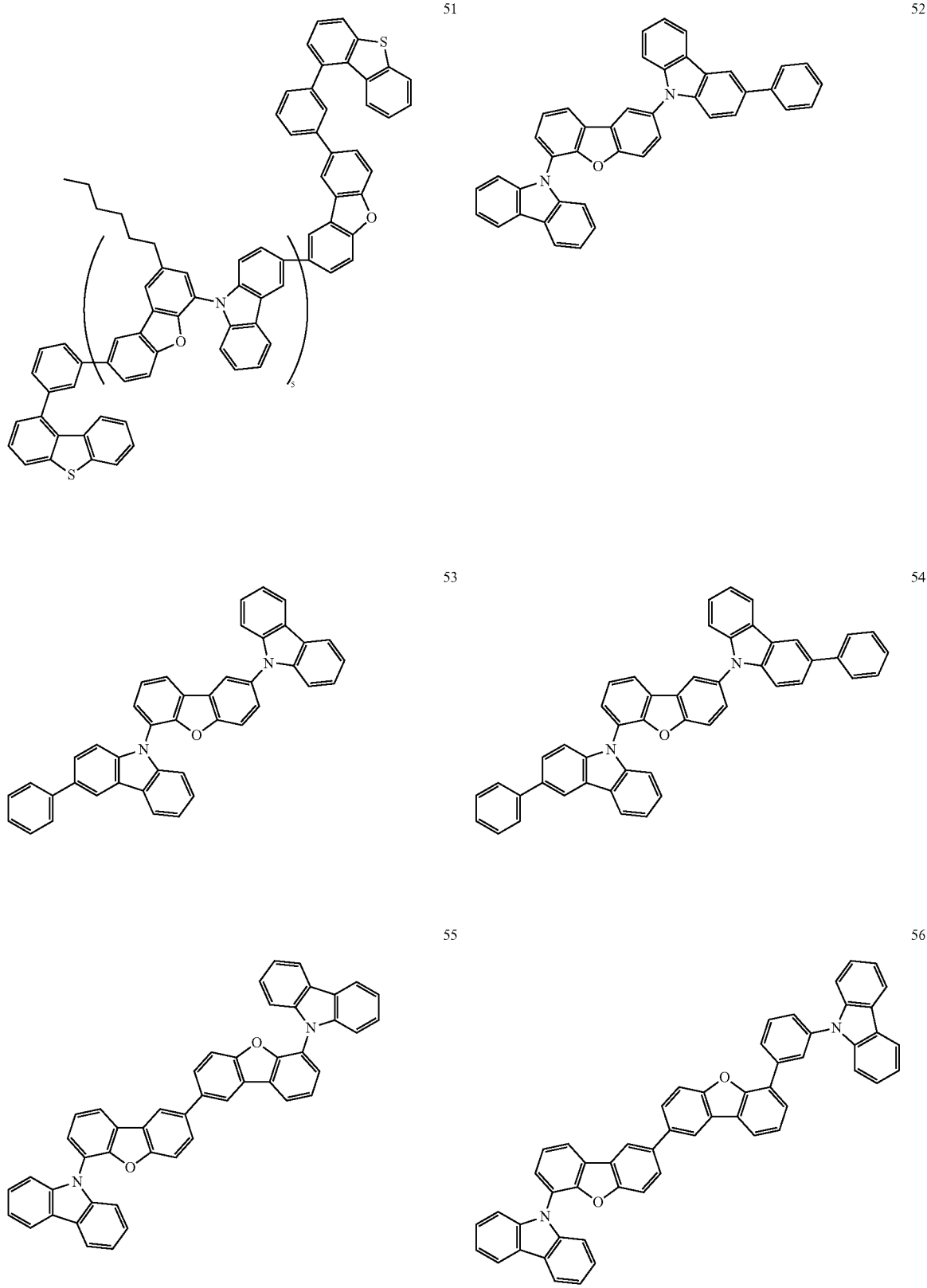

-continued

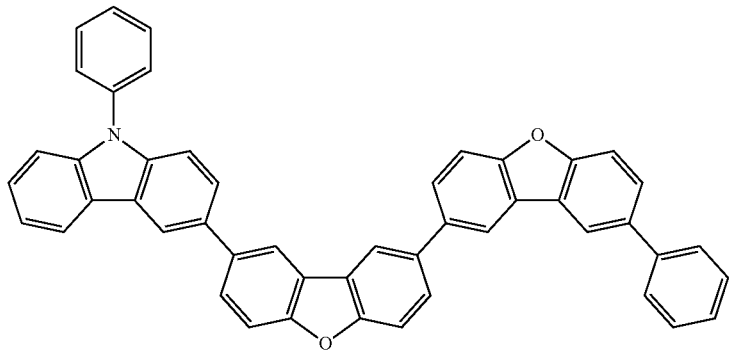

Also, More preferably, a compound represented by the formula (B') are more preferably used as the luminescent host in the luminescent layer of the organic EL device of the present invention.

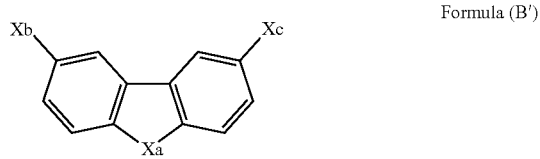
Formula (B')

In the formula (B'), Xa represents O or S; each of Xb and Xc independently represents a substituent or a group represented by the formula (C') below. At least one of Xb and Xc is represented by the formula (C') below, and at least one of the groups represented by the formula (C') has a carbazolyl group for Ar.

$$Ar\text{-}(L_2)_n\text{-}*$$ Formula (C')

In the formula (C'), $L_2$ represents a divalent linking group derived from an aromatic hydrocarbon ring or aromatic heterocycle. n represents an integer of 0 or 1 to 3, and if n is 2 or larger, a plurality of $(L_2)$s are the same or different. * represents a position of linkage with the structure represented by the formula (B'). Ar represents a group represented by the formula (D') below.

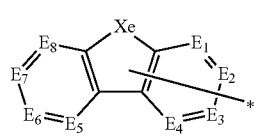
Formula (D')

In the formula (D'), Xe represents N(R''), O or S, each of $E_1$ to $E_8$ represents $C(R''_1)$ or N. R'' and $R''_1$ represent a hydrogen atom, substituent or a position of linkage with $L_2$. * represents a position of linkage with $L_2$.

In the compound represented by the formula (B'), at least one of Xb and Xc are preferably represented by the formula (C'). More preferably, Ar in the formula (C') represents a carbazolyl group which may have a substituent. Still more preferably, Ar in the formula (C') represents a carbazolyl group which may have a substituent, and is linked at the N position to $L_4$.

In addition to the above OC-9, OC-11, OC-12, OC-14, OC-18, OC-29, OC-39, OC-31, and OC-32 recited as specific examples of the luminescent host, further examples of the specific compound represented by the formula (B'), preferably adoptable as the luminescent host are shown below, without restricting the present invention.

《Electron Transport Layer》

The electron transport layer is composed of a material having a function of transporting electrons therethrough, so that also an electron injection layer and a hole blocking layer are included in the electron transport layer in a broad sense. The electron transport layer is provided in the form of a single layer, or in the form of a plurality of layers.

The electron transport layer may be good enough if it function to transmit electrons which are injected from the cathode to the luminescent layer. Materials for composing the electron transport layer may be selected arbitrarily from publicly-known compounds singly or in combinations thereof.

The publicly-known materials for composing the electron transport layer (referred to as "electron transport material", hereinafter) include nitro-substituted fluorene derivative, diphenylquinone derivative, thiopyrane dioxide derivative, polycyclic aromatic hydrocarbon such as naphthalene or perylene, heterocyclic tetracarboxylic anhydrides, carobodiimide, fluorenylidene methane derivative, anthraquinone dimethane and anthrone derivatives, oxadiazole derivative, carboline derivative, or, derivative having a ring structure in which at least one carbon atom of the hydrocarbon ring composing the carboline ring of the carboline derivative is replaced by nitrogen atom(s), and hexaazatriphenylene derivative.

Moreover, also thiadiazole derivative having a structure in which the oxygen atom in the oxadiazole ring of the above-described oxadiazole derivative is replaced by a sulfur atom, and, quinoxaline derivative having a quinoxaline ring, known as an electron attractive group, is used as the electron transport material.

Also polymer materials having these materials introduced into the side chains thereof, or in the principal chain thereof, is adoptable.

Also metal complexes of 8-quinolinol derivative, such as tris(8-quinolinol) aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq); and metal complexes in which the central metals of these metal complexes are replaced by In, Mg, Cu, Ca, Sn, Ga or Pb; is used as the electron transport material.

Beside these, also metal-free or metal phthalocyanine, or those having an alkyl group or sulfonic acid group substituted at the terminals thereof, is used as the electron transport material.

Also inorganic semiconductors such as n-type Si and n-type SiC is used as the electron transport material.

The electron transport layer is formed preferably using the electron transport material so as to give a film form, typically by vacuum deposition, wet process such as spin coating, casting, die coating, blade coating, roll coating, ink jet process, printing, spray coating, curtain coating, and LB (Langmuir-Blodgett) process, and so forth.

Method of forming the constitutive layers of the organic EL device will be detailed in later paragraphs regarding the organic EL device.

While thickness of the electron transport layer is not specifically limited, it is generally adjusted to 5 nm to 5000 nm or around, and preferably 5 nm to 200 nm. The electron transport layer may have a single-layered structure composed of a single or more species of the above-described materials.

The electron transport layer may be doped with a metal compound such as metal complex or metal halide, serving as an n-type dopant.

Now, specific examples of publicly-known compounds (electron transport materials) preferably used for forming the electron transport layer of the white-light organic EL device according to the present invention will be enumerated below, without restricting the present invention.

ET-1

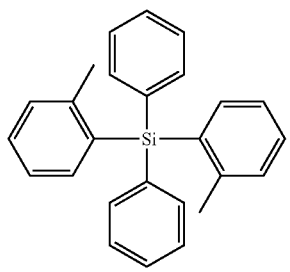

ET-2 (BCP)

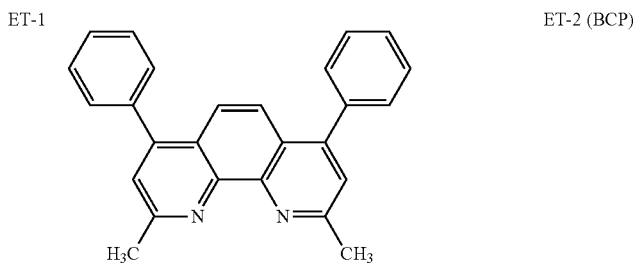

ET-3 (PBD)

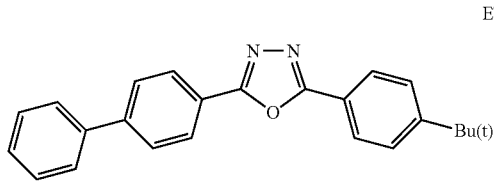

ET-4

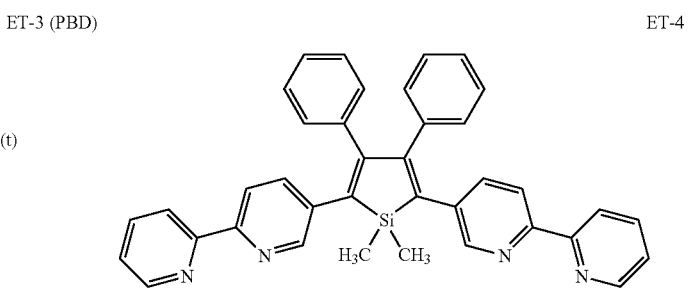

ET-5

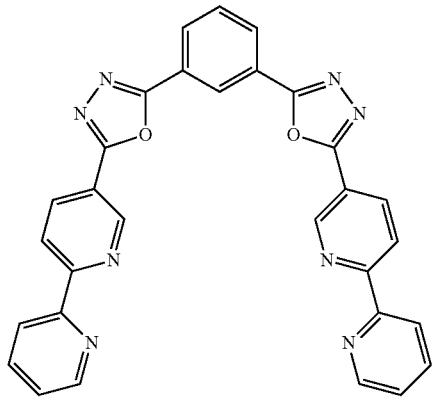

ET-6

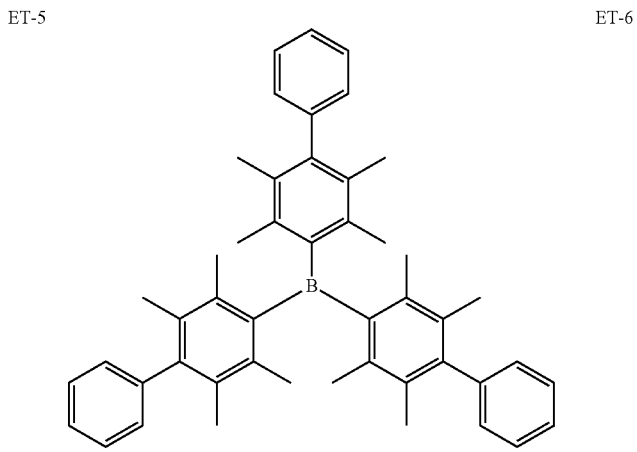

-continued
ET-7 (Alq₃)
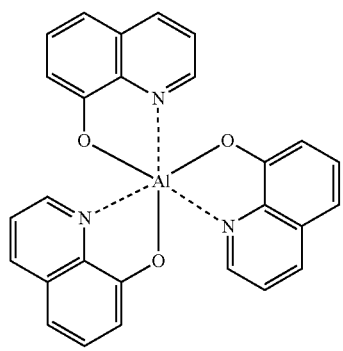
ET-8 (BAlq)
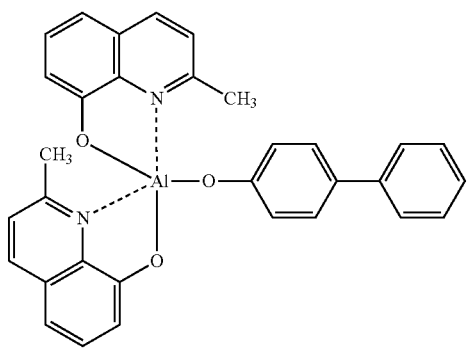
ET-9
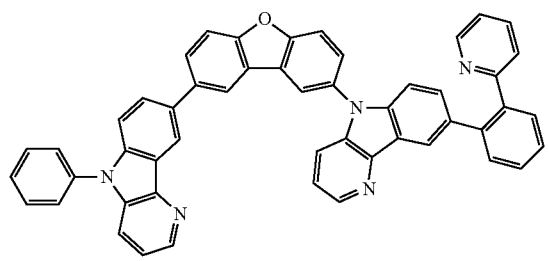
ET-10
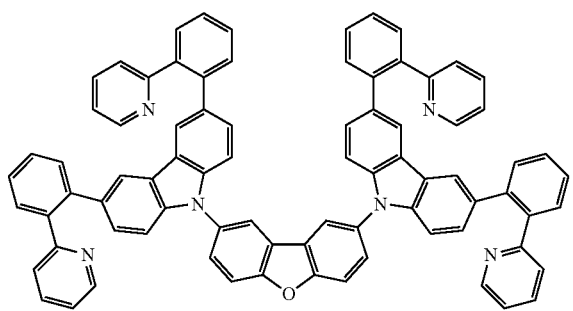
ET-11
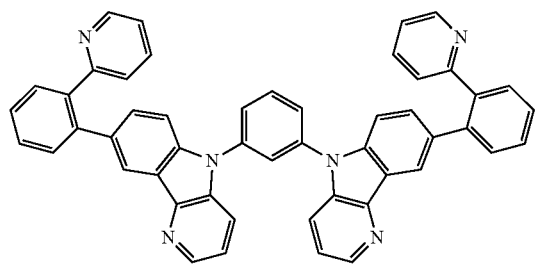
ET-12
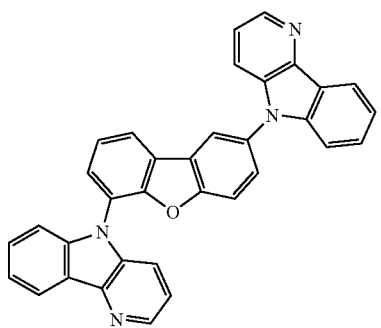
ET-13
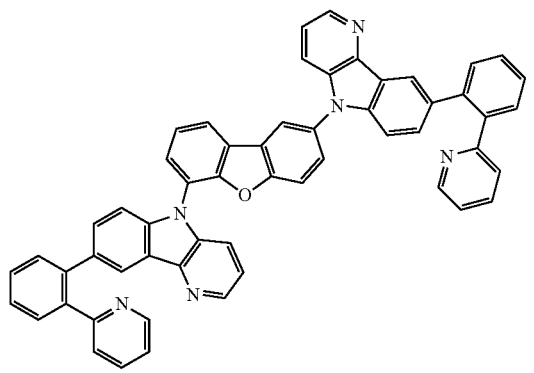
ET-14
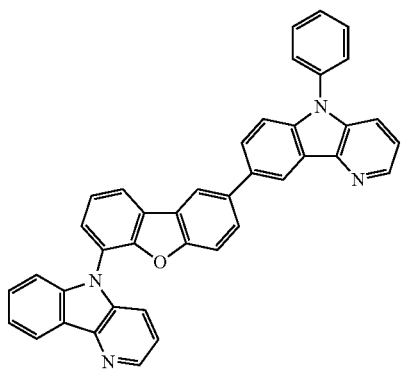

-continued
ET-15
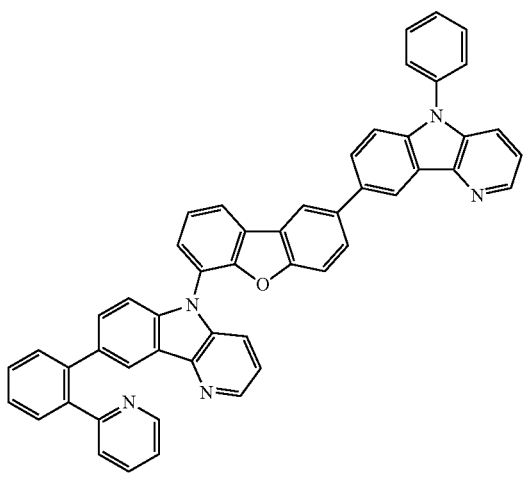
ET-16
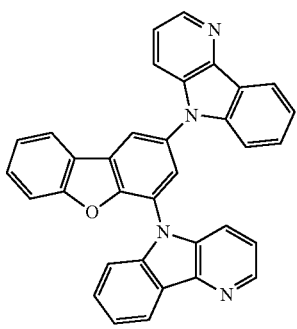
ET-17
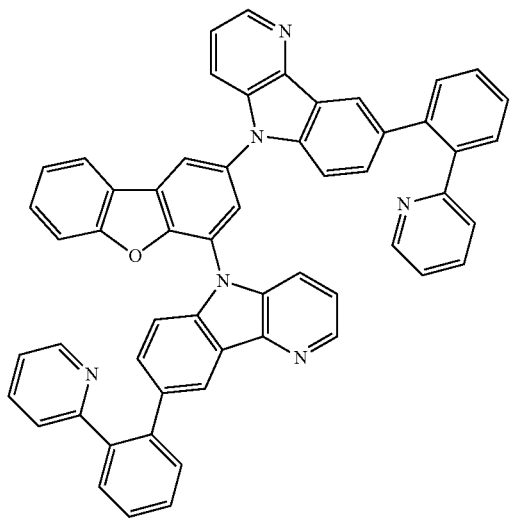
ET-18
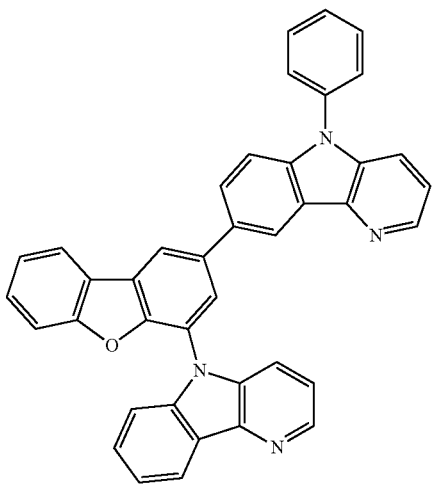
ET-19
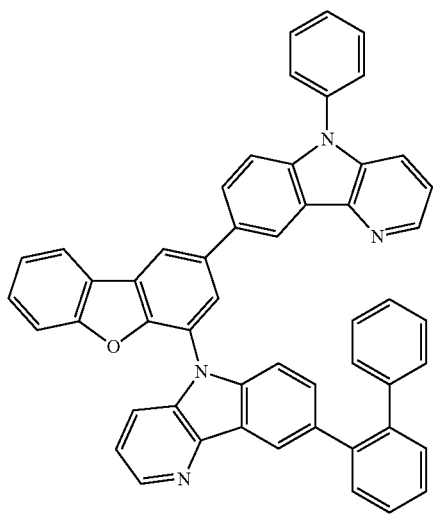
ET-20
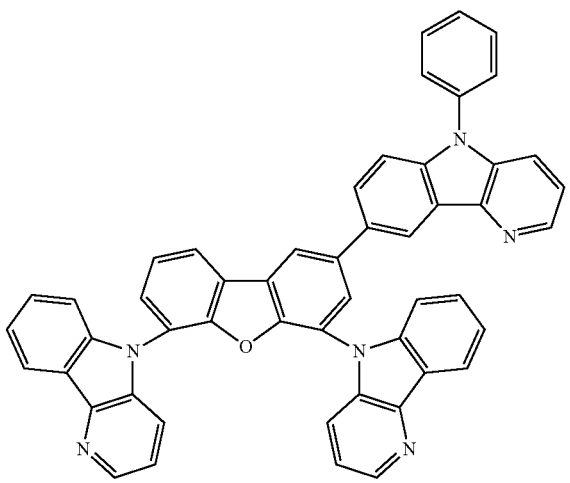

ET-21
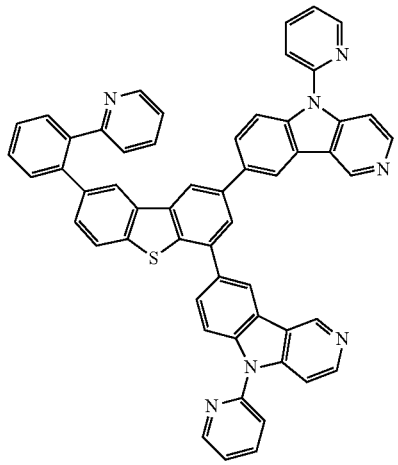
ET-22
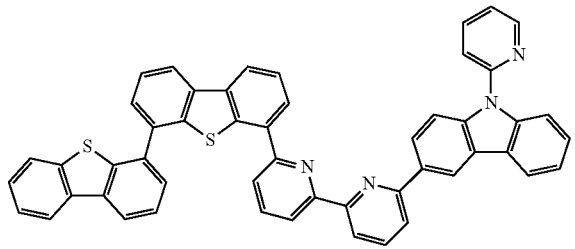
ET-23
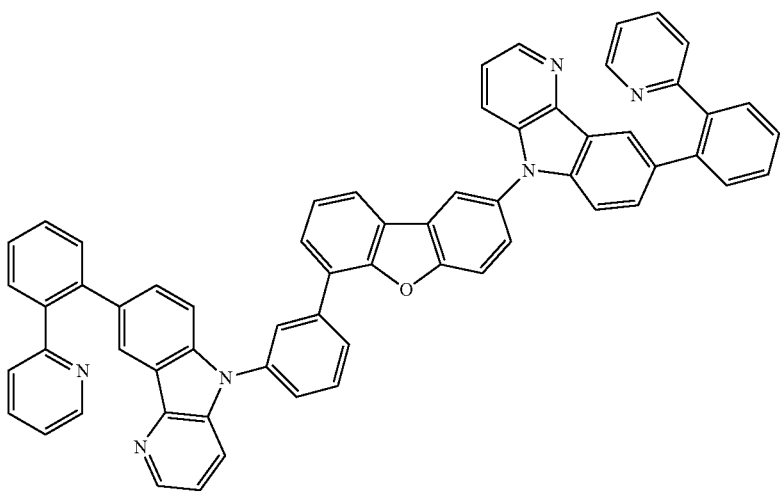
ET-24
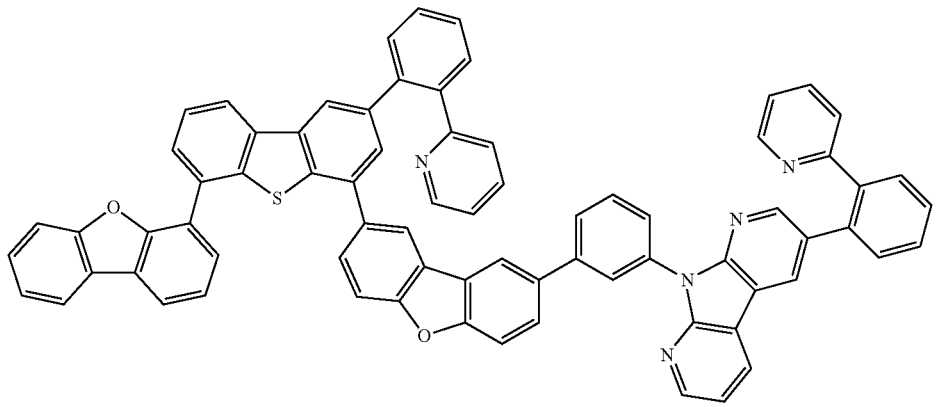

-continued
ET-25
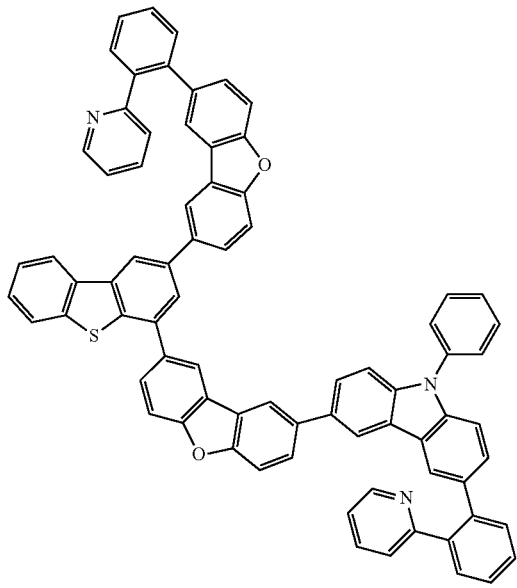
ET-26
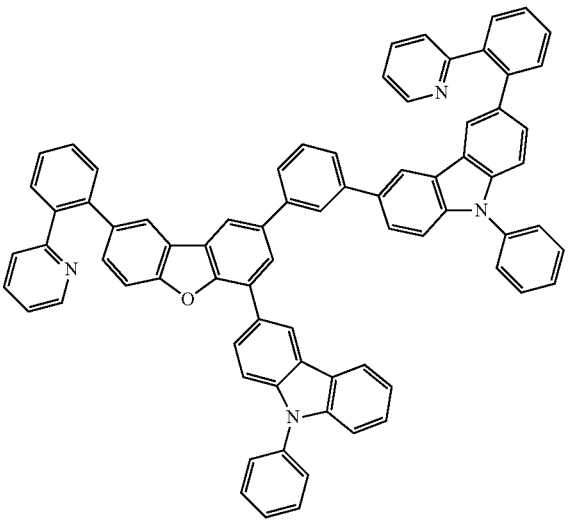
ET-27
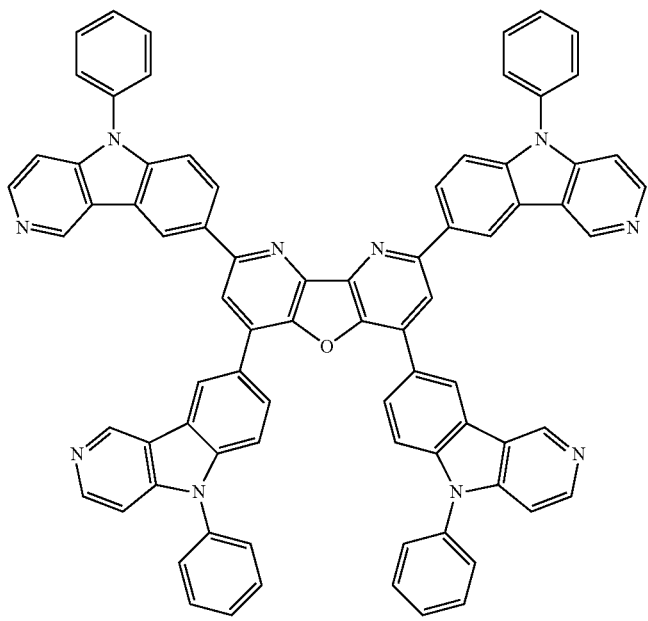
ET-28
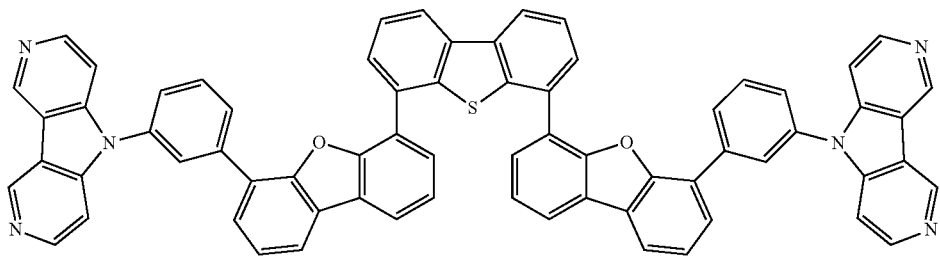

ET-29
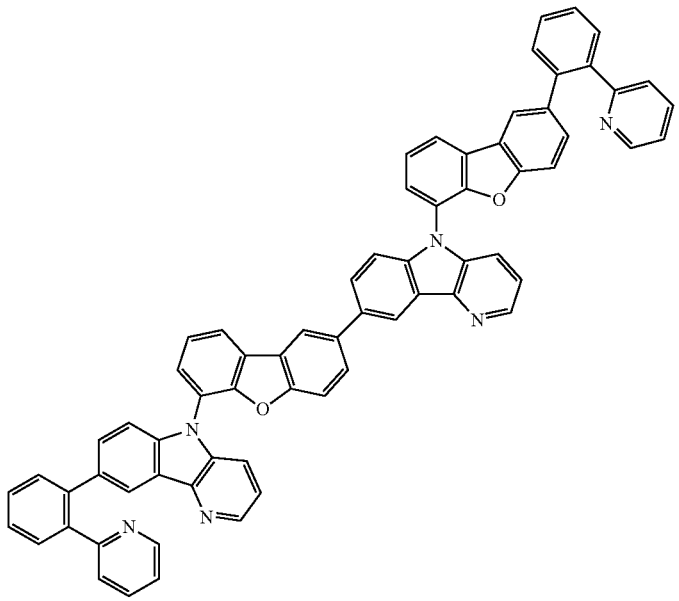
ET-30
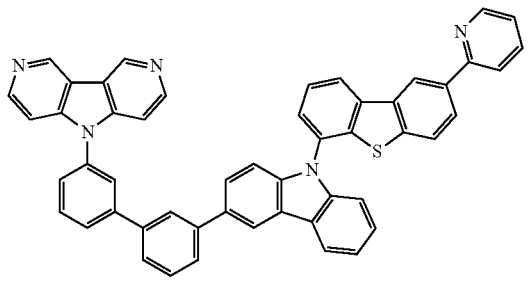
ET-31
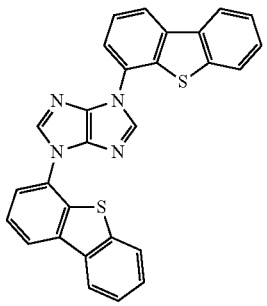
ET-32
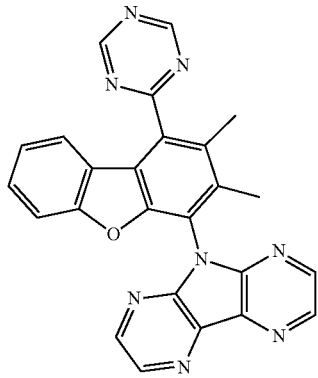
ET-33
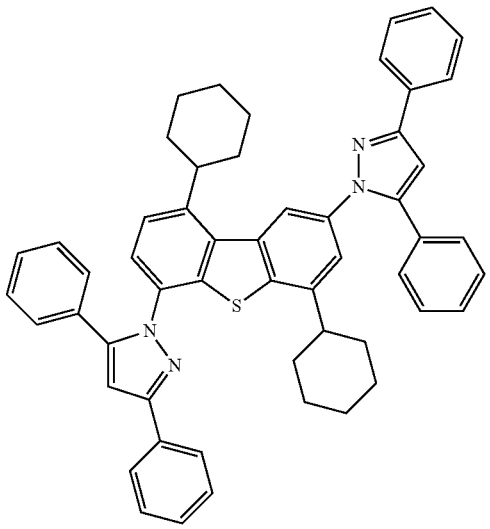

ET-34
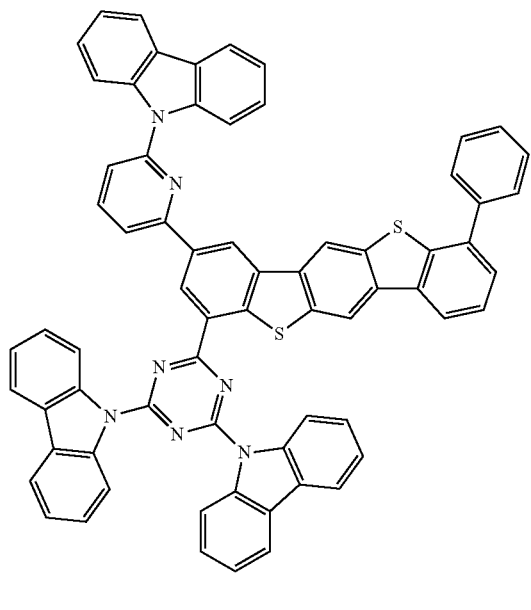
ET-35
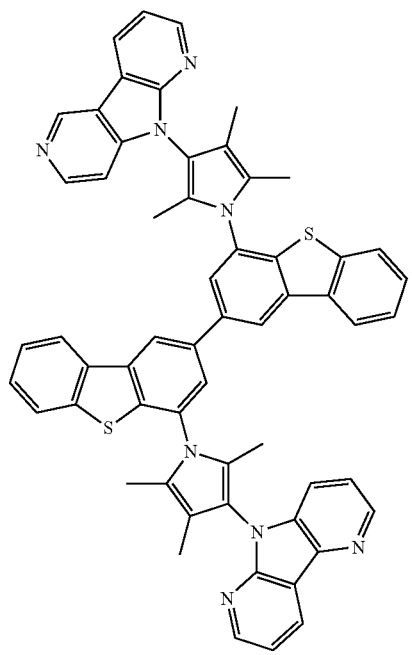
ET-36
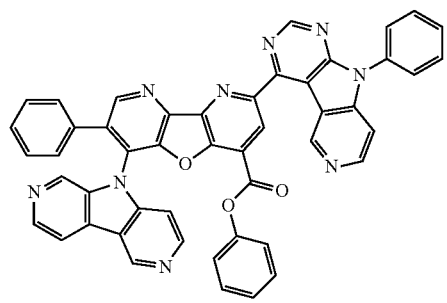
ET-37
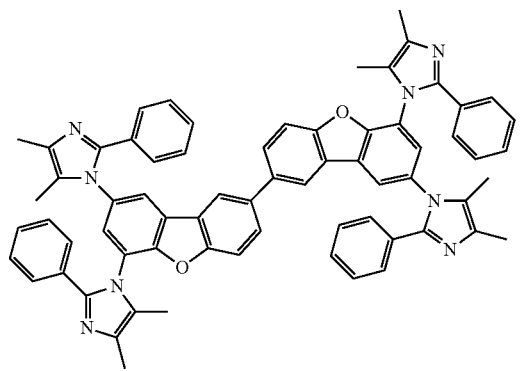

ET-38
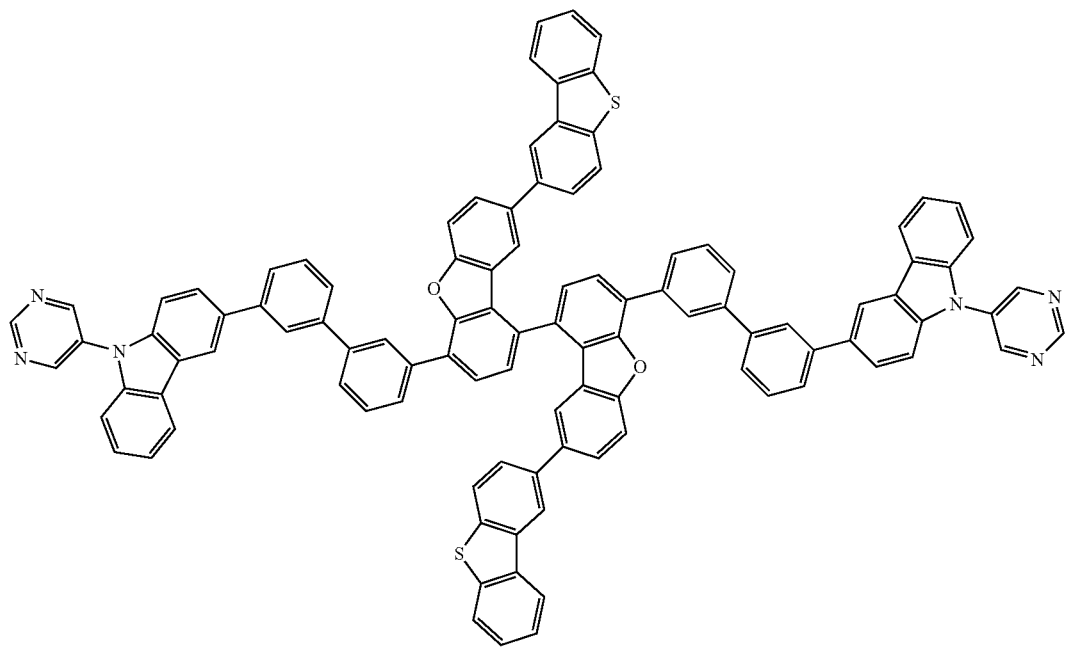
ET-39
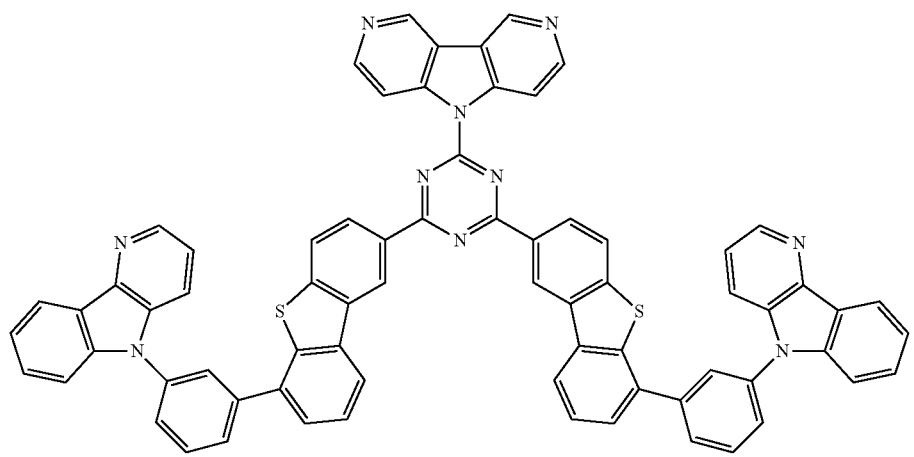
ET-40
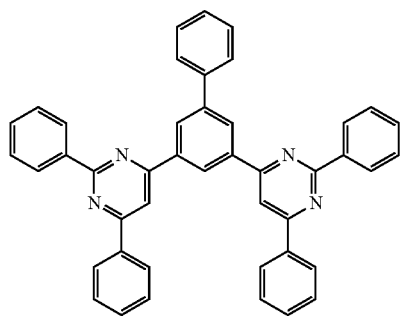
ET-41
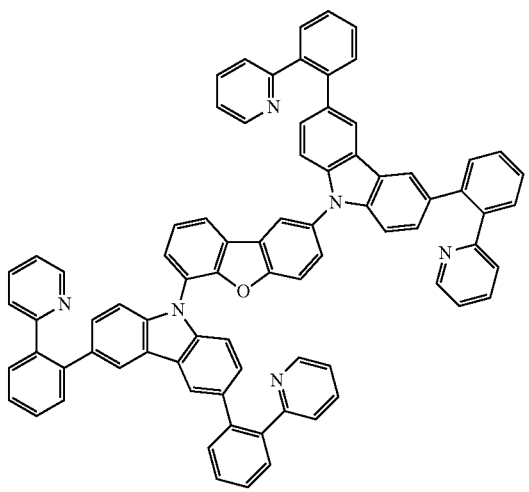

ET-42

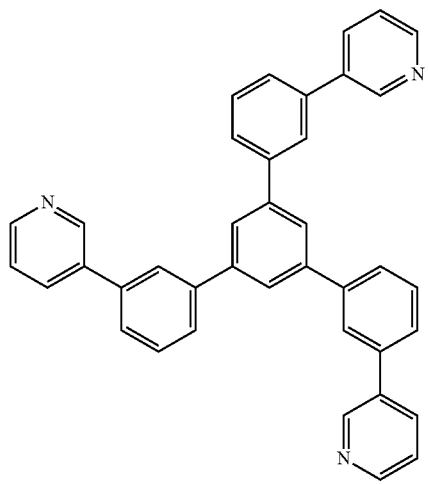

ET-43

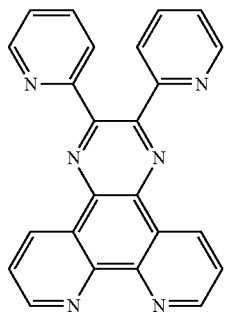

《Cathode》

On the other hand, the cathode can use metals having small values of work function (4 eV or less) (referred to as "electron injective metals"), alloys, electro-conductive compounds or mixtures thereof as an electrode material. Specific examples of the electrode materials include sodium, sodium-potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare earth metals.

Among these, from the viewpoint of electron injecting performance and durability against oxidation and so forth, mixtures of electron injective metal and secondary stable metals having larger values of work function are preferable, which are exemplified by magnesium/silver mixture, magnesium/aluminum mixture, magnesium/indium mixture, aluminum/aluminum oxide ($Al_2O_3$) mixture, and lithium/aluminum mixture.

The cathode is manufactured by making films of these electrode materials, by methods such as vacuum deposition, sputtering and so forth. Preferably, sheet resistance of the cathode is adjusted within the range from several hundreds of ohms per square or less, and thickness of the film is generally adjusted within the range from 10 nm to 5 μm, and preferably from 50 nm to 200 nm. In view of improving the luminance of the organic EL device, either one of the anode and cathode is preferably transparent or semi-transparent so as to allow the emitted light to transmit therethrough.

The transparent or semi-transparent cathode may be manufactured by forming a film of the above-described metal having a thickness of 1 nm to 20 nm, and by forming thereon a layer of electroconductive transparent material described later in conjunction with the anode. By applying such cathode, a device having both of the anode and cathode to ensure transmissivity of light may be manufactured.

《Injection Layer: Electron Injection Layer (Cathode Buffer Layer), Hole Injection Layer (Anode Buffer Layer)》

The injection layer may be provided as occasion demands, and is available both in the electron injection layer and the hole injection layer. As described in the above, the hole injection layer may be provided between the anode and the luminescent layer or the hole transport layer. The electron injection layer may be provided between the cathode and the luminescent layer or the electron transport layer.

The injection layer refers to a layer provided between the electrode and the organic layer, aiming at reducing the drive voltage and improving the luminance, as detailed in "Yuki EL Soshi to Sono Kogyoka Saizensen (The Front Line of Organic EL devices and Engineering (Nov. 30, 1998, published by NTS, Inc.)", Volume 2, Chapter 2 "Denkyoku Zairyo (Electrode Materials)", p. 123-166), in Japanese. The injection layer may be classified into hole injection layer (anode buffer layer) and electron injection layer (cathode buffer layer).

The anode buffer layer (hole injection layer) is detailed in Japanese Laid-Open Patent Publication Nos. H09-45479, H09-260062, H08-288069 and so forth. Specific examples of the anode buffer layers include phthalocyanine represented by copper phthalocyanine; hexaazatriphenylene derivative as described in Japanese Translation of PCT application Publication No. 2003-519432 (WO01/049806) and Japanese Laid-Open Patent Publication No. 2006-135145; oxide represented by vanadium oxide; amorphous carbon; or electroconductive polymers such as polyaniline (emeraldine), polythiophene; ortho-metalated iridium complex represented by tris(2-phenyl pyridine) iridium complex; or the like.

The cathode buffer layer (electron injection layer) is detailed in Japanese Laid-Open Patent Publication Nos. H06-325871, H09-17574, H10-74586 and so froth. Specific examples of the cathode buffer layers include metals represented by strontium and aluminum; alkali metal compounds represented by lithium fluoride and potassium fluoride; alkali earth metal compounds represented by magnesium fluoride and cesium fluoride; and oxides represented by aluminum oxide. The buffer layer (injection layer) is preferably an extremely thin film, having a thickness in the range from 0.1 nm to 5 μm, depending on nature of the material.

《Blocking Layer: Hole Blocking Layer, Electron Blocking Layer》

The blocking layer is provided besides the basic constitutive layers of the organic compound, as described in the above as occasion demands. Known examples include those described in Japanese Laid-Open Patent Publication Nos. H11-204258 and H11-204359, and hole blocking layer described in "Yuki EL Soshi to Sono Kogyoka Saizensen (The Front Line of Organic EL devices and Engineering (Nov. 30, 1998, published by NTS Inc.)", Volume 2, Chapter 2 "Denkyoku Zairyo (Electrode Materials)", p. 237), in Japanese.

The hole blocking layer in a broad sense has a function of an electron transport layer. The hole blocking layer is composed of a hole blocking material in particular having an extremely limited performance of transporting holes, while ensuring a function of transporting electrons therethrough. It can improve probability of recombination of electrons and holes, by ensuring transport of electrons while blocking holes.

Also the above-described configuration of the electron transport layer is adopted to the hole blocking layer according to the present invention, as occasion demands.

The hole blocking layer of the organic EL device of the present invention is preferably provided in adjacent to the luminescent layer.

The hole blocking layer preferably contains carbazole derivative, carboline derivative, or diazacarbazole derivative (the diazacarbazole derivative herein means a compound in which any one of the carbon atoms composing the carboline ring is replaced by a nitrogen atom), enumerated in the above as the host compound.

For the case where a plurality of luminescent layers having different luminescent colors are used in the present invention, it is preferable to dispose the luminescent layer having the shortest peak emission wavelength (the shortest-wavelength layer) nearest to the anode than any other luminescent layers. In this case, it is preferable to additionally dispose a hole blocking layer between such shortest-wavelength layer and the luminescent layer second nearest to the anode. In addition, 50% by mass or more of compound contained in the hole blocking layer provided at such position preferably has an ionization potential larger by 0.3 eV or more than that of the host compound in the shortest-wavelength layer.

The ionization potential is defined as an energy necessary for releasing an electron at the HOMO (highest occupied molecular orbital) level of the compound into vacuum level, and is determined typically according to the method described below.

(1) The ionization potential is given a value (eV-converted value) obtained by structural optimization using a keyword "B3LYP/6-31G*" in Gaussian 98 (Gaussian 98, Revision A.11.4, M. J. Frisch et al., Gaussian, Inc., Pittsburgh Pa., 2002.), which is molecular orbital calculation software available from Gaussian, Inc, USA. Validity of the technique is backed by a high level of correlation between the calculated values obtained by the technique and experimental values.

(2) The ionization potential is determined also by direct measurement based on photo-electron spectroscopy. For example, a low-energy electron spectrometer "Model AC-1" from Riken Keiki Co., Ltd., or a technique known as UV photo-electron spectroscopy is used preferably.

On the other hand, the electron blocking layer in a broad sense has a function as a hole transport layer. The electron blocking layer is composed of a material having an extremely limited performance of transporting electrons, while ensuring a function of transporting holes therethrough. It can improve probability of recombination of electrons and holes, by ensuring transport of holes while blocking electrons.

Alternatively, a configuration of the hole transport layer described later is used as the electron blocking layer depending on needs. Thickness of each of the hole blocking layer and the electron transport layer in the present invention is preferably 3 nm to 100 nm, and more preferably 5 nm to 30 nm.

《Hole Transport Layer》

The hole transport layer is composed of a hole transport material having a function of transporting holes therethrough. Also a hole injection layer and an electron blocking layer are included in the hole transport layer in a broad sense. The hole transport layer is provided in the form of a single layer, or in the form of a plurality of layers.

The hole transport material has either one of properties of hole injection or transport, and electron barrier. The hole transport material may be an organic material or may be an inorganic material, which are exemplified by triazol derivative, oxadiazole derivative, imidazole derivative, polyarylalkane derivative, pyrazoline derivative and pyrazolone derivative, phenylene diamine derivative, arylamine derivative, amino-substituted chalcone derivative, oxazole derivative, styrylanthracene derivative, fluorenone derivative, hydrazone derivative, stilbene derivative, silazane derivative, aniline-based copolymer, or electroconductive oligomer, in particular, thiophene oligomer.

Moreover, the hole transport material may be azatriphenylene derivative described in Japanese Translation of PCT application Publication No. 2003-519432 (WO01/049806) and Japanese Laid-Open Patent Publication No. 2006-135145.

While any of the compounds enumerated in the above may be used as the hole transport material, it is preferable to use porphyrin compound, aromatic tertiary amine compound and styrylamine compound, wherein the aromatic tertiary amine compound is particularly preferable.

Representative examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; 4,4'-bis[N-(1-naphthyl)-N-phenylamino]biphenyl (NPD), described in the U.S. Pat. No. 5,061,569, having two condensed aromatic rings in one molecule; and 4,4',4"-tris[N-(3-methylphenyl)-N-phenylamino]triphenylamine (MTDATA), described in Japanese Laid-Open Patent Publication No. H04-308688, having three triphenylamine units linked to give a starburst geometry.

In addition, also polymer materials having these materials introduced into the side chains thereof or in the principal chain thereof are adoptable.

Also inorganic compounds such as p-type Si and p-type SiC may be used as a hole injection material, or as a hole transport material.

Also so-called, p-type hole transport material, such as described typically in Japanese Laid-Open Patent Publication No. H11-251067, and a literature by J. Huang et al. (Applied Physics Letters 80 (2002), p. 139), may be used. In the present invention, these materials may preferably be used expecting that more efficient luminescent device may be obtained.

The hole transport layer may be formed by making a film of the above-described hole transport material, by publicly-known methods such as vacuum deposition, spin coating, casting, printing including ink jet process, and LB process.

While thickness of the hole transport layer is not specifically limited, it is generally adjusted to 5 nm to 5 μm or around, and preferably 5 nm to 200 nm. The hole transport layer may have a single-layered structure composed of a single or more species, of the above-described materials.

Also a hole transport layer doped with an impurity to enhance the p-type conductivity may be used. Specific examples include those described in Japanese Laid-Open Patent Publication Nos. H04-297076, 2000-196140, 2001-102175, and J. Appl. Phys., 95, 5773 (2004).

In the present invention, the above-described hole transport layer having a large p-type conductivity is preferably used, in view of manufacturing the device further suppressed in the power consumption.

≪Anode≫

The anode of the organic EL device preferably used herein employs metal, alloy, electroconductive compound, and mixtures thereof, having large values of work function (4 eV or above), as the electrode material. Specific examples of the electrode material include metals such as Au; and electroconductive transparent materials such as CuI, indium tin oxide (ITO), $SnO_2$, and ZnO.

Also a material composing an amorphous transparent electroconductive film, such as IDIXO ($In_2O_3$—ZnO), may be used. The anode may be formed by forming a film of the electrode material by a method such as vacuum deposition or sputtering, and then by patterning the film to obtain a predetermined geometry by photolithography. If a necessary level of accuracy of pattern is not so high (approximately 100 μm or larger), the pattern may be formed by vacuum deposition or sputtering of the electrode material using a mask having a desired geometry.

Alternatively, for the case where coatable materials such as organic electroconductive compound are used, also wet processes such as printing and coating may be used. For the case where luminescence is extracted through the anode, the anode preferably has a transmissivity of 10% or larger, and a sheet resistance of several hundreds of ohms per square or less. The thickness is selected generally in the range from 10 nm to 1000 nm, and preferably from 10 nm to 200 nm, depending on material species.

≪Support Substrate≫

The support substrate adoptable to the organic EL device of the present invention (also referred to as "base", "substrate", "base member", "support" and so forth, hereinafter) may be composed of glass or plastic, without special limitation on the constitutive materials thereof, and also may be transparent or opaque. For the case where light is extracted through the support substrate, the support substrate is preferably transparent. The transparent support substrate preferably used herein may be exemplified by those composed of glass, quartz, and transparent resin film. A particularly preferable support substrate is made of resin film imparting flexibility to the organic EL device.

The resin film may be exemplified by those composed of polyesters such as polyethylene terephthalate (PET) and polyethylene naphthalate (PEN); polyethylene; polypropylene; cellulose esters such as cellophane, cellulose diacetate, cellulose triacetate, cellulose acetate butyrate, cellulose acetate propionate (CAP), cellulose acetate phthalate (TAC) and cellulose nitrate, or derivative thereof; polyvinylidene chloride; polyvinyl alcohol; polyethylenevinyl alcohol; syndiotactic polystyrene; polycarbonate; norbornene resin; polymethylpentene; polyetherketone; polyimide; polyethersulfone (PES); polyphenylene sulfide; polysulfone; polyetherimide; polyetherketoneimide; polyamide; fluorine-containing resin; nylon; polymethyl methacrylate; acryl or polyarylates; and cycloolefin-based resins such as Arton (trade name, available from JSR Corporation) or Apel (trade name, available from Mitsui Chemicals, Inc.).

The resin film may have a topcoat composed of inorganic or organic material, or a hybrid topcoat composed of the both, formed on the surface thereof. The topcoat is preferably composed of an advanced barrier film having a water vapor permeability (25±0.5° C., (90±2) % RH) of 0.01 $g/(m^2 \cdot 24 \, h)$ or less when measured in compliance with JIS K7129-1992, more preferably has an oxygen permeability of $10^{-3}$ $ml/(m^2 \cdot 24 \, h \cdot atm)$ or less when measured in compliance with JIS K7126-1987, and a water vapor permeability of $10^{-5}$ $g/(m^2 \cdot 24 \, h)$ or less.

Materials for composing the barrier film may be good enough if they can suppress permeation of moisture or oxygen, causative of degradation of the device, and may be exemplified by silicon oxide, silicon dioxide, silicon nitride, and so forth. In addition, for the purpose of improving brittleness of the film, it is preferable to provide a stacked structure of the inorganic and organic layers. While there is no special limitation on the order of stacking of the inorganic layer and the organic layer, it is preferable to alternately stack the both a plural number of times.

Methods of forming the barrier film are not specifically limited, and may be exemplified by vacuum deposition, sputtering, reactive sputtering, molecular beam epitaxy, cluster ion beam deposition, ion plating, plasma-assisted polymerization, atmospheric pressure plasma-assisted polymerization, plasma-assisted CVD, laser-assisted CVD, thermal CVD, and coating. A particularly preferable method is based on the atmospheric pressure plasma-assisted polymerization described in Japanese Laid-Open Patent Publication No. 2004-68143.

The opaque support substrate may be exemplified by metal plates such as those made of aluminum and stainless steel; film; opaque resin substrate; and ceramic substrate.

The organic EL device of the present invention preferably has an external extraction efficiency of light at room temperature of 1% or larger, and more preferably 5% or larger.

Now, the external extraction quantum efficiency is given by the equation below:

External extraction quantum efficiency (%)=[(number of photons emitted out from the organic EL device)/(number of electrons fed to the organic EL device)]×100.

It is also possible to use a hue modifying filter such as color filter, or to use a color conversion filter which converts luminescent color from the organic EL device into multi-color using fluorescent material. For the case where the color conversion filter is used, the organic EL device preferably has a λmax of luminescence of 480 nm or shorter.

≪Method of Manufacturing Organic EL Device≫

As an exemplary method of manufacturing the organic EL device, a method of manufacturing a device having a stack structure of anode/hole injection layer/hole transport layer/luminescent layer/hole blocking layer/electron transport layer/cathode buffer layer (electron injection layer)/cathode, will be explained.

First, on an appropriate base, a film composed of a desired electrode material, such as an anode-forming material, is formed to give a thickness of 1 μm or less, and preferably 10 nm to 200 nm, to thereby manufacture the anode.

Next, further thereon, the organic compound-containing films such as the hole injection layer, the hole transport layer, the luminescent layer, the hole blocking layer, the electron transport layer, and the cathode buffer layer are formed as the constitutive layers of the device.

The film may be formed typically by vacuum deposition, wet process or the like.

The wet process includes spin coating, casting, die coating, blade coating, roll coating, ink jet process, printing, spray coating, curtain coating, and LB process. From the viewpoint of preciseness of film formation and productivity, methods well adaptable to the roll-to-roll system, such as die coating, roll coating, ink jet process, and spray coating, are preferable. Different methods of film formation are adoptable layer-by-layer.

Liquid medium which allows the organic EL material to dissolve or disperse therein includes ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decaline and dodecane; and other organic solvents such as DMF and DMSO.

Methods of dispersion adoptable herein include ultrasonic dispersion, high-shearing-force dispersion and medium-assisted dispersion.

After forming these layers, a cathode is provided thereon by forming a film composed of a cathode-forming material so as to give a thickness of 1 μm or less, preferably 50 to 200 nm. A desired organic EL device is thus obtained.

Alternatively, the order of processes can be inverted so as to make the cathode, the cathode buffer layer, the electron transport layer, the hole blocking layer, the luminescent layer, the hole transport layer, the hole injection layer, and the anode in this order.

Luminescence of the thus-obtained, multi-color display apparatus may be observed by applying a DC voltage of approximately 2 V to 40 V, while setting the polarity of anode to (+) and cathode to (−). Alternatively, AC voltage may be applied. Waveform of AC voltage is arbitrarily selectable.

While the organic EL device of the present invention is preferably manufactured in such a way that all processes from formation of the hole injection layer up to formation of the cathode are allowed to proceed without interrupting evacuation, the organic EL device may alternatively be taken out on the way, and may be subjected to different way of film formation. The process herein is preferably conducted under a dry inert gas atmosphere.

«Sealing»

Methods of sealing adoptable to the present invention may be exemplified by a method of bonding a sealing member, electrodes and a substrate using an adhesive.

The sealing member may be disposed so as to cover the screen area of the organic EL device, and has either geometry of recessed plate or flat plate. Transparency and electrical insulating property are not specifically limited.

Specific examples include glass plate, polymer plate/film, and metal plate/film. In particular, the glass plate may be exemplified by those composed of soda lime glass, barium/strontium-containing glass, lead glass, aluminosilicate glass, borosilicate glass, barium borosilicate glass and quartz.

The polymer plate may be exemplified by those composed of polycarbonate, acryl resin, polyethylene terephthalate, polyether sulfide, and polysulfone.

The metal plate may be exemplified by those composed of a single metal or an alloy of metals selected from the group consisting of stainless steel, iron, copper, aluminum, magnesium, nickel, zinc, chromium, titanium, molybdenum, silicon, germanium and tantalum.

In view of thinning the device, the polymer film and metal film may preferably be used in the present invention.

The polymer film further preferably has an oxygen permeability measured in compliance with JIS K7126-1987 of $1\times10^{-3}$ ml/(m$^2$·24 h·atm) or less, and a water vapor permeability measured in compliance with JIS K7129-1992 (25±0.5° C., 90±2% RH) of $1\times10^{-3}$ g/(m$^2$·24 h) or less.

The sealing member may be processed into a recessed geometry typically by sand blasting or chemical etching.

The adhesive may specifically be exemplified by photo-curable and thermosetting adhesives having reactive vinyl groups such as acrylate-based oligomer, methacrylate-based oligomer; and moisture-curable adhesive such as 2-cyanoacrylate. Also epoxy-based thermosetting adhesives and chemically-curable (two-part type) adhesives may be exemplified. Also hot-melt-type polyamide, polyester and polyolefin may be exemplified. Also cation-assisted, UV-curable epoxy resin adhesive may be exemplified.

The adhesive is preferably those curable in the temperature range from room temperature up to 80° C., since the organic EL device may degrade due to annealing. Alternatively, the adhesive preferably contains a drying agent dispersed therein. The adhesive may be applied to the portion to be sealed by using a commercially-available dispenser, or by printing such as screen printing.

It is also preferable to form an inorganic or organic film as a sealing member, on the outer side of the electrode which opposes with the support substrate while placing the organic layer between the electrode and the support substrate, so as to cover the electrode and the organic layer, while contacting with the support substrate around the organic layer. In this case, materials for composing the film may be good enough if they can suppress permeation of moisture or oxygen causative of degradation of the device, and may be exemplified by silicon oxide, silicon dioxide, silicon nitride, and so forth.

Moreover, for the purpose of improving brittleness of the sealing member, it is preferable to provide a stacked structure of the inorganic and organic films. Methods of forming the films are not specifically limited, and are selectable for example from vacuum deposition, sputtering, reactive sputtering, molecular beam epitaxy, cluster ion beam deposition, ion plating, plasma-assisted polymerization, atmospheric pressure plasma-assisted polymerization, plasma-assisted CVD, laser-assisted CVD, thermal CVD, and coating.

In a gap between the sealing member and the screen area of the organic EL devices, inert gas such as nitrogen or argon in gas phase; or inert liquid such as fluorinated hydrocarbon or silicone oil in liquid phase is preferably injected. The gap may alternatively be kept in vacuo. Still alternatively, a hygroscopic compound may be encapsulated therein.

The hygroscopic compound adoptable herein may be exemplified by metal oxides (sodium oxide, potassium oxide, calcium oxide, barium oxide, magnesium oxide, aluminum oxide, etc.), sulfates (sodium sulfate, calcium sulfate, magnesium sulfate, cobalt sulfate, etc.), metal halides (calcium chloride, magnesium chloride, cesium fluoride, tantalum fluoride, cerium bromide, magnesium bromide, barium iodide, magnesium iodide, etc.), and perchlorates (barium perchlorate, magnesium perchlorate, etc.), wherein anhydrides are preferably used for the sulfates, metal halides and perchlorates.

≪ Protective Member≫

For the purpose of increasing mechanical strength of the device, a protective member may preferably be provided on the outer side of the sealing member which faces the support substrate while placing the organic layer between the substrate and the sealing member. In particular when the sealing is provided by the film, provision of this sort of protective member is preferable, because the mechanical strength of the sealing member is not always large enough. Materials adoptable to the protective member include glass plate, polymer plate/film and metal plate/film, which are similar to those used for the sealing member. Polymer film is preferable by virtue of its light weight and possibility of thinning.

≪ Light Extraction≫

The organic EL device causes luminescence inside a layer having larger refractive index (approximately 1.7 to 2.1) than the air, and is generally understood that only 15 to 20% of light generated inside the luminescent layer may be extracted. This is because light incident on the interface (between the transparent support substrate and the air), at an angle θ larger than the critical angle, causes total reflection and cannot be extracted to the outside, and also because the light causes total reflection between the transparent electrode or the luminescent layer and the transparent support substrate, guided through the transparent electrode or the luminescent layer, and finally leaks towards the side faces of the device.

Known techniques which are proposed for improving efficiency of light extraction include a method of forming an irregularity on the surface of the transparent support substrate so as to prevent total reflection at the interface between the transparent support substrate and the air (U.S. Pat. No. 4,774,435); a method of improving the efficiency by imparting light condensing property to the substrate (Japanese Laid-Open Patent Publication No. S63-314795); a method of forming reflective surfaces typically on the side faces of the device (Japanese Laid-Open Patent Publication No. H01-220394); a method of introducing, between the substrate and the luminescent component, a flat film having an intermediate refractive index, which serves as an anti-reflective film (Japanese Laid-Open Patent Publication No. S62-172691); a method of introducing, between the substrate and the luminescent component, a flat film having a refractive index less than that of the substrate (Japanese Laid-Open Patent Publication No. 2001-202827); and a method of forming a grating between any two components selected from the substrate, transparent electrode layers and luminescent layers (adoptable also between the substrate and the external) (Japanese Laid-Open Patent Publication No. H11-283751).

While any of these methods can be combined with the organic EL device of the present invention, it is preferable in the present invention to adopt the method of introducing a flat film having a refractive index less than that of the substrate between the substrate and the luminescent component; or a method of forming a grating between any two components selected from the substrate, transparent electrode layers and luminescent layers (adoptable also between the substrate and the external).

By combining these techniques, a device further excellent in the luminance and durability may be obtained by the present invention.

If a low-refractive-index medium, having a thickness larger than wavelength of light, is formed between the transparent electrode and the transparent support substrate, the light emitted from the transparent electrode may more efficiently be extracted, as the refractive index of the medium becomes less.

The low-refractive-index layer may be exemplified by those composed of aerogel, porous silica, magnesium fluoride, and fluorine-containing polymer. Since refractive index of the transparent support substrate is generally 1.5 to 1.7 or around, so that the low-refractive-index layer preferably has a refractive index of approximately 1.5 or less, and more preferably 1.35 or less.

Thickness of the low-refractive-index layer is preferably twice or more as large as the wavelength of the emitted light passing through the low-refractive-index layer. This is because the low-refractive-index layer having the thickness reduced to the wavelength allows evanescent wave to propagate into the substrate, thereby reduces the effect of low-refractive-index layer.

The method of introducing a grating at the interface causative of total reflection, or in any layer, is characterized by its large effect of improving the light extraction efficiency. The method is based on a property of grating that redirects the direction of propagation of light into a specific direction different from the direction of refraction, by so-called Bragg diffraction including primary diffraction and secondary diffraction. The method is aimed at extracting a component of light emitted from the luminescent layer, but cannot come outside due to total reflection at the interface of any layers, by inserting the grating between any layers or in the medium (transparent support substrate or transparent electrode) so as to diffract the light.

The grating to be introduced herein preferably has a two-dimensional periodicity in the refractive index. Because a general linear grating having a periodicity of refractive index distribution only in one certain direction diffracts only a component of light which propagates in a certain specific direction out of all components of light emitted from the luminescent layer randomly in all directions, the light extraction efficiency is not improved by the linear grating.

In contrast, by adopting the two-dimensional distribution of refractive index, the components of light which propagate in all directions may be diffracted, and thereby the light extraction efficiency is successfully improved.

While position of introduction of the grating may be between any layers or in the medium (transparent support substrate or transparent electrode) as described in the above, it is preferably close to organic luminescent layer which is the site of emission of light.

The pitch of grating is preferably about ½ to 3 times of the wavelength of emitted light passing through the layers or medium.

Pattern of arrangement of grating is preferably two-dimensional repetitive pattern, such as orthogonal lattice, triangular lattice, and honeycomb lattice.

≪ Light-Condensing Sheet≫

The organic EL device of the present invention is enhanced in the luminance in a specific direction, by providing, for example, a micro-lens array structure on the extraction side of the substrate, or combining the device with a so-called, light-condensing sheet, so as to condense emitted light in a specific direction, typically in the front direction with respect to the light emitting side of the device.

The micro-lens array has square pyramids arranged in a two-dimensional manner. Each of the square pyramids has 30-μm-long edges and an apex angle of 90° on the light extraction side of the substrate. Each edge is preferably 10 μm to 100 μm long. When the edges are shorter than the above-described range, coloring is caused by diffraction. When the edges are too long, the thickness of the device undesirably increases.

The light-condensing sheet adoptable herein may be those, for example, already put into practical use as LED back light for liquid crystal display apparatuses. This sort of sheet may be exemplified by brightness enhancement film (BEF) available from Sumitomo 3M Ltd.

The prism sheet may have any geometry having stripes or the like. For example, the stripes having ridges are formed on a base member, each ridges has an apex angle of 90°, or a rounded apex. The pitch of the stripes is 50-μm, or randomly varied, and so forth.

In order to control the emission angle of light from the luminescent device, a light-diffusing plate/film is optionally combined with the light-condensing sheet. For example, light diffusion film (trade name: LIGHT-UP) is available from Kimoto Co., Ltd.

《Applications》

The organic EL device of the present invention is available to display, monitor, and various light sources. The light sources are exemplified by lighting apparatus (home-use light, interior vehicle light), back light for watch and liquid crystal display, advertising signboard, traffic light, light source for optical recording media, light source for electronic photo-copying machine, light source for optical communication processor, and light source for optical sensor. While the applications are not limited thereto, the device is particularly useful for back light for liquid crystal display apparatus, and light source for lighting apparatus.

In the organic EL device of the present invention, the constitutive layers are optionally patterned by using metal mask(s) or by ink jet printing. The patterning may be given only to the electrodes, or to both of the electrodes and luminescent layers, or to all layers in the device. Any publicly-known methods are available for manufacturing the device.

Figure 4:
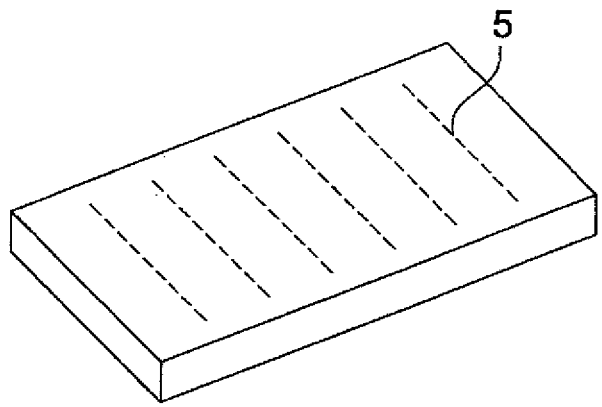
FIG. 4 is a schematic drawing of a passive matrix full-color display apparatus.
Figure 4:
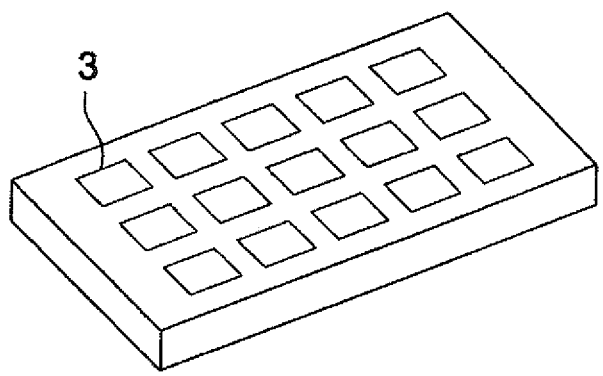
Figure 4:
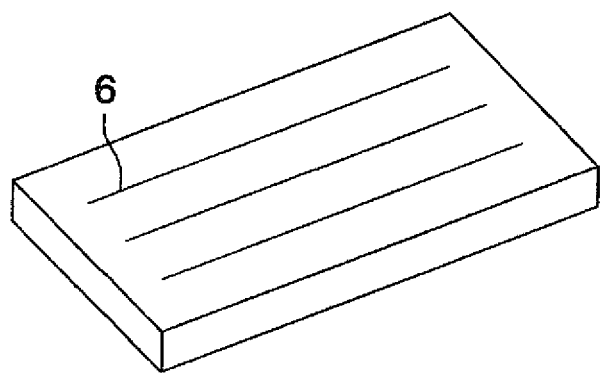

Luminescent colors of the organic EL device and compound of the present invention may be determined by measurement using a spectroradiometer CS-1000 (from Konica Minolta Sensing, Inc.), and by mapping the results on the CIE chromaticity coordinates described in "Shin-pen Shikisai Kagaku Handbook (The New Edition of Handbook of Color Science)", in Japanese, edited by the Color Science Association of Japan, published by University of Tokyo Press, 1985, p. 108, FIG. 4.16.

For the case where the organic EL device of the present invention is a white-light device, the white color is defined as a light which falls in the range of X=0.33±0.07 and Y=0.33±0.1 on the CIE 1931 chromaticity diagram at the luminance of 1000 cd/m$^2$, the luminance being measured at the frontal view in the two-degree by the above method.

《Display Apparatus》

The display apparatus of the present invention is explained below. The display apparatus of the present invention has the organic EL device of the present invention.

While the display apparatus of the present invention may be a single-color display or a multi-color display, the latter is explained herebelow. In manufacturing of the multi-color display apparatus, shadow masks are provided only in the process of forming each luminescent layer, and by selectively forming each layer by vacuum deposition, casting, spin coating, ink jet process, printing or the like.

While methods of forming the patterned luminescent layers are not specifically limited, vacuum deposition, ink jet process, spin coating and printing are preferable.

Configuration of the organic EL devices to be mounted on the display apparatus may be selected from the above-described exemplary configurations of the organic EL devices depending on needs.

Method of manufacturing of the organic EL device is same as described in the above embodiment of manufacturing of the organic EL device of the present invention.

When the obtained, multi-color display apparatus is driven by DC voltage, luminescence may be observed by applying a voltage of approximately 2 to 40 V, while setting the polarity of anode to (+) and cathode to (−). No luminescence is observed under current applied with reverse polarity. For the case where the display apparatus is driven by AC voltage, the luminescence is observed only during the periods in which the anode is set to (+) and the cathode is set to (−). Waveform of AC voltage is arbitrarily selectable.

The multi-color display apparatus may be used as a display apparatus, a monitor, and various light sources. The display apparatus and the monitor provide full-color display by using three types of organic EL devices specialized for blue, red and green luminescence.

The display apparatus and the monitor may be exemplified by television set, personal computer, mobile instruments, AV equipment, teletext broadcasting display, and in-vehicle information display. It may be used as a display apparatus for reproducing still picture or movie. Whichever of simple matrix (passive matrix) system and active matrix system is adoptable as the drive system of the display apparatus for reproducing movie.

Light source may be exemplified by home-use light, interior vehicle light, back light for watch and liquid crystal display, advertising signboard, traffic light, light source for optical recording media, light source for electronic photo-copying machine, light source for optical communication processor, and light source for optical sensor, without limiting the present invention.

An exemplary display apparatus having the organic EL device of the present invention is explained below, referring to the attached drawings.

FIG. 1 is a schematic drawing illustrating an example of a display apparatus using the organic EL device. More specifically, the display apparatus is a monitor typically used for mobile phone, which gives image information with the aid of luminescence of the organic EL devices.

A monitor 1 includes a display unit A having a plurality of pixels, and a control unit B which takes part in scanning for producing image on the display unit A based on image information.

The control unit B is electrically connected to the display unit A, supplies scanning signal and image data signal to each of the plurality of pixels based on the external image information. The pixels aligned with every scanning line are driven by the scanning signal and sequentially cause luminescence based on the image data signal, thereby show the image information on the display unit A.

Figure 2:
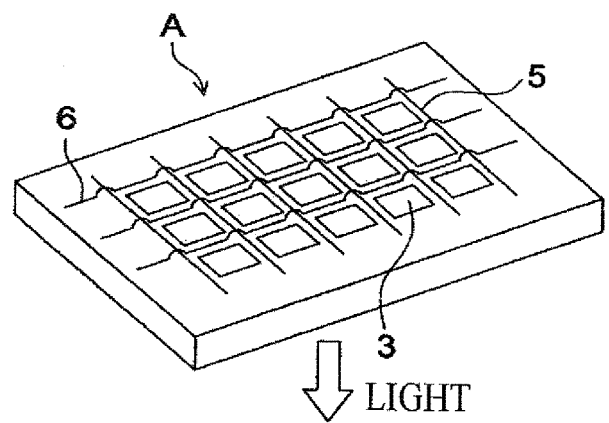
FIG. 2 is a schematic drawing of a display unit.

FIG. 2 is a schematic drawing of the display unit A.

The display unit A has lines containing a plurality of scanning lines 5 and data lines 6, and a plurality of pixels 3 formed on a substrate. Major constituents of the display unit A is explained below.

The drawing illustrates an exemplary configuration in which light emitted from the pixels 3 is extracted in the direction indicated by a blank arrow (downwards).

The plurality of scanning lines 5 and the data lines 6 are respectively composed of an electroconductive material. The individual scanning lines 5 and data lines 6 are orthogonally aligned to form a lattice pattern, and are respectively connected to the pixels 3 at the intersections (details not illustrated).

When the scanning signal is applied from the scanning line 5 to the pixel 3, the pixel 3 receives the image data signal from the data lines 6, and causes luminescence based on the received image data.

Full-color display may be enabled by appropriately arranging the pixels designed for luminescence in red color region, pixels designed for luminescence in green color region, and pixels designed for luminescence in blue color region on the same substrate.

Figure 3:
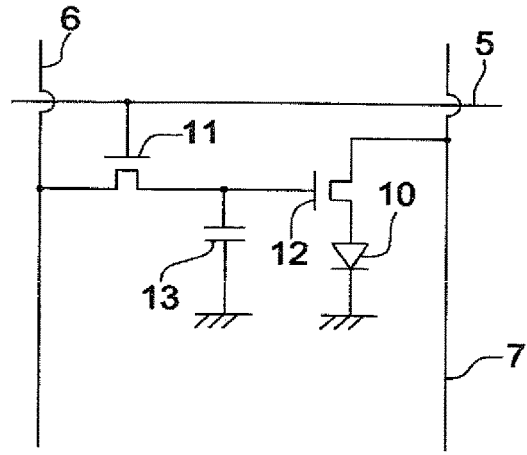
FIG. 3 is a schematic drawing of a pixel.

Next, luminescent process of the pixels will be explained. FIG. 3 is a schematic drawing of one pixel.

The pixel includes an organic EL device 10, a switching transistor 11, a drive transistor 12, and a capacitor 13. Full-color display may be enabled by using red, green and blue organic EL devices as the organic EL devices 10 in a plurality of pixels, and by arranging them on the same substrate.

Referring to FIG. 3, image data signal is applied from the control unit B through the data lines 6 to the drain of the switching transistor 11. When the scanning signal is applied from the control unit B through the scanning lines 5 to the gate of the switching transistor 11, the switching transistor 11 turns on, and the image data signal having been applied to the drain is transmitted to the capacitor 13 and the gate of the drive transistor 12.

By the transmission of the image data signal, the capacitor 13 is charged depending on potential of the image data signal, and the drive transistor 12 turns on. Since the drive transistor 12 has the drain connected to a source line 7, and the source connected to the electrode of the organic EL device 10, so that electric current is supplied to the organic EL device 10 from the source line 7. The current supplied to the organic EL device 10 depends on potential of the image data signal having been applied to the gate of the drive transistor 12.

When the scanning signal moves to the next scanning lines 5 in the sequential scanning controlled by the control unit B, the switching transistor 11 turns off. However, since the capacitor 13 holds the charged potential of the image data signal even after the switching transistor 11 turns off, so that the drive transistor 12 is kept turned on, and thereby luminescence of the organic EL device 10 sustains until the scanning signal is applied for the next time. When the scanning signal is applied for the next time in the sequential scanning, the drive transistor 12 turns on depending on potential of the next image data signal synchronized with the scanning signal, and thereby the organic EL device 10 cause luminescence.

In other words, the luminescence of the organic EL device 10 of each of the pixels 3 is driven by each active device including a switching transistor 11 and a drive transistor 12 provided to each of the pixels. This drive system is referred to as the "active matrix system".

The luminescence of the organic EL device 10 herein may have a multi-level gradation controlled by multi-level image data signal having a multi-level gradation potential, or may occur at a predetermined luminous energy while being turned on or turned off by binary image data signal. The potential held by the capacitor 13 may be retained until the next scanning signal is applied, or may be discharged immediately before the next scanning signal is applied.

In the present invention, not only the above-described active matrix system, but also passive matrix system, according to which the organic EL devices cause luminescence depending on the data signal only when scanned by the scanning signal, is adoptable.

FIG. 4 is a schematic drawing illustrating a display apparatus which adopts the passive matrix system. As is seen in FIG. 4, the plurality of scanning lines 5 and the plurality of image data lines 6 are opposed to each other to form a lattice, while holding the pixels 3 in between.

In the sequential scanning in this configuration, when the scanning signal from any one of the scanning lines 5 is applied to the pixels 3 connected to the scanning line 5, the pixels 3 cause luminescence depending on the image data signal applied to the image data lines 6.

The passive matrix system has no active devices in the pixels 3, and therefore saves the manufacturing cost.

《Lighting Apparatus》

The lighting apparatus of the present invention will be explained. The lighting apparatus of the present invention has the above-described organic EL device.

The organic EL device of the present invention is adoptable to an EL device having a resonator structure. Purpose of use of the organic EL device having the resonator structure includes light source for optical storage media, light source for electronic photo-copying machine, light source for optical communication processor, and light source for optical sensor, but is not restricted thereto. Alternatively, the organic EL device in a mode of laser oscillation is adoptable to the above-described applications.

The organic EL device of the present invention is used for a sort of lamp such as light sources for illumination or exposure, or is used for a projector for projecting images, or a display apparatus on which still image or movie is viewed directly.

Drive system for the organic EL device, when used for display apparatus for movie reproduction, is either of simple matrix (passive matrix) system and active matrix system. Alternatively, full-color display apparatus is manufactured, by using two or more types of the organic EL devices of the present invention having different luminescent colors.

The organic EL material of the present invention is applicable to an organic EL device causing substantially white light luminescence, intended for the lighting apparatus. The white light luminescence may be obtained by mixing multiple luminescent colors from multiple luminescent materials activated at the same time. The multiple luminescent colors may be combined so as to contain three peak luminescent wavelengths which correspond to three primary colors of red, green and blue, or two peak luminescent wavelengths which correspond to relations of complementary colors between blue and yellow, or between blue-green and orange.

When the luminescent materials are combined so as to obtain multiple luminescent colors, possible combinations adoptable herein include a combination of a plurality of materials emitting different colors of phosphorescence or fluorescence; and a combination of luminescent materials emitting fluorescence or phosphorescence, with dye materials emitting light while being excited by the light received from the luminescent materials. In the white-light organic EL device of the present invention, it is good enough to simply combine and mix a plurality of luminescent dopants.

In the manufacturing of the lighting apparatus, masks are used only in the processes of forming the luminescent layer, the hole transport layer and the electron transport layer, which are formed by selective coating only simply by placing the masks dedicated for the individual colors. On the other hand, the residual layers are provided in common irrespective of colors. Thus, an electrode film, for example, may be formed on the entire surface typically by vacuum deposition, casting, spin coating, ink jet process, printing or the like, without placing masks. Therefore, the productivity is improved.

According to this method, each device per se emits white light, unlike a white-light organic EL device having multi-color luminescent devices arrayed therein.

Luminescent materials used for the luminescent layer are not specifically limited. For an exemplary case where the device is used for a back light unit for liquid crystal display apparatus, white light may be obtained by arbitrarily selecting and combining the metal complexes of the present invention or publicly-known luminescent materials, so as to fit them to wavelength ranges corresponded to CF (color filter) characteristics.

≪ One Embodiment of Lighting Apparatus of the Present Invention≫

One embodiment of the lighting apparatus of the present invention, equipped with the organic EL devices of the present invention will be explained.

Figure 5:
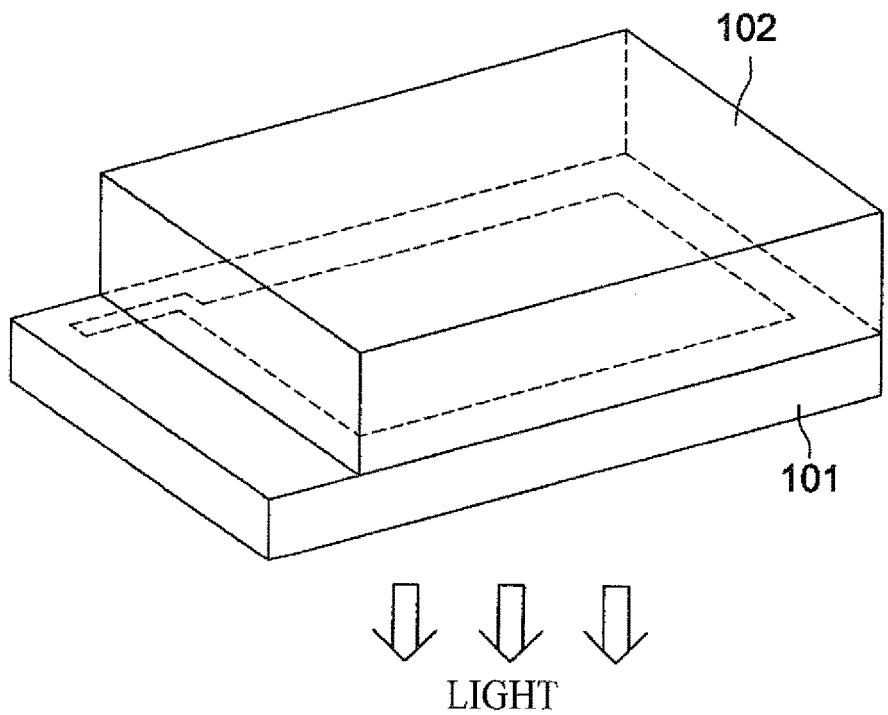
FIG. 5 is a schematic drawing of a lighting apparatus.
Figure 6:
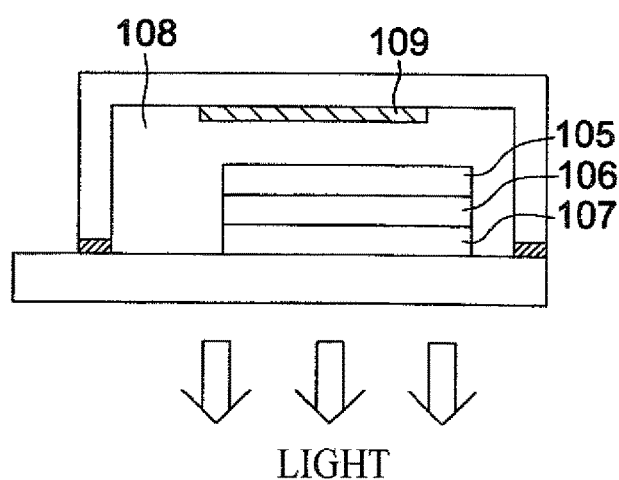
FIG. 6 is a sectional view of a lighting apparatus.

The lighting apparatus as illustrated in FIG. 5 and FIG. 6 may be manufactured by covering an organic EL device of the present invention by a glass cover (sealing member) on its non-luminescent side as the following (1) to (4).
(1) A glass substrate having the thickness of 300 μm is used for the glass cover.
(2) An epoxy-based, photo-curable adhesive (Luxtruck LC0629B, from Toagosei Co., Ltd.) is applied as a sealing material around the glass cover.
(3) The glass cover is placed over the organic EL device so that the sealing material is arranged around the organic EL device and adhered to the transparent support substrate on which the organic EL device is formed.
(4) The sealing material is cured by irradiating UV radiation from the glass cover side, thereby sealing is completed.

FIG. 5 is a schematic drawing illustrating the lighting apparatus. The organic EL device of the present invention formed on the transparent support substrate 101 is covered with a glass cover 102. Sealing with the glass cover is conducted in a glove box under a nitrogen atmosphere (with a high purity of 99.999% or above), without exposing the organic EL device to the air.

FIG. 6 is a sectional view illustrating the lighting apparatus, wherein reference numeral 105 stands for a cathode, 106 for an organic EL layer, and 107 for a transparent electrode formed on a transparent support substrate 101. The inner space of the glass cover 102 is filled with nitrogen gas 108, and is provided with a desiccant 109.

[Exemplary Syntheses of Compounds]

Exemplary syntheses of the representative compounds are explained below.

[Synthesis of Exemplary Compound (III)-2]

Ligand A1 was synthesized as described below, and exemplary compound (III)-2 was then synthesized.

≪ Synthesis of Ligand A1≫

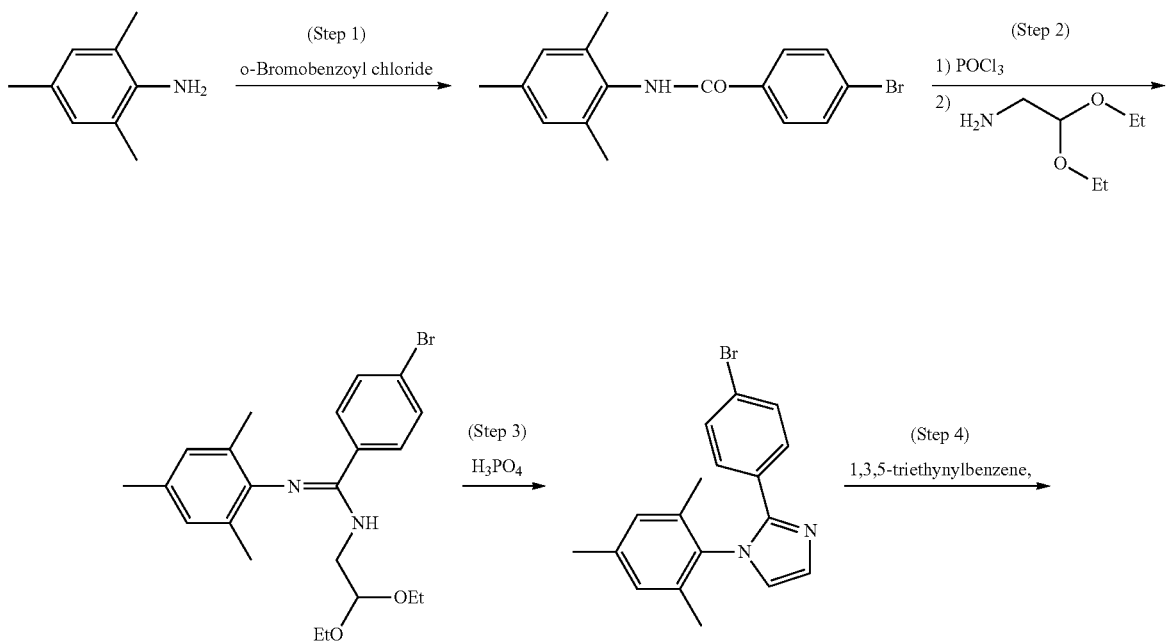

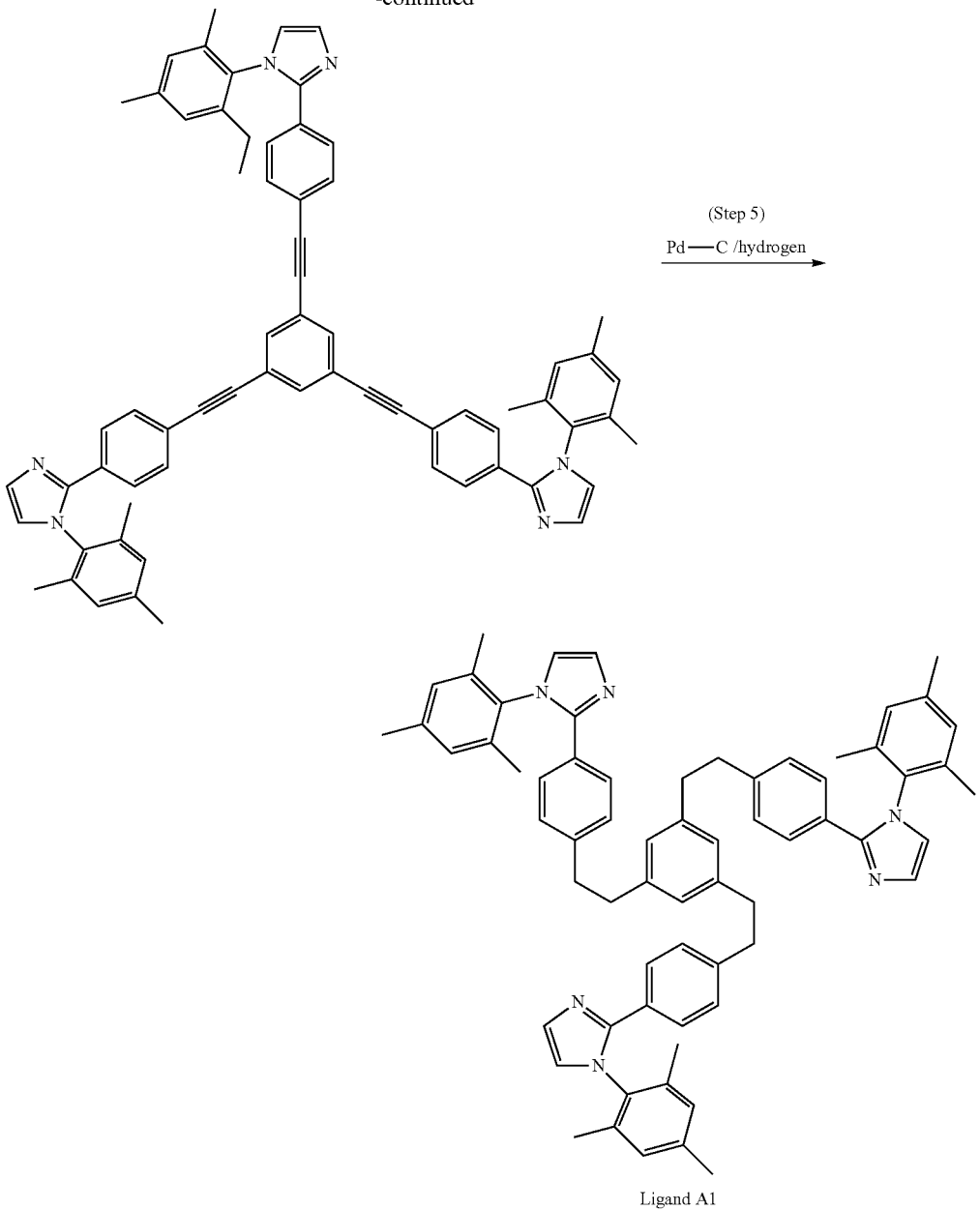

Ligand A1

(Step 1)

Twenty grams of 2,4,6-trimethylaniline was dissolved in 320 ml of toluene, and 41 ml of triethylamine was added. To the mixture, a solution prepared by dissolving 34 g of o-bromobenzoyl chloride into 20 ml of toluene was added dropwisely under cooling on water. After completion of the dropping, the mixture was stirred for 1.5 hours at room temperature, and undissolved matter was collected by filtration. The collected white crystal was suspended in 1 L of water for one hour, the water was filtered off, to thereby obtain 45 g (nearly theoretical amount) of 4-bromo-N-mesitylbenzamide as a white crystal.

(Step 2)

Thirty-five grams of 4-bromo-N-mesitylbenzamide obtained in Step 1 was dissolved in 200 ml of toluene. After adding 12.5 ml of phosphoryl chloride, the mixture was stirred at an internal temperature of 90° C. for two hours, and then allowed to cool. Next, 50.2 grams of aminoacetoaldehyde diethyl acetal was dissolved into 200 ml of acetonitrile, and added with 67 ml of triethylamine to thereby prepare a solution. The previously cooled mixture was dropped into the solution at an internal temperature of 50° C. or lower. Thereafter, the mixture was added with 200 ml of ethyl acetate and 50 ml of saturated brine and then mixed. After removing an aqueous solvent layer of the mixture by a separating funnel, the remained organic solvent layer of the mixture was dried by magnesium sulfate. Then, after removing the magnesium sulfate, the organic solvent was condensed and thereby a crude crystal of amizine was obtained as an intermediate.

(Step 3)

The whole quantity of the amizine crude crystal obtained in Step 2 was dissolved into 150 ml of toluene, added with 33 g of phosphoric acid and 60 ml of water, and the mixture was refluxed using an esterification tube (condenser) for two hours. Next, a solution prepared by dissolving 36 g of potassium hydroxide into 57 ml of water was dropped into the refluxed mixture, cooled on ice, over 30 minutes. Further the mixture was added with 200 ml of ethyl acetate and 50 ml of saturated brine and then mixed. Then, the mixture was filtered through diatomaceous earth. Then, the filtrate was separated by a separating funnel. After removing an aqueous solvent layer of the filtrate, the remained organic solvent layer of the filtrate was dried by magnesium sulfate. After removing the magnesium sulfate, the organic solvent was condensed. The concentrate was recrystallized in heptane-ethyl acetate, thereby 26 g of 2-(4-bromophenyl)-1-mesityl-1H-imidazole was obtained as a white solid.

presence of 0.25 g (5%) of palladium-carbon, to thereby obtain 500 mg of ligand A1 in a nearly stoichiometrical manner.

Structure of the ligand A1 was confirmed by mass spectroscopy and $^1$H-NMR.

Mass spectrum (ESI): m/z=943.6 [M$^+$]

$^1$H-NMR (CDCl$_3$) δ: 1.88 (18H, s), 2.32 (9H, s), 2.73 (12H, s), 6.67 (3H, s), 6.84 (3H, d, J=1.5 Hz), 6.91 (6H, s), 6.98 (6H, d, J=8.3 Hz), 7.27 (3H, d, J=1.5 Hz), 7.31 (6H, d, J=8.3 Hz).

《Synthesis of Exemplary Compound (III)-2》

(Step 6)

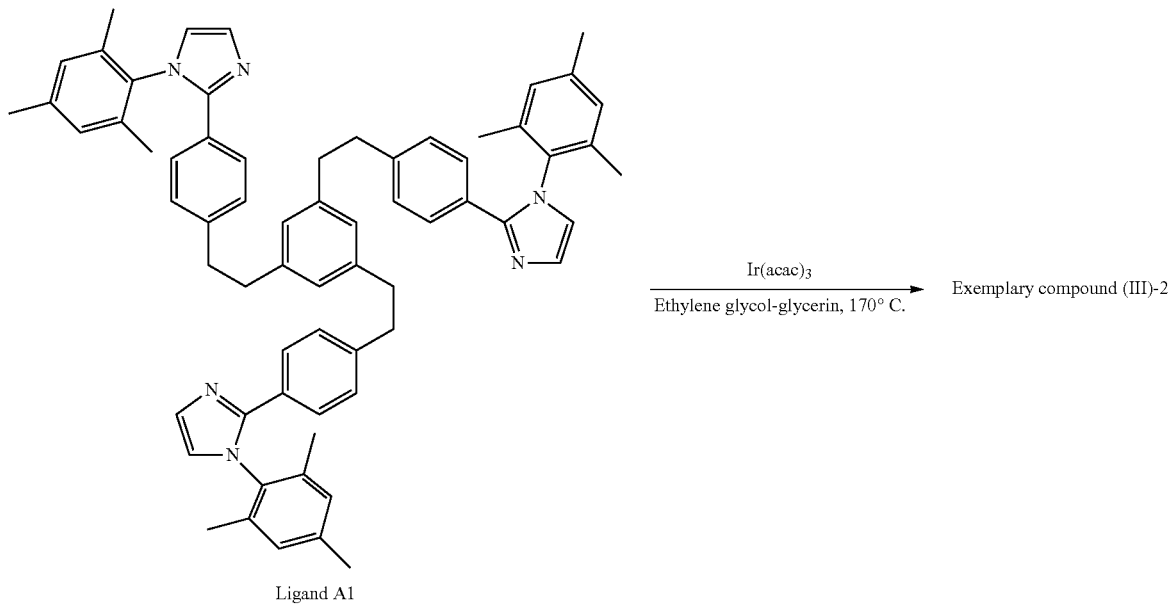

Ligand A1

(Step 4)

Under a nitrogen atmosphere, 6.8 g of the brominated product obtained in Step 3 was dissolved into 35 ml of dehydrated toluene 35 ml, added with 35 ml of dehydrated diisopropylamine and 1.0 g of 1,3,5-triethynylbenzene (from Wako Pure Chemical Industries, Ltd.), further added with 0.7 g of tetrakis(triphenylphosphine)palladium(0) and 0.08 g of copper(I) iodide under stirring. The stirring was continued at an internal temperature of 60° C. for two days. The mixture was then added with 50 ml of ethyl acetate and 50 ml of saturated brine and mixed. After removing an aqueous solvent layer of the mixture by a separating funnel, the remained organic solvent layer of the mixture was dried by magnesium sulfate. After removing the magnesium sulfate, the solvent was condensed. The condensate was purified by silica gel column chromatography, to thereby obtain 3.0 g of a precursor of the ligand A1.

Structure of the precursor of the ligand A1 was confirmed by mass spectroscopy and $^1$H-NMR.

Mass spectrum (ESI): m/z=931.6 [M$^+$]

$^1$H-NMR (CDCl$_3$) δ: 1.92 (18H, s), 2.36 (9H, s), 6.91 (3H, d, J=1.0 Hz), 6.97 (6H, s), 7.33 (3H, d, J=1.0 Hz), 7.36 (6H, d, J=8.3 Hz), 7.40 (6H, d, J=8.3 Hz), 7.53 (3H, s).

(Step 5)

Five hundred milligrams of the precursor obtained in Step 4 was dissolved into a mixed solvent of 50 ml of tetrahydrofuran and 20 ml of ethanol, and hydrogenated under the (Step 6)

Under a nitrogen atmosphere, 500 mg of the ligand A1 obtained in Step 5 was added with 263 mg of tris(acetylacetonato)iridium(III), 35 ml of ethylene glycol and 10 ml of glycerin. The mixture was heated at an internal temperature of 160° C. for 15 hours. The reacted mixture is allowed to cool down to room temperature. Thereafter the mixture is diluted with 50 ml of methanol, and the precipitate was collected by filtration. The thus-obtained precipitate was further washed with methanol. After drying the precipitate, 110 mg of exemplary compound (III)-2 is obtained.

Structure of the exemplary compound (III)-2 was confirmed by mass spectroscopy and $^1$H-NMR.

Mass spectrum (ESI): m/z=1132.6 [M$^+$]

$^1$H-NMR (THF-D$_8$) δ: 1.78 (9H, s), 2.00 (9H, s), 2.26 (3H, m), 2.37 (9H, s), 2.39 (3H, m), 2.53 (3H, m), 2.91 (3H, m), 5.41 (3H, s), 6.03 (3H, d, J=7.8 Hz), 6.09 (3H, d, J=7.8 Hz), 6.36 (3H, s), 6.68 (3H, s), 6.72 (3H, s), 7.03 (6H, s).

[Synthesis of Exemplary Compound (III)-3]

The synthesis followed the scheme below. The structure was confirmed by mass spectroscopy and $^1$H-NMR.

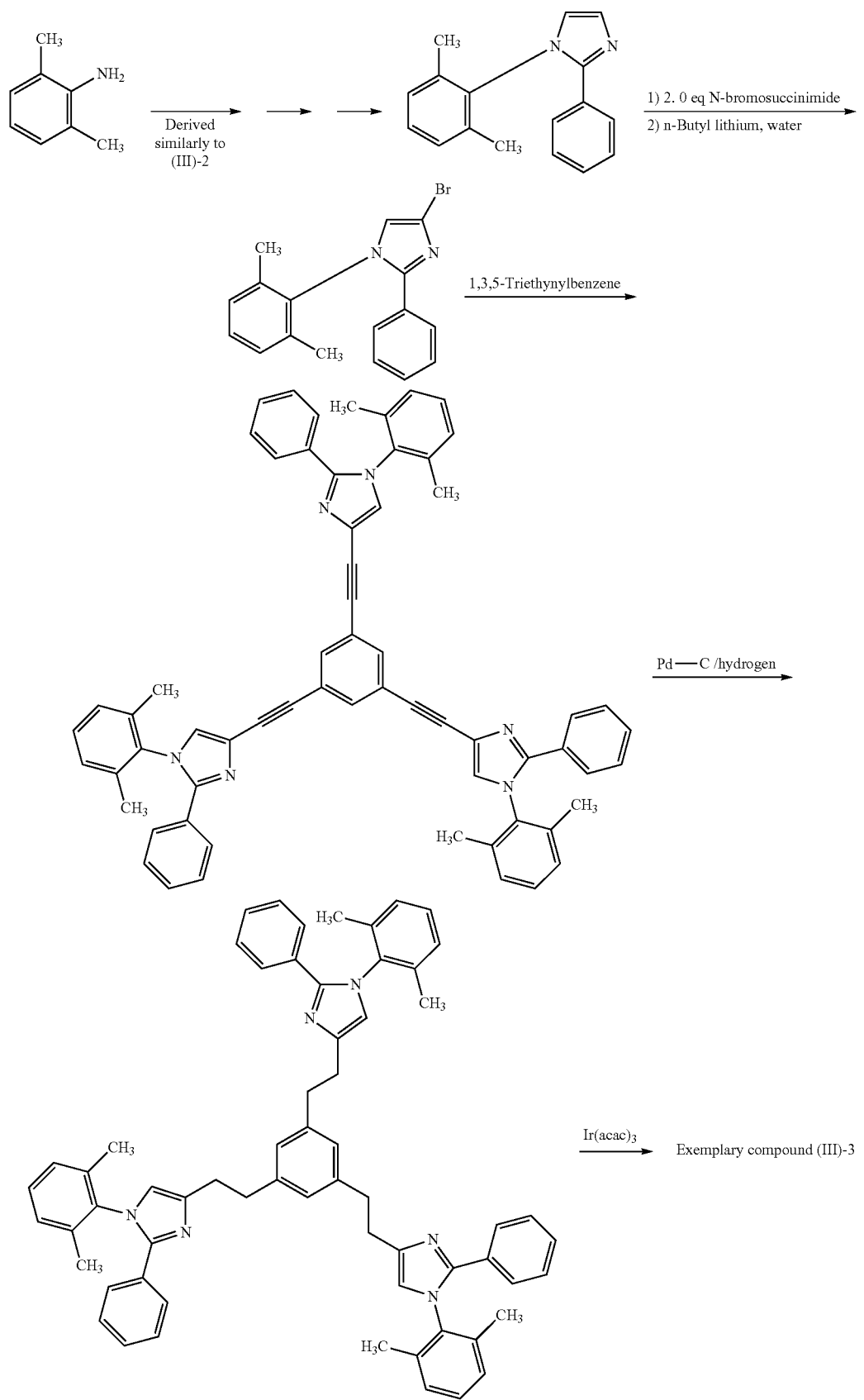

[Synthesis of Exemplary Compound (III)-20]
The synthesis followed the scheme below. The structure was confirmed by mass spectroscopy and $^1$H-NMR.
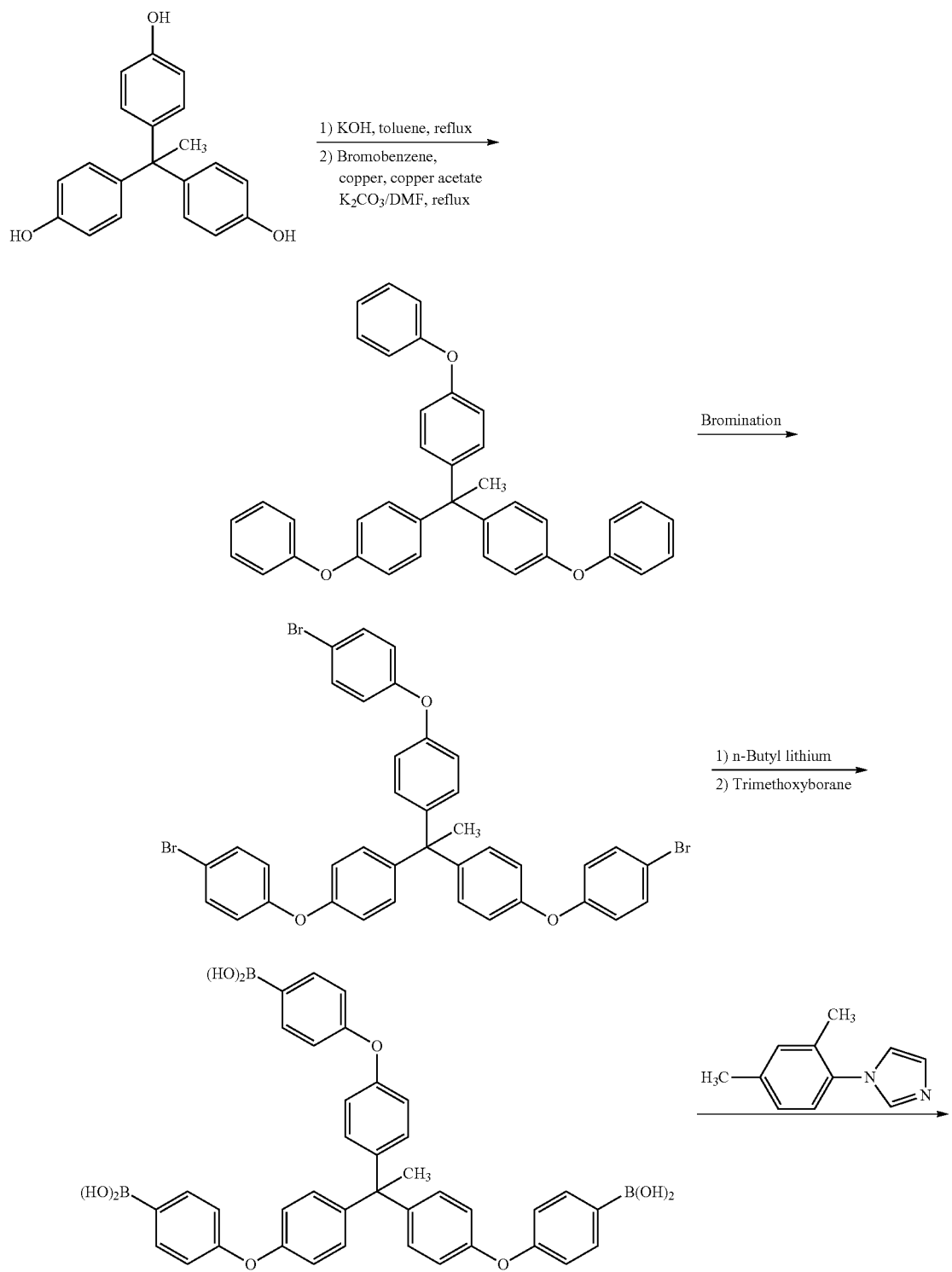 [SMILES: CC(c1ccc(O)cc1)(c1ccc(O)cc1)c1ccc(O)cc1 ; CC(c1ccc(Oc2ccccc2)cc1)(c1ccc(Oc2ccccc2)cc1)c1ccc(Oc2ccccc2)cc1 ; CC(c1ccc(Oc2ccc(Br)cc2)cc1)(c1ccc(Oc2ccc(Br)cc2)cc1)c1ccc(Oc2ccc(Br)cc2)cc1 ; CC(c1ccc(Oc2ccc(B(O)O)cc2)cc1)(c1ccc(Oc2ccc(B(O)O)cc2)cc1)c1ccc(Oc2ccc(B(O)O)cc2)cc1 ; Cc1ccc(-n2ccnc2)c(C)c1]

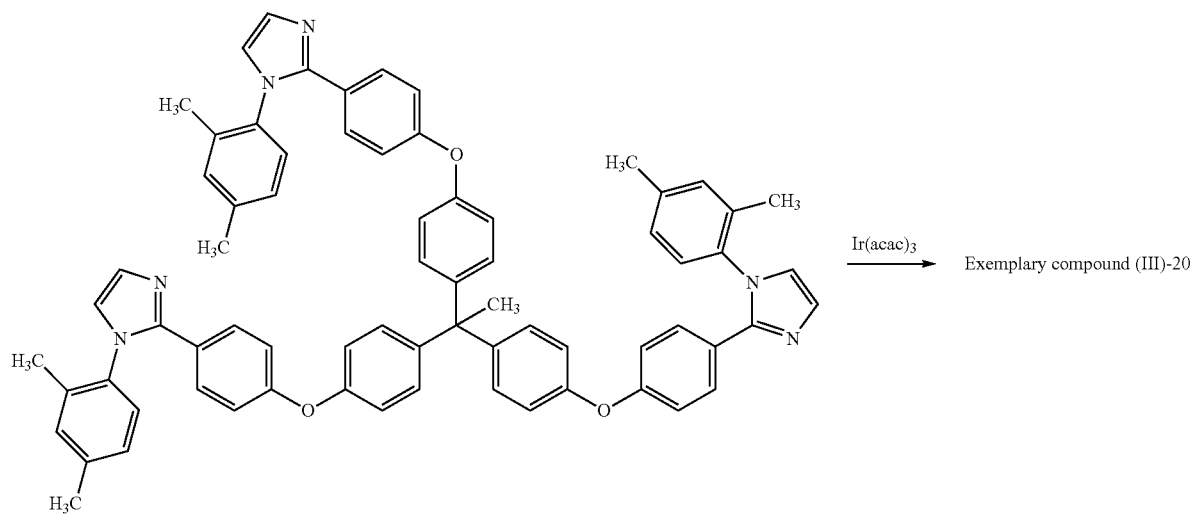 [SMILES: Cc1ccc(-n2ccnc2-c2ccc(Oc3ccc(C(C)(c4ccc(Oc5ccc(-c6nccn6-c6ccc(C)cc6C)cc5)cc4)c4ccc(Oc5ccc(-c6nccn6-c6ccc(C)cc6C)cc5)cc4)cc3)cc2)c(C)c1]
[Synthesis of Exemplary Compound (IV)-2]
The synthesis followed the scheme below. The structure was confirmed by mass spectroscopy and $^1$H-NMR.
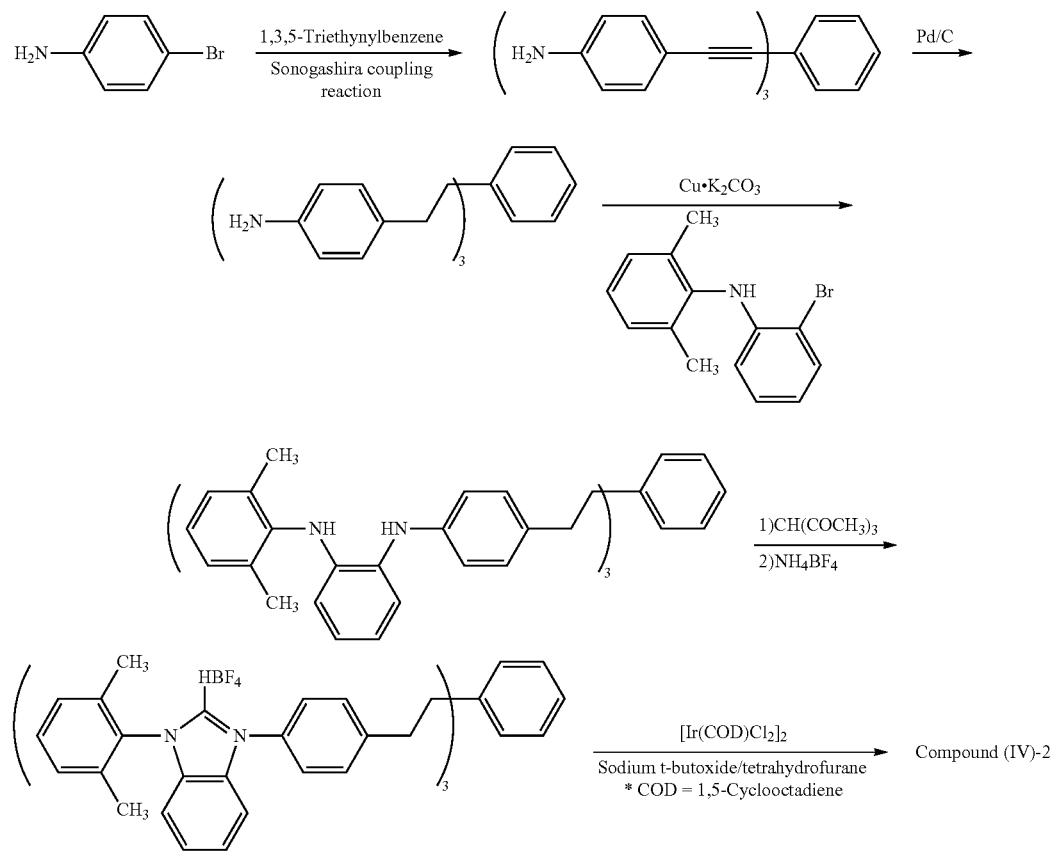

[Synthesis of Exemplary Compound (V)-2]
The synthesis followed the scheme below. The structure was confirmed by mass spectroscopy and ¹H-NMR.
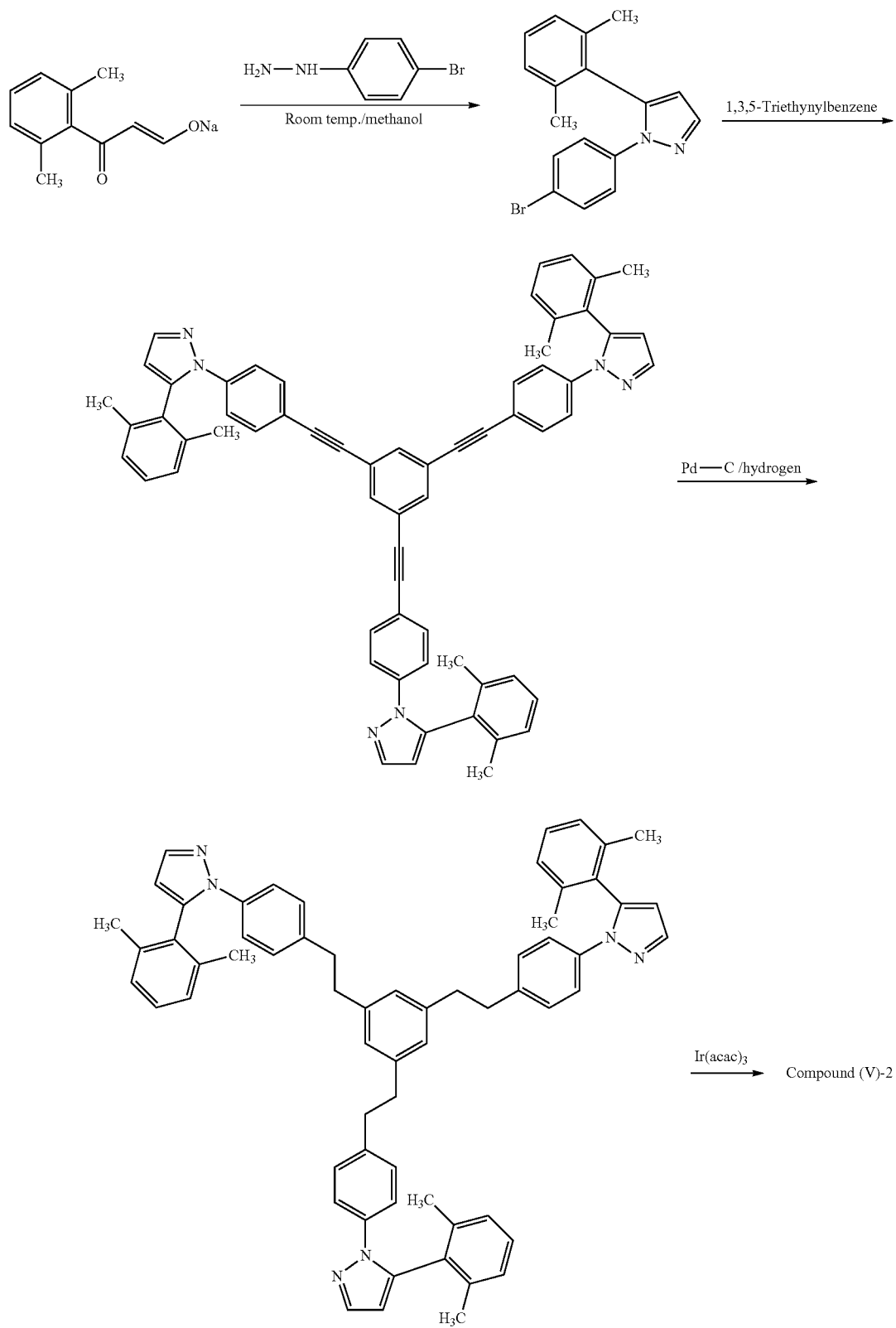

[Synthesis of Exemplary Compound (VI)-5]
The synthesis followed the scheme below. The structure was confirmed by mass spectroscopy and ¹H-NMR.
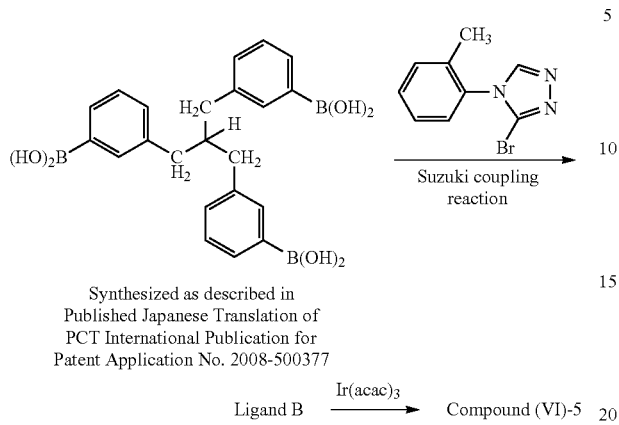
[Synthesis of Exemplary Compound (VII)-1]
The synthesis followed the scheme below. The structure was confirmed by mass spectroscopy and ¹H-NMR.
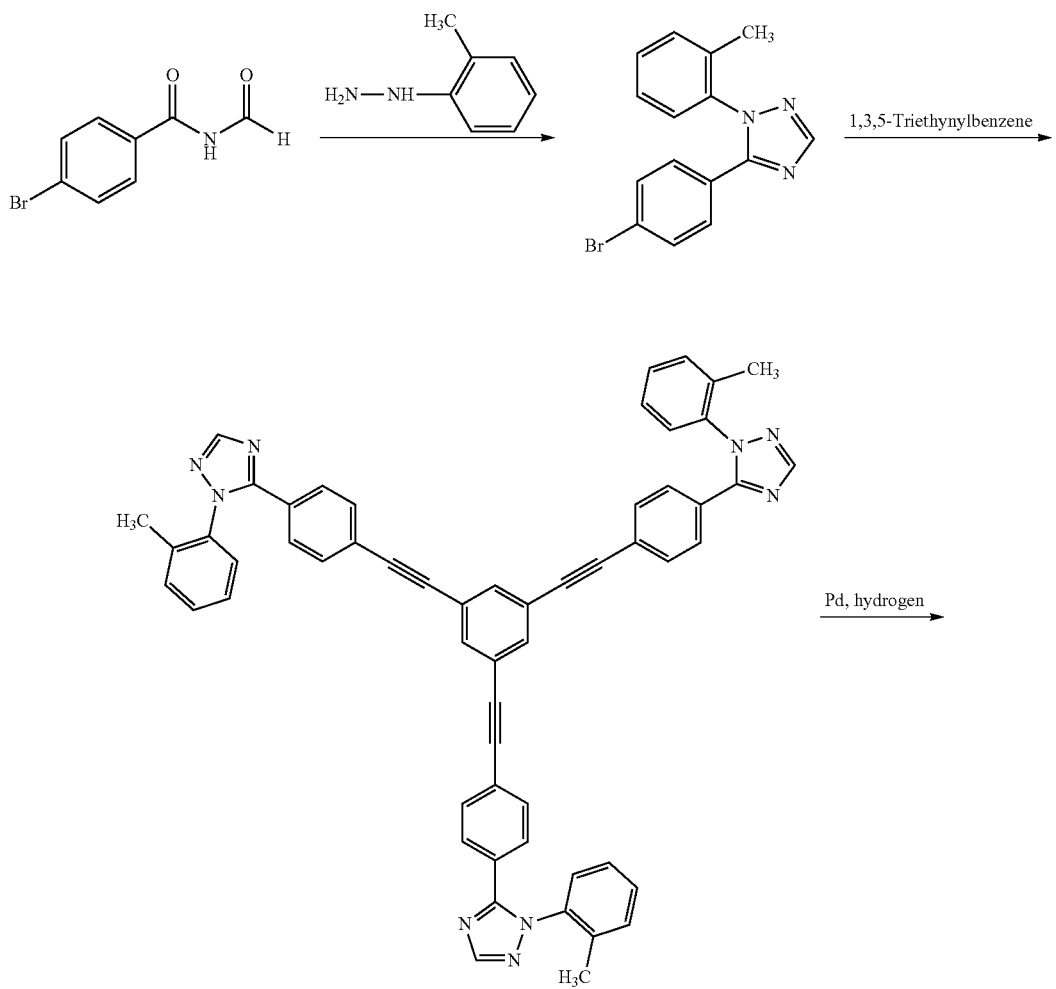

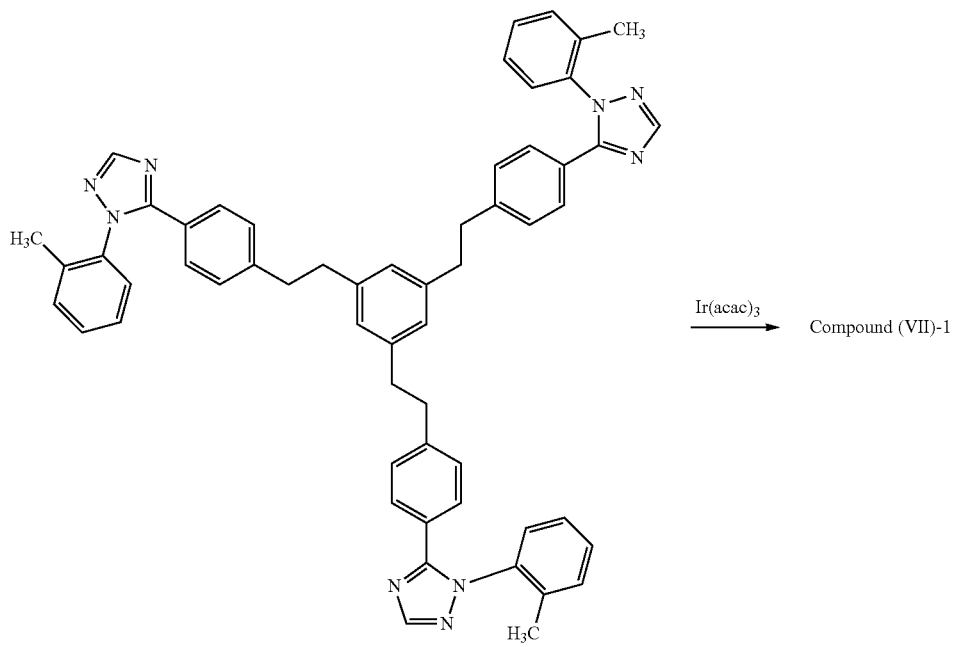
Example 1
(1) Manufacturing of Organic EL Devices
(1.1) Manufacturing of Organic EL Device 1-1
Structures of compounds used for manufacturing of the organic EL device are shown below.
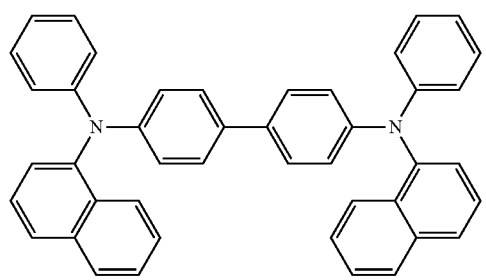
α-NPD
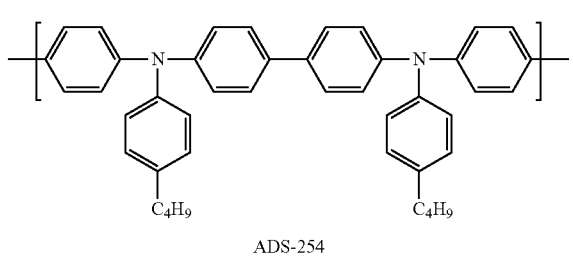
ADS-254
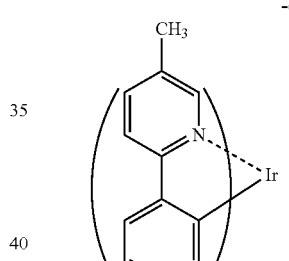
Comparative
dopant compound 1
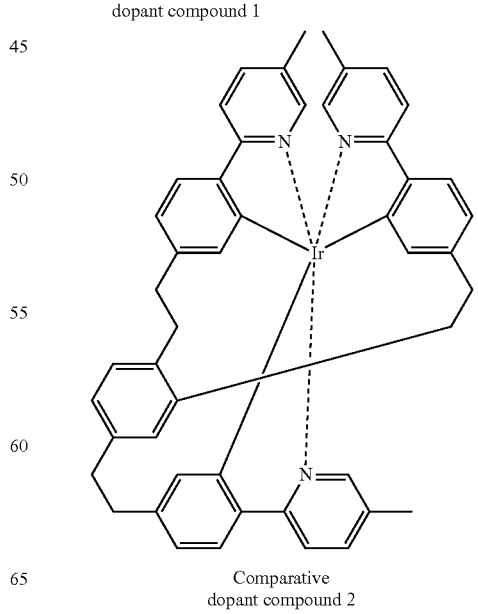
Comparative
dopant compound 2

-continued

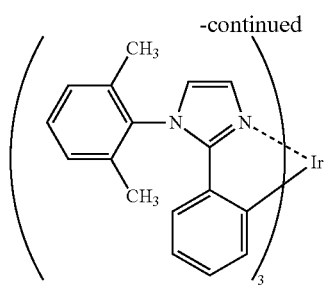

Comparative dopant compound 3

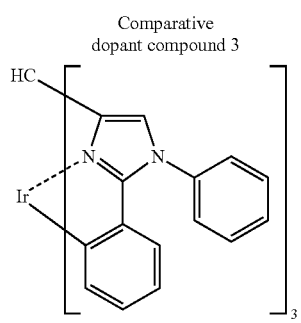

Comparative dopant compound 4

A 100-nm-thick ITO (indium tin oxide) film formed on a 100 mm×100 mm×1.1 mm glass substrate (NA-45, from AvanStrate Inc.) was patterned to form an anode. The thus-obtained transparent support substrate, having the ITO transparent electrode patterned thereon, was then subjected to ultrasonic cleaning in isopropanol, dried with dry nitrogen gas, and subjected to UV-ozone cleaning for 5 minutes.

On the transparent support substrate, a solution of poly (3,4-ethylenedioxythiophene)-polystyrene sulfonate (PEDOT/PSS, Baytron P VP A14083, from Bayer AG) diluted 70% with pure water was spread by spin coating, and then dried at 200° C. for one hour, to thereby form a first hole transport layer of 30 nm thick.

On the first hole transport layer, a chlorobenzene solution of poly(N,N'-bis(4-butylphenyl)-N,N'-bis(phenyl))benzidine (ADS-254 from American Dye Source, Inc.), as the hole transport material, was spread by spin coating and dried at 150° C. for one hour, to thereby obtain a second hole transport layer of 40 nm thick.

On the second hole transport layer, a butyl acetate solution of OC-11 as the host compound, and comparative dopant compound 1 as the dopant compound, was spread by spin coating and dried at 120° C. for one hour, to thereby obtain a luminescent layer of 30 nm thick.

On the luminescent layer, an 1-butanol solution of electron transport material ET-11 was spread by spin coating and dried at 120° C. for one hour, to thereby provide a electron transport layer of 20 nm thick.

The obtained article was placed in a vacuum chamber of a vacuum deposition apparatus, and the vacuum chamber was then evacuated to $4 \times 10^{-4}$ Pa. Next, a lithium fluoride layer of 1.0 nm thick, as the electron injection layer, and an aluminum layer of 110 nm thick, as the cathode, were deposited, to thereby manufacture an organic EL device 1-1.

(1.2) Manufacturing of Organic EL Devices 1-2 to 1-15

Organic EL devices 1-2 to 1-15 were respectively manufactured similarly to the organic EL device 1-1, except that the host compound OC-11 and the comparative dopant compound 1 in the luminescent layer were replaced by the compounds listed in Table 1.

(2) Evaluation of Organic EL Devices

The thus-obtained organic EL devices 1-1 to 1-15 were evaluated after being respectively incorporated into a lighting apparatus illustrated in FIG. 5 and FIG. 6, wherein the lighting apparatus was manufactured by covering each the organic EL device by a glass cover on its non-luminescent side as the following (1) to (4).

(1) A glass substrate having the thickness of 300 μm is used for the glass cover.

(2) An epoxy-based, photo-curable adhesive (Luxtruck LC0629B, from Toagosei Co., Ltd.) is applied as a sealing material around the glass cover.

(3) The glass cover is placed over the organic EL device so that the sealing material is arranged around the organic EL device and adhered to the transparent support substrate on which the organic EL device is formed.

(4) The sealing material is cured by irradiating UV radiation from the glass cover side, thereby sealing is completed.

Next, evaluations below were conducted.

(2.1) External Extraction Quantum Efficiency (Also Simply Referred to as "Efficiency")

The organic EL device was lit at room temperature (approximately 23 to 25° C.), under a constant current of 2.5 mA/cm². The external extraction quantum efficiency (η) was calculated by measuring luminance (L) [cd/m²] immediately after the start of lighting.

The luminance herein was measured using a spectroradiometer CS-1000 (from Konica Minolta Sensing, Inc.), and the external extraction quantum efficiency was expressed by relative values assuming that of the organic EL device 1-2 (Comparative Example) as 100.

(2.2) Drive Voltage

Each organic EL device was driven at room temperature (approximately 23 to 25° C.) under a constant current of 2.5 mA/cm², drive voltage during the drive was measured, and the result of measurement was substituted in the equation below. Results of calculation were shown in Table 1.

The results of calculation were expressed by relative values assuming that of the organic EL device 1-2 (Comparative Example) as 100.

Equation:

Drive voltage(Relative Value)=[drive voltage of each device/drive voltage of organic EL device 1-2 (Comparative Example)]×100

Note that less values indicate lower drive voltage as compared with Comparative Example.

(2.3) Half Life

The half life was evaluated according to the method descried below.

Each organic EL device was driven under a constant current so as to ensure an initial luminance of 1000 cd/m², and time required for halving the initial luminance (500 cd/m²) was determined. The time was employed as a scale for half life.

The half life was expressed by relative values assuming that of the organic EL device 1-2 (Comparative Example) as 100.

Results are shown in Table 1.

TABLE 1

| Device No. | Luminescent host | Dopant | Efficiency | Half life (Relative Value) | Drive voltage (Relative Value) | Remarks |
|---|---|---|---|---|---|---|
| 1-1 | OC-11 | Comparative 1 | 95 | 96 | 100 | Comparative Example |
| 1-2 | OC-11 | Comparative 2 | 100 | 100 | 100 | Comparative Example |
| 1-3 | OC-11 | Comparative 3 | 90 | 50 | 110 | Comparative Example |
| 1-4 | OC-11 | (III)-1 | 110 | 150 | 85 | Invention |
| 1-5 | 1 | (III)-2 | 110 | 200 | 83 | Invention |
| 1-6 | OC-11 | (IV)-4 | 120 | 135 | 92 | Invention |
| 1-7 | OC-11 | (V)-1 | 115 | 150 | 91 | Invention |
| 1-8 | 1 | (V)-3 | 110 | 185 | 95 | Invention |
| 1-9 | OC-11 | (VI)-2 | 120 | 160 | 86 | Invention |
| 1-10 | 1 | (VI)-3 | 120 | 190 | 86 | Invention |
| 1-11 | OC-11 | (VII)-1 | 120 | 150 | 86 | Invention |
| 1-12 | 1 | (VII)-3 | 110 | 190 | 85 | Invention |
| 1-13 | OC-6 | (III)-1 | 105 | 140 | 90 | Invention |
| 1-14 | OC-29 | (III)-22 | 110 | 230 | 90 | Invention |
| 1-15 | 57 | (III)-23 | 115 | 95 | 95 | Invention |

(3) Conclusion

From Table 1, the organic EL devices 1-4 to 1-15 of the present invention were found to show improved performances of the devices, represented by higher efficiency, longer half life, and lower drive voltage, as compared with the comparative organic EL devices 1-1 to 1-3. Compared with the comparative dopant compound 1 having phenylpyridine-based ligands, or the comparative dopant compound 2 joining the ligands of the comparative dopant compound 1, an advantage of the compounds of the present invention is explicitly larger when the compounds are replaced by the comparative dopant compound 3 having a five-membered ring in the ligand structure thereof.

Example 2

(1) Manufacturing of Organic EL Devices 2-1 to 2-12

Organic EL devices 2-1 to 2-12 were respectively manufactured similarly to the organic EL device 1-1, except that the host compound OC-11 and the comparative dopant compound 1 in the luminescent layer were replaced by the compounds listed in Table 2.

(2) Evaluation of Organic EL Device 2-1 to 2-12

The thus-obtained organic EL devices 2-1 to 2-12 were evaluated after being respectively sealed and incorporated into a lighting apparatus illustrated in FIG. 5 and FIG. 6, similarly to the organic EL devices 1-1 to 1-15 in Example 1.

Next, evaluations below were conducted.

(2.1) External Extraction Quantum Efficiency (Also Simply Referred to as "Efficiency")

Evaluation was conducted similarly as described in Example 1. The external extraction quantum efficiency was expressed by relative values assuming that of the organic EL device 2-2 (Comparative Example) as 100.

(2.2) Dark Spot

Each organic EL device was continuously lit at room temperature under a constant current of 2.5 mA/cm$^2$, the light emitting face was visually evaluated, and ranked as shown below. The visual evaluation herein was participated by ten randomly-sampled judges.

Criteria for visual evaluation (x,Δ,○) are as follow:
x: dark spot is observed by 5 or more judges;
Δ: dark spot is observed by 1 to 4 judges; and
○: dark spot is observed by nobody.

(2.3) Rate of Voltage Elevation

Each organic EL device was driven under a constant current of 6 mA/cm$^2$, and the initial voltage and voltage after 150 hours were measured. Rate of voltage elevation was defined by relative values of voltage after 100 hours relative to the initial voltage.

Results are shown in Table 2.

TABLE 2

| Device No. | Luminescent host | Dopant | Efficiency | Dark spot | Rate of voltage elevation | Remarks |
|---|---|---|---|---|---|---|
| 2-1 | OC-3 | Comparative 4 | 100 | x | 150 | Comparative Example |
| 2-2 | OC-3 | (III)-5 | 145 | ○ | 110 | Invention |
| 2-3 | OC-3 | (III)-7 | 105 | ○ | 100 | Invention |
| 2-4 | OC-3 | (III)-2 | 120 | ○ | 110 | Invention |
| 2-5 | 25 | (IV)-2 | 140 | ○ | 120 | Invention |
| 2-6 | 25 | (V)-2 | 120 | ○ | 110 | Invention |
| 2-7 | 25 | (VI)-2 | 125 | ○ | 120 | Invention |
| 2-8 | 25 | (VII)-2 | 120 | ○ | 110 | Invention |
| 2-9 | OC-12 | (III)-24 | 145 | ○ | 100 | Invention |
| 2-10 | 25 | (III)-26 | 140 | ○ | 110 | Invention |
| 2-11 | 25 | (III)-31 | 120 | ○ | 100 | Invention |
| 2-12 | 25 | (III)-32 | 120 | ○ | 100 | Invention |

(3) Conclusion

From Table 2, all of the organic EL devices 2-2 to 2-12 of the present invention, manufactured by using the organic EL materials of the present invention, were found to show improved performances of the devices, represented by higher efficiency, reduced dark spot, and suppressed rate of voltage elevation, as compared with the comparative organic EL device 2-1.

Example 3

(1) Manufacturing of Organic EL Devices (1.1) Manufacturing of Organic EL Device 3-1

A 100-nm-thick ITO (indium tin oxide) film formed on a 100 mm×100 mm×1.1 mm glass substrate (NA-45, from AvanStrate Inc.) was patterned to form an anode. The thus-obtained transparent support substrate having the ITO transparent electrode patterned thereon was then subjected to ultrasonic cleaning in isopropanol, dried with dry nitrogen gas, and subjected to UV-ozone cleaning for 5 minutes.

On the transparent support substrate, a solution of poly (3,4-ethylenedioxythiophene)-polystyrene sulfonate (PEDOT/PSS, CLEVIOS P VP A14083, from H.C. Starck, Inc.) diluted 70% with pure water was spread by spin coating at 3000 rpm for 30 seconds, and then dried at 200° C. for one hour, to thereby form a first hole transport layer of 20 nm thick.

The transparent support substrate was fixed to a substrate holder of a commercially-available vacuum deposition apparatus. 200 mg of α-NPD was placed in one heating boat made of molybdenum, 200 mg of OC-30 as the host compound was placed in another heating boat made of molybdenum, 200 mg of ET-8 was placed in another heating boat made of molybdenum, 100 mg of comparative dopant compound 1 was placed in the other heating boat made of molybdenum, and these boats were attached to vacuum deposition apparatus.

A vacuum chamber of the vacuum deposition apparatus was evacuated to $4 \times 10^{-4}$ Pa, and thereafter, the heating boat containing α-NPD was heated by supplying electric current to the boat, so as to allow α-NPD to deposit onto the transparent support substrate at a deposition rate of 0.1 nm/sec, to thereby form a 20-nm-thick second hole transport layer.

The heating boats containing the host compound OC-30 and comparative dopant compound 1 were then heated by supplying electric current to the boats, so as to allow them to co-deposit onto the second hole transport layer respectively at deposition rates of 0.1 nm/sec and 0.006 nm/sec, to thereby form a 40-nm-thick luminescent layer.

The heating boat containing ET-8 was then heated by supplying electric current to the boat, so as to allow ET-8 to deposit onto the luminescent layer at a deposition rate of 0.1 nm/sec, to thereby form a 30-nm-thick electron transport layer.

Temperature of substrate during deposition was kept at room temperature.

Thereafter, lithium fluoride was deposited to give a 0.5-nm-thick cathode buffer layer, and aluminum was deposited to give a 110-nm-thick cathode, to thereby manufacture an organic EL device 3-1.

(1.2) Manufacturing of Organic EL Devices 3-2 to 3-16

Organic EL devices 3-2 to 3-16 were respectively manufactured similarly to the organic EL device 3-1, except that the host compound OC-30 and the comparative dopant compound 1 in the luminescent layer were replaced by the compounds listed in Table 3.

(2) Evaluation of Organic EL Devices 3-1 to 3-16

The thus-obtained organic EL devices 3-1 to 3-16 were evaluated after being respectively sealed and incorporated into a lighting apparatus illustrated in FIG. 5 and FIG. 6, similarly to the organic EL device 1-1 in Example 1.

Next, evaluations below were conducted.

(2.1) Luminance

Each organic EL device was applied with a DC voltage of 10 V at 23° C., and luminance (L) [cd/m²] was measured. The luminance was expressed by relative values assuming that of the organic EL device 3-2 (Comparative Example) as 100. The luminance was measured using a spectroradiometer CS-1000 (from Konica Minolta Sensing, Inc.).

(2.2) External Extraction Quantum Efficiency (Also Simply Referred to as "Efficiency")

Evaluation was conducted similarly as described in Example 1. The external extraction quantum efficiency was expressed by relative values assuming that of the organic EL device 3-2 (Comparative Example) as 100.

(2.3) Half Life

The half life was measured similarly as described in Example 1, and was expressed by relative values assuming that of the organic EL device 3-2 (Comparative Example) as 100.

(2.4) Drive Voltage

Evaluation was conducted similarly as described in Example 1. The drive voltage was expressed by relative values assuming that of the organic EL device 3-2 (Comparative Example) as 100.

TABLE 3

| Device No. | Luminescent host | Dopant | Luminance | Efficiency | Half life (Relative Value) | Drive voltage (Relative Value) | Remarks |
|---|---|---|---|---|---|---|---|
| 3-1 | OC-30 | Comparative 1 | 96 | 94 | 95 | 100 | Comparative Example |
| 3-2 | OC-30 | Comparative 2 | 100 | 100 | 100 | 100 | Comparative Example |
| 3-3 | OC-30 | Comparative 3 | 90 | 90 | 60 | 110 | Comparative Example |
| 3-4 | OC-30 | (III)-1 | 115 | 105 | 180 | 85 | Invention |
| 3-5 | 9 | (III)-3 | 130 | 110 | 200 | 90 | Invention |
| 3-6 | OC-30 | (IV)-2 | 135 | 100 | 190 | 85 | Invention |
| 3-7 | 9 | (IV)-3 | 135 | 110 | 150 | 90 | Invention |
| 3-8 | OC-30 | (V)-2 | 105 | 100 | 145 | 95 | Invention |
| 3-9 | OC-30 | (VI)-5 | 140 | 110 | 170 | 85 | Invention |
| 3-10 | 9 | (VI)-4 | 125 | 120 | 190 | 85 | Invention |
| 3-11 | OC-30 | (V)-3 | 140 | 110 | 160 | 85 | Invention |
| 3-12 | 9 | (VI)-2 | 110 | 110 | 190 | 85 | Invention |
| 3-13 | 9 | (VII)-4 | 125 | 110 | 180 | 90 | Invention |
| 3-14 | OC-7 | (III)-22 | 120 | 110 | 230 | 90 | Invention |
| 3-15 | OC-30 | (III)-28 | 120 | 105 | 220 | 90 | Invention |
| 3-16 | 9 | (III)-27 | 125 | 110 | 210 | 85 | Invention |

(3) Conclusion

From Table 3, also the organic EL devices 3-4 to 3-13 of the present invention, manufactured by the vacuum deposition processes, were found to show improved performances of the device, represented by higher luminance, reduced non-uniformity in luminance, and suppressed voltage elevation of stored devices, as compared with the comparative organic EL devices 3-1 to 3-3. Compared with the comparative dopant compound 1 having phenylpyridine-based ligands, or the comparative dopant compound 2 joining the ligands of the comparative dopant compound 1, an advantage of the compounds of the present invention is explicitly larger when the compounds are replaced by the comparative dopant compound 3 having a five-membered ring in the ligand structure thereof.

Example 4

(1) Manufacturing of Organic EL Devices 4-1 to 4-12

Organic EL devices 4-1 to 4-12 were respectively manufactured similarly to the organic EL device 3-1, except that the host compound OC-30 and the comparative dopant compound 1 in the luminescent layer were replaced by the compounds listed in Table 4.

(2) Evaluation of Organic EL Devices 4-1 to 4-12

The thus-obtained organic EL devices 4-1 to 4-8 were evaluated after being respectively sealed and incorporated into a lighting apparatus illustrated in FIG. 5 and FIG. 6, similarly to the organic EL device 1-1 in Example 1.

Next, evaluations below were conducted.

(2.1) Luminance

Evaluation was conducted similarly as described in Example 3. The luminance was expressed by relative values assuming that of the organic EL device 4-1 (Comparative Example) as 100.

(2.2) Initial Degradation

Initial degradation was evaluated according to the method described below. Time required for causing reduction in the luminance down to 90% was measured in the similar course of the above-described measurement of half life, and the time was employed as a scale for initial degradation.

The initial degradation was calculated according to the equation below.

Initial degradation=(time for reaching 90% luminance of organic EL device 4-1)/(time for reaching 90% luminance of each device)

In this context, less values of initial degradation mean less degrees of initial degradation.

(2.3) Drive Voltage

Evaluation was conducted similarly as described in Example 1. The drive voltage was expressed by relative values assuming that of the organic EL device 4-1 (Comparative Example) as 100.

Results are shown in Table 4.

TABLE 4

| Device No. | Luminescent host | Dopant | Luminance | Initial degradation | Drive voltage | Remarks |
|---|---|---|---|---|---|---|
| 4-1 | OC-12 | Comparative 4 | 100 | 1 | 100 | Comparative Example |
| 4-2 | OC-12 | (III)-2 | 145 | 0.75 | 87 | Invention |
| 4-3 | OC-12 | (III)-13 | 135 | 0.78 | 93 | Invention |
| 4-4 | OC-12 | (III)-20 | 130 | 0.74 | 90 | Invention |
| 4-5 | OC-12 | (IV)-4 | 120 | 0.81 | 92 | Invention |
| 4-6 | OC-12 | (V)-3 | 125 | 0.84 | 89 | Invention |
| 4-7 | OC-12 | (VI)-3 | 130 | 0.85 | 90 | Invention |
| 4-8 | OC-12 | (VII)-1 | 120 | 0.85 | 90 | Invention |
| 4-9 | OC-7 | (III)-22 | 130 | 0.72 | 85 | Invention |
| 4-10 | OC-7 | (III)-25 | 120 | 0.70 | 83 | Invention |
| 4-11 | 5 | (III)-29 | 120 | 0.73 | 82 | Invention |
| 4-12 | 5 | (III)-30 | 125 | 0.71 | 85 | Invention |

(3) Conclusion

From Table 4, the organic EL devices 4-2 to 4-12 of the present invention, manufactured by using the organic EL materials of the present invention, were found to show improved performances of the device, represented by higher luminance, suppressed initial degradation, and reduced drive voltage, as compared with the comparative organic EL device 4-1.

Example 5

(1) Manufacturing of White-Light Organic EL Device 5-1

A 100-nm-thick ITO (indium tin oxide) film formed on a 100 mm×100 mm×1.1 mm glass substrate (NA-45, from AvanStrate Inc.) was patterned to form an anode. The thus-obtained transparent support substrate having the ITO transparent electrode patterned thereon was subjected to ultrasonic cleaning in isopropanol, dried with dry nitrogen gas, and subjected to UV-ozone cleaning for 5 minutes.

On the transparent support substrate, a solution of poly(3,4-ethylenedioxythiophene)-polystyrene sulfonate (PEDOT/PSS, Baytron P VP A14083, from Bayer AG) diluted 70% with pure water was spread by spin coating, and then dried at 200° C. for one hour, to thereby form a first hole transport layer of 30 nm thick.

On the first hole transport layer, a chlorobenzene solution of poly(N,N'-bis(4-butylphenyl)-N,N'-bis(phenyl))benzidine (ADS-254, from American Dye Source, Inc.), as the hole transport material, was spread by spin coating to form a film. The film was dried under heating at 150° C. for one hour, to thereby form a second hole transport layer of 40 nm thick.

Next, a solution prepared by dissolving the host compound 24 (100 mg), the dopant D-1 (3 mg), and the dopant D-10 (3 mg) into 10 ml of toluene was spread by spin coating at 2000 rpm for 30 seconds, to form a film. The film was then dried in vacuo under heating at 60° C. for 1 hour, to thereby form a first luminescent layer.

On the first luminescent layer, a solution prepared by dissolving the host compound OC-11 (100 mg) and the dopant (III)-2 (16 mg) into 6 ml of hexafluoroisopropanol (HFIP) was spread by spin coating at 2000 rpm for 30 seconds, to form a film. The film was then dried in vacuo under heating at 60° C. for one hour, to thereby form a second luminescent layer.

The transparent support substrate was fixed to a substrate holder of a vacuum deposition apparatus, and a vacuum chamber of the vacuum deposition apparatus was evacuated to 4×10$^{-4}$ Pa. On the second luminescent layer, the electron transport material ET-9 was deposited to give a 30-nm-thick film, lithium fluoride was deposited to give a 0.5-nm-thick cathode buffer layer, and aluminum was deposited to give a 110-nm-thick cathode, to thereby manufacture an organic EL device 5-1.

(2) Evaluation of Luminescence of Organic EL Device 5-1

The organic EL device 5-1 supplied with electric current was found to give nearly white light, and to be adoptable as a lighting apparatus. It was also confirmed that white luminescence was similarly obtained even when any other compounds exemplified in the above were used.

Example 6

(1) Manufacturing of White-Light Organic EL Device 6-1

A 100-nm-thick ITO (indium tin oxide) film formed on a 100 mm×100 mm×1.1 mm glass substrate (NA-45, from AvanStrate Inc.) was patterned to form an anode. The thus-obtained transparent support substrate having the ITO transparent electrode patterned thereon was then subjected to ultrasonic cleaning in isopropanol, dried with dry nitrogen gas, and subjected to UV-ozone cleaning for 5 minutes.

On the transparent support substrate, a solution of poly(3,4-ethylenedioxythiophene)-polystyrene sulfonate (PEDOT/PSS, Baytron P VP A14083, from Bayer AG) diluted 70% with pure water was spread by spin coating, and then dried at 200° C. for one hour, to thereby form a first hole transport layer of 30 nm thick.

On the first hole transport layer, a chlorobenzene solution of poly(N,N'-bis(4-butylphenyl)-N,N'-bis(phenyl))benzidine (ADS-254, from American Dye Source, Inc.), as the hole transport material, was spread by spin coating to form a film. The film was dried under heating at 150° C. for one hour, to thereby form a second hole transport layer of 40 nm thick.

Next, a solution prepared by dissolving the host compound 7 (100 mg), and the dopants D-1 (3 mg), D-6 (3 mg) and (III)-3 (16 mg) into 10 ml of toluene was spread by spin coating at 2000 rpm for 30 seconds, to form a film. The film was then dried in vacuo under heating at 60° C. for 1 hour, to thereby form a luminescent layer.

The substrate was fixed to a substrate holder of a vacuum deposition apparatus, and a vacuum chamber was evacuated to $4\times10^{-4}$ Pa. On the luminescent layer, the electron transport material ET-15 was deposited to give a 30-nm-thick film, lithium fluoride was deposited to give a 0.5-nm-thick cathode buffer layer, and aluminum was deposited to give a 110-nm-thick cathode, to thereby manufacture an organic EL device 6-1.

(2) Evaluation of Luminescence of Organic EL Device 6-1

The organic EL device 6-1 supplied with electric current was found to give nearly white light, and to be adoptable as a lighting apparatus. It was also confirmed that white luminescence was similarly obtained even when any other compounds exemplified in the above were used.

Example 7

(1) Manufacturing of White-Light Organic EL Device 7-1

A 100-nm-thick ITO (indium tin oxide) film formed on a 100 mm×100 mm×1.1 mm glass substrate (NA-45, from AvanStrate Inc.) was patterned to form an anode. The thus-obtained transparent support substrate, having the ITO transparent electrode patterned thereon, was then subjected to ultrasonic cleaning in isopropanol, dried with dry nitrogen gas, and subjected to UV-ozone cleaning for 5 minutes.

The transparent support substrate was fixed to a substrate holder of a commercially-available vacuum deposition apparatus, 200 mg of α-NPD was placed in a heating boat made of molybdenum, 200 mg of the host compound 9 was placed in another heating boat made of molybdenum, 200 mg of ET-11 was placed in another heating boat made of molybdenum, 100 mg of dopant C35 was placed in another heating boat made of molybdenum, 100 mg of dopant D-10 was placed in the other heating boat made of molybdenum, and these boats were attached to vacuum deposition apparatus.

A vacuum chamber of the vacuum deposition apparatus was evacuated to $4\times10^{-4}$ Pa, the heating boat containing α-NPD was heated by supplying electric current to the boat, so as to allow α-NPD to deposit onto the transparent support substrate at a deposition rate of 0.1 nm/sec, to thereby form a 20-nm-thick first hole transport layer.

The heating boats containing the host compound 9, and the dopants (III)-20 and D-10 were then heated by supplying electric current to the boats, so as to adjust a ratio of deposition rates of the host compound 9, and the dopant compounds (III)-20 and D-10 to 100:5:0.6, to thereby form a 30-nm-thick luminescent layer.

The heating boat containing ET-11 was then heated by supplying electric current to the boat, so as to allow ET-11 to deposit onto the luminescent layer at a deposition rate of 0.1 nm/sec, to thereby form a 30-nm-thick electron transport layer.

Temperature of substrate during deposition was kept at room temperature.

Thereafter, lithium fluoride was deposited to give a 0.5-nm-thick cathode buffer layer, and aluminum was deposited to give a 110-nm-thick cathode, to thereby manufacture an organic EL device 7-1.

(2) Evaluation of Luminescence of Organic EL Device 7-1

The organic EL device 7-1 supplied with electric current was found to give nearly white light, and to be adoptable as a lighting apparatus. It was also confirmed that white luminescence was similarly obtained even when any other compounds exemplified in the above were used.

By the present invention, an organic electroluminescent device showing high luminescence efficiency, having long luminescent lifetime, and drivability at low voltage; a lighting apparatus and a display apparatus having the device incorporated therein; and an organic electroluminescent material used for forming the device, were successfully obtained.

The entire disclosure of Japanese Patent Application No. 2011-043659 filed on Mar. 1, 2011 and No. 2011-181303 filed on Aug. 23, 2011, including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An organic electroluminescent device having at least one luminescent layer between an anode and a cathode, containing:

a six-coordinate, ortho-metalated iridium complex represented by the formula (I) below:

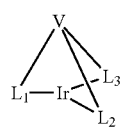

Formula (I)

wherein

V represents a trivalent linking group which bonds to $L_1$ to $L_3$ through a covalent bond at $X_9$, and V is selected from the group consisting of:

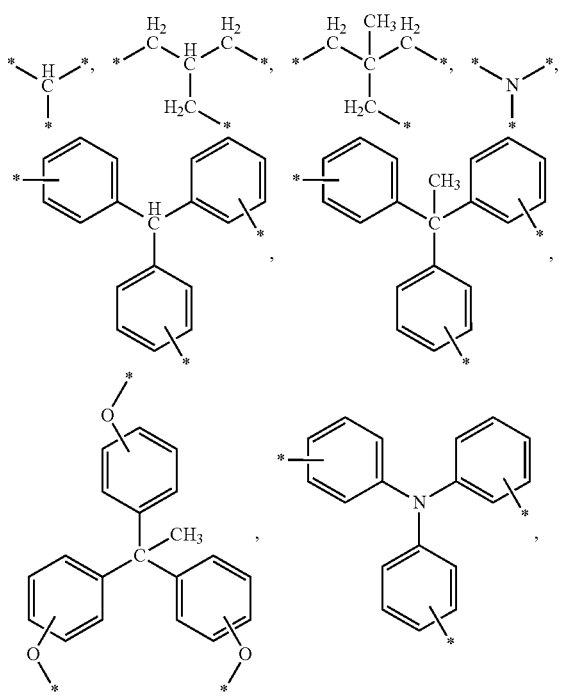

-continued

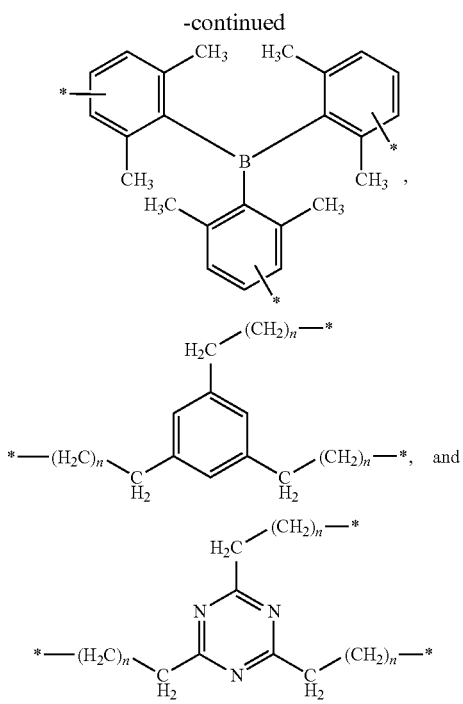

n represents 1 or 2;

each of $L_1$ to $L_3$ is represented by any one of formulae (III) to (VII) below:

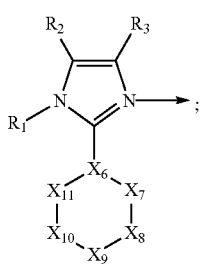

Formula (III)

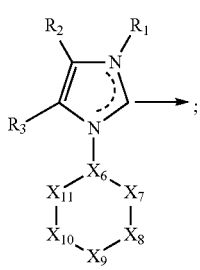

Formula (IV)

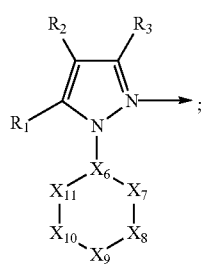

(Formula V)

-continued

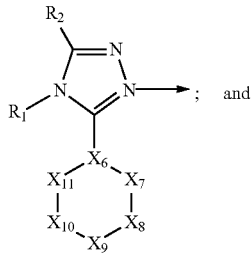

Formula (VI)

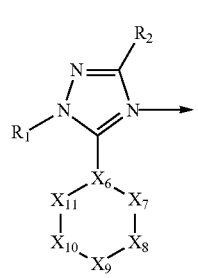

Formula (VII)

wherein, in each of formulae (III) to (VII) above,

~~~~~~ represents a coordinated bond with Ir, $X_7$ and Ir form a covalent bond, $R_1$ represents a substituted aryl group having seven or more carbon atoms, $R_2$ represents a hydrogen atom or a substituent, $X_6$ to $X_{11}$ represents an aromatic six membered ring wherein each of $X_6$ to $X_{11}$ represents a carbon atom or a nitrogen atom, and wherein in each of formulae (III) to (V) above, $R_3$ represents a hydrogen atom or a substituent.

2. The organic electroluminescent device of claim 1, wherein at least one of the luminescent layers contains the iridium complex.

3. The organic electroluminescent device of claim 1, configured to cause white luminescence.

4. A display apparatus having the organic electroluminescent device of claim 1.

5. A lighting apparatus having the organic electroluminescent device of claim 1.

6. The organic electroluminescent device of claim 1, wherein the V is selected from the group consisting of:

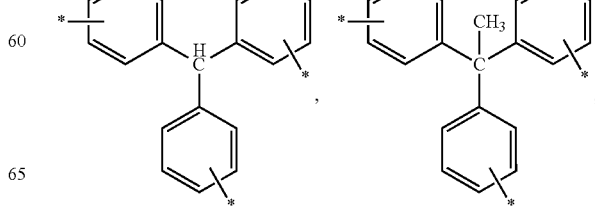

171
-continued
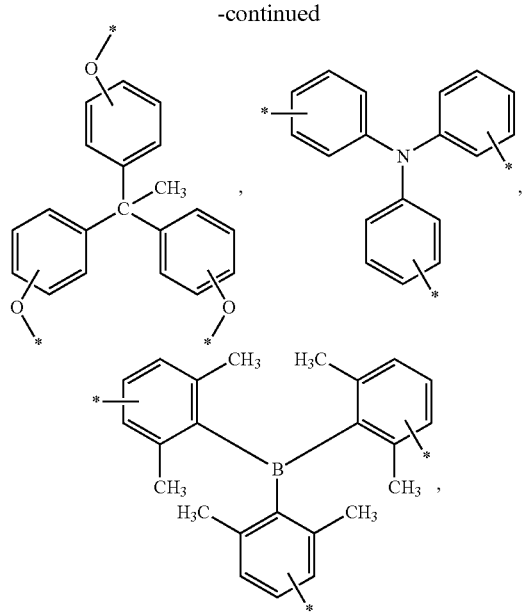
172
-continued
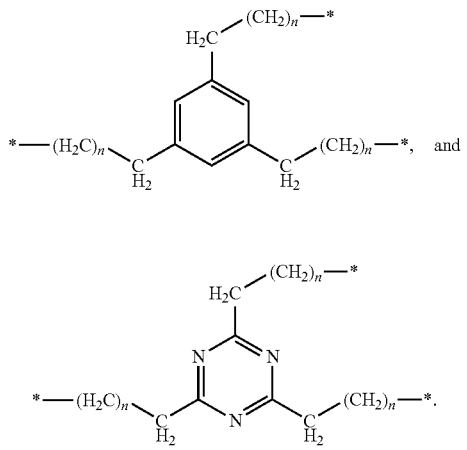
* * * * *